US010985176B2

(12) United States Patent
Iwai et al.

(10) Patent No.: US 10,985,176 B2
(45) Date of Patent: Apr. 20, 2021

(54) THREE-DIMENSIONAL MEMORY DEVICE CONTAINING EYE-SHAPED CONTACT VIA STRUCTURES LOCATED IN LATERALLY-UNDULATING TRENCHES AND METHOD OF MAKING THE SAME

(71) Applicant: SANDISK TECHNOLOGIES LLC, Addison, TX (US)

(72) Inventors: Takaaki Iwai, Yokkaichi (JP); Yoshitaka Otsu, Yokkaichi (JP); Hisakazu Otoi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 36 days.

(21) Appl. No.: 16/366,330

(22) Filed: Mar. 27, 2019

(65) Prior Publication Data

US 2020/0312864 A1    Oct. 1, 2020

(51) Int. Cl.
| | |
|---|---|
| *H01L 27/11* | (2006.01) |
| *H01L 27/11582* | (2017.01) |
| *H01L 27/11565* | (2017.01) |
| *H01L 27/1157* | (2017.01) |
| *H01L 27/11573* | (2017.01) |

(Continued)

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11529* (2013.01); *H01L 27/11556* (2013.01);

(Continued)

(58) Field of Classification Search
CPC combination set(s) only.
See application file for complete search history.

(56) References Cited

U.S. PATENT DOCUMENTS

| | | |
|---|---|---|
| 5,915,167 A | 6/1999 | Leedy |
| 8,818,759 B2 | 8/2014 | Shields et al. |

(Continued)

OTHER PUBLICATIONS

Notification of Transmittal of the International Search Report and Written Opinion of the International Search Authority or International Patent Application No. PCT/US2019/063525, dated Mar. 4, 2020, 10 pages.

(Continued)

*Primary Examiner* — Moin M Rahman
(74) *Attorney, Agent, or Firm* — The Marbury Law Group PLLC

(57) ABSTRACT

A three-dimensional memory device includes alternating stacks of insulating layers and electrically conductive layers located over a semiconductor material layer, and memory stack structures extending through one of the alternating stacks. Laterally-undulating backside trenches are present between alternating stacks, and include a laterally alternating sequence of straight trench segments and bulging trench segments. Cavity-containing dielectric fill structures and contact via structures are present in the laterally-undulating backside trenches. The contact via structures are located within the bulging trench segments. The contact via structures are self-aligned to sidewalls of the alternating stacks. Additional contact via structures may vertically extend through a dielectric alternating stack of a subset of the insulating layers and dielectric spacer layers laterally adjoining one of the alternating stacks.

14 Claims, 66 Drawing Sheets

(51) Int. Cl.
*H01L 27/11558* (2017.01)
*H01L 27/11519* (2017.01)
*H01L 27/11529* (2017.01)
*H01L 27/11556* (2017.01)
*H01L 27/11524* (2017.01)

(52) U.S. Cl.
CPC .. *H01L 27/11558* (2013.01); *H01L 27/11565* (2013.01); *H01L 27/11573* (2013.01)

(56) References Cited

U.S. PATENT DOCUMENTS

| | | | |
|---|---|---|---|
| 9,806,093 | B2 | 10/2017 | Toyama et al. |
| 9,818,693 | B2 | 11/2017 | Toyama et al. |
| 10,038,006 | B2 | 7/2018 | Furihata et al. |
| 10,115,632 | B1 | 10/2018 | Masamori et al. |
| 10,115,681 | B1 | 10/2018 | Ariyoshi |
| 10,192,784 | B1 | 1/2019 | Cui et al. |
| 2017/0179026 | A1 | 6/2017 | Toyama et al. |
| 2017/0179151 | A1 | 6/2017 | Kai et al. |
| 2017/0179152 | A1 | 6/2017 | Toyama et al. |
| 2017/0179153 | A1 | 6/2017 | Ogawa et al. |
| 2017/0179154 | A1 | 6/2017 | Furihata et al. |
| 2017/0186758 | A1 | 6/2017 | Lee et al. |
| 2017/0236746 | A1 | 8/2017 | Yu et al. |
| 2018/0040623 | A1* | 2/2018 | Kanakamedala ............ H01L 27/11548 |
| 2018/0261613 | A1* | 9/2018 | Ariyoshi ............ H01L 27/1157 |
| 2018/0301374 | A1 | 10/2018 | Masamori et al. |
| 2019/0006381 | A1 | 1/2019 | Nakatsuji et al. |

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
U.S. Appl. No. 15/909,036, filed Mar. 1, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 15/979,885, filed May 15, 2018, SanDisk Technologies LLC.
U.S. Appl. No. 16/020,637, filed Jun. 27, 2018, SanDisk Technologies LLC.
U.S. Appl. No. 16/020,739, filed Jun. 27, 2018, SanDisk Technologies LLC.
U.S. Appl. No. 16/020,817, filed Jun. 27, 2018, SanDisk Technologies LLC.
U.S. Appl. No. 16/181,721, filed Nov. 6, 2018, SanDisk Technologies LLC.
U.S. Appl. No. 16/251,780, filed Jan. 18, 2019, SanDisk Technologies LLC.
U.S. Appl. No. 16/251,782, filed Jan. 18, 2019, SanDisk Technologies LLC.
U.S. Appl. No. 16/251,863, filed Jan. 18, 2019, SanDisk Technologies LLC.
U.S. Appl. No. 16/353,048, filed Mar. 14, 2019, SanDisk Technologies LLC.
U.S. Appl. No. 16/366,245, filed Mar. 27, 2019, SanDisk Technologies LLC.

* cited by examiner

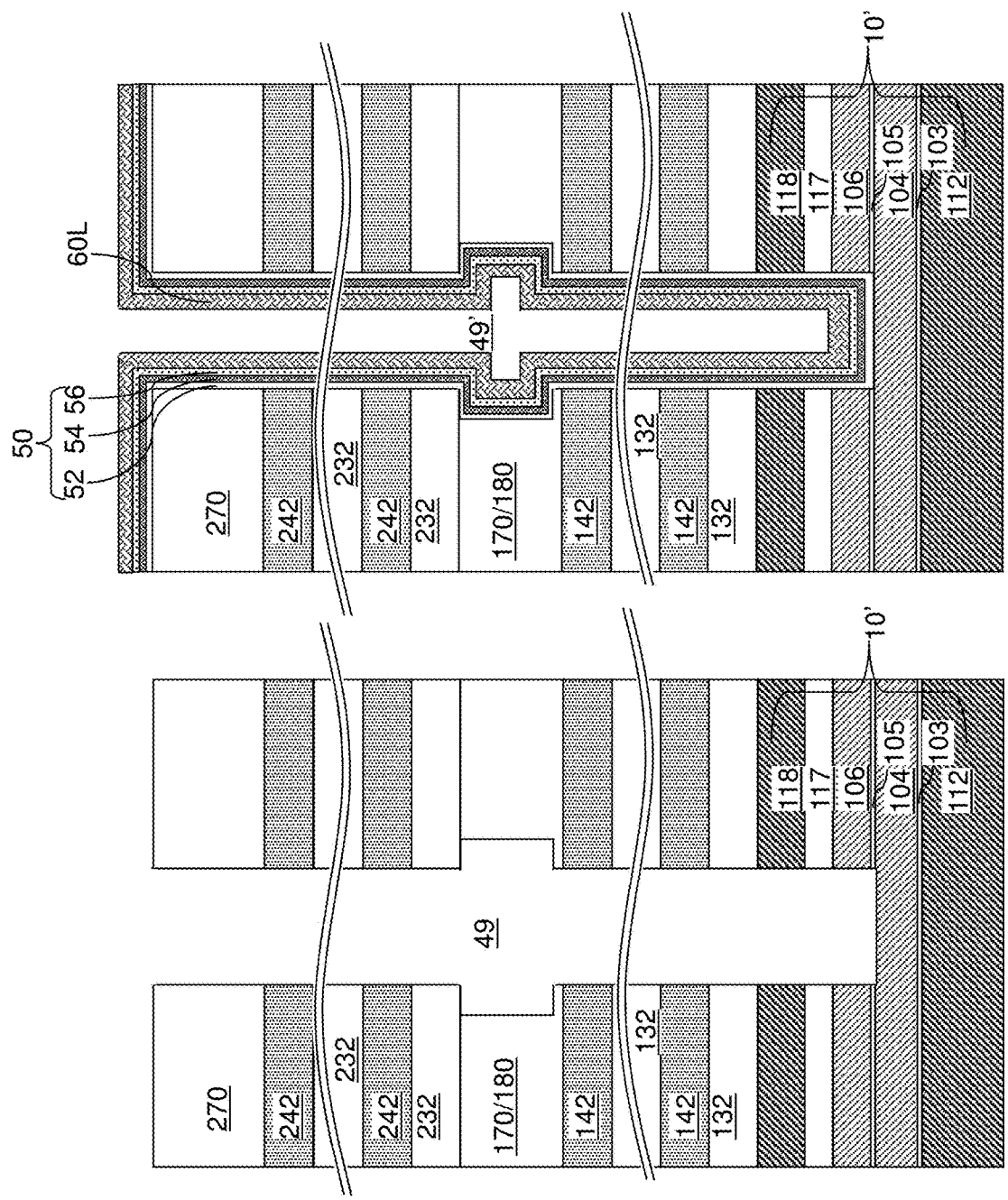

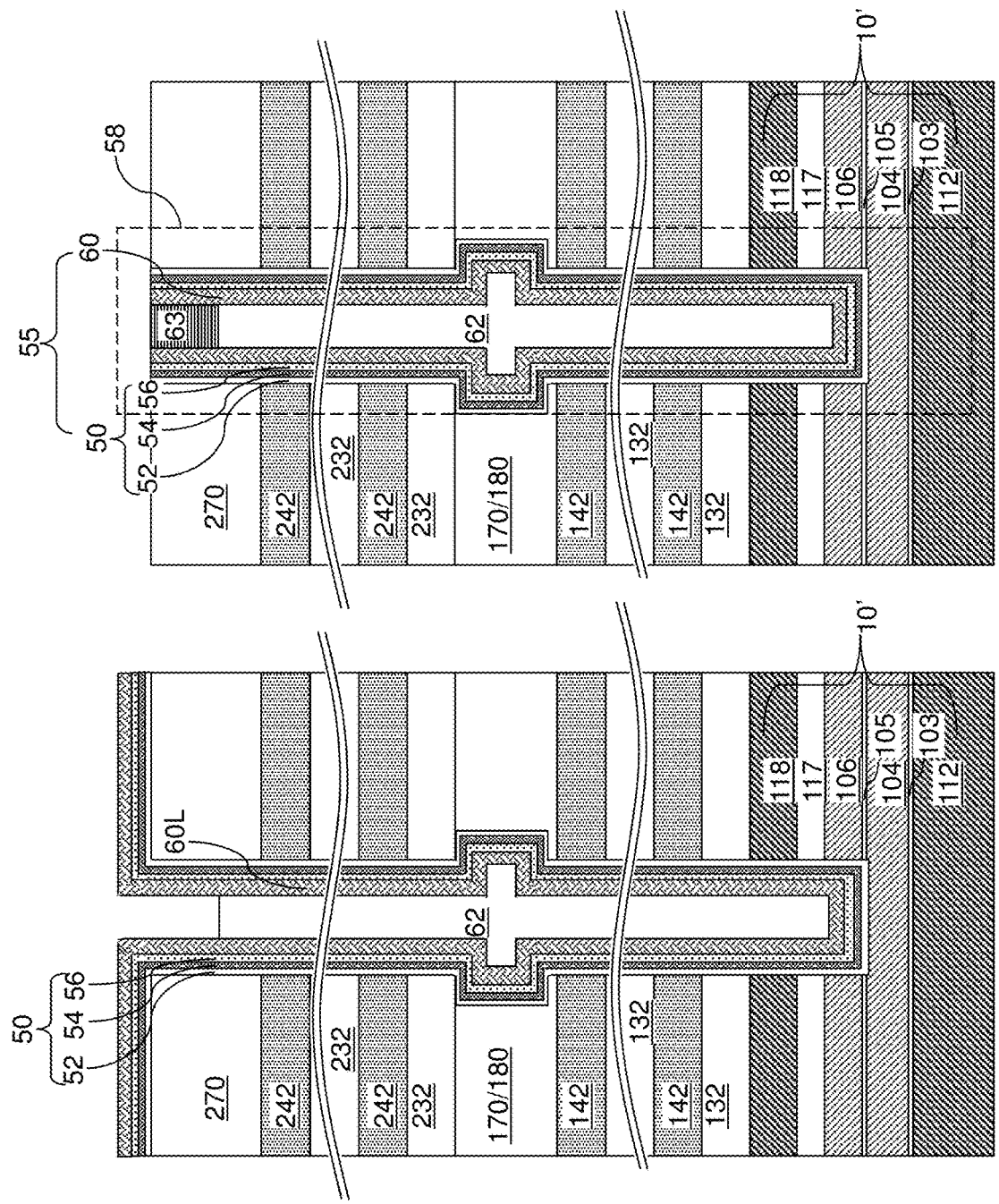

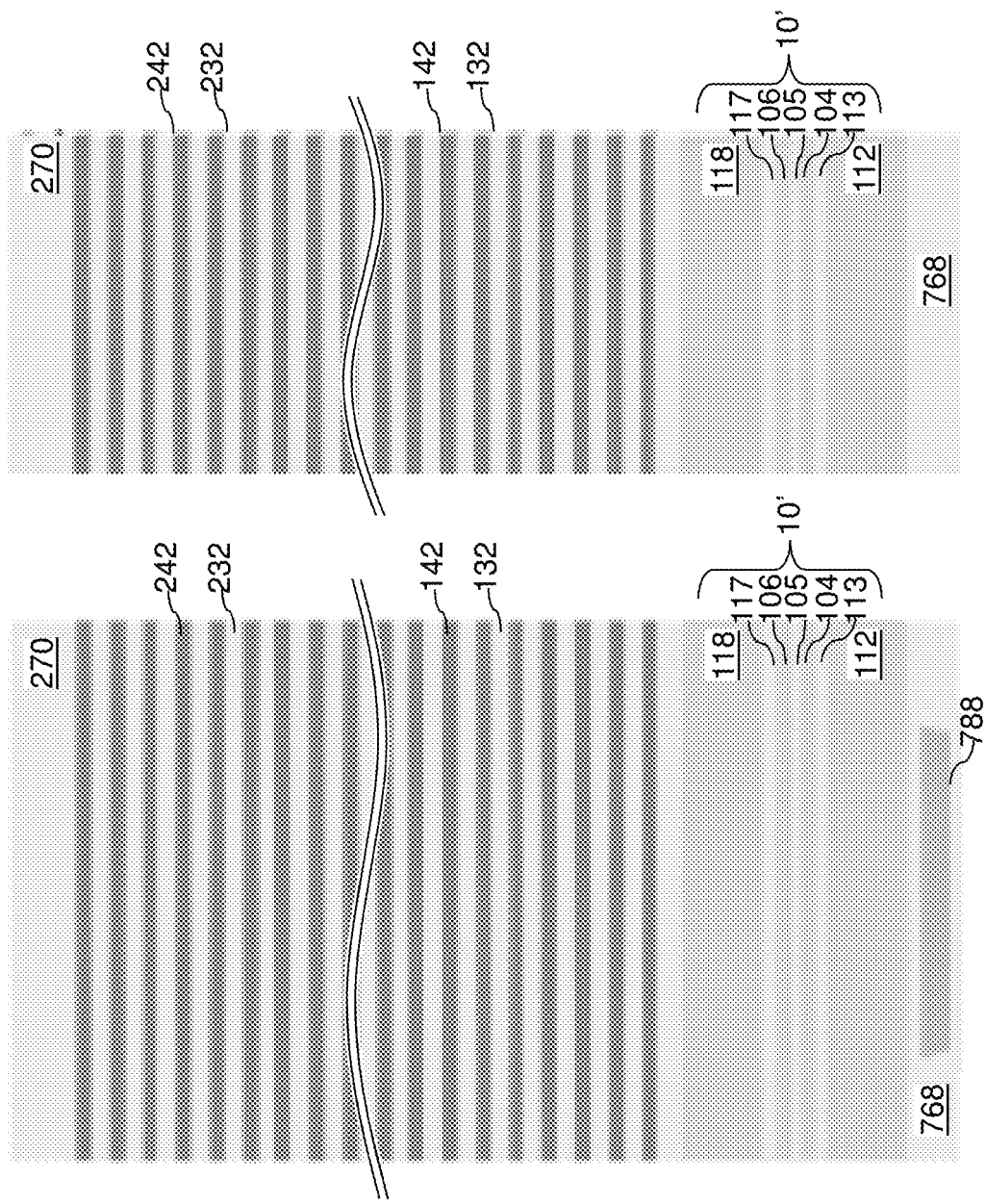

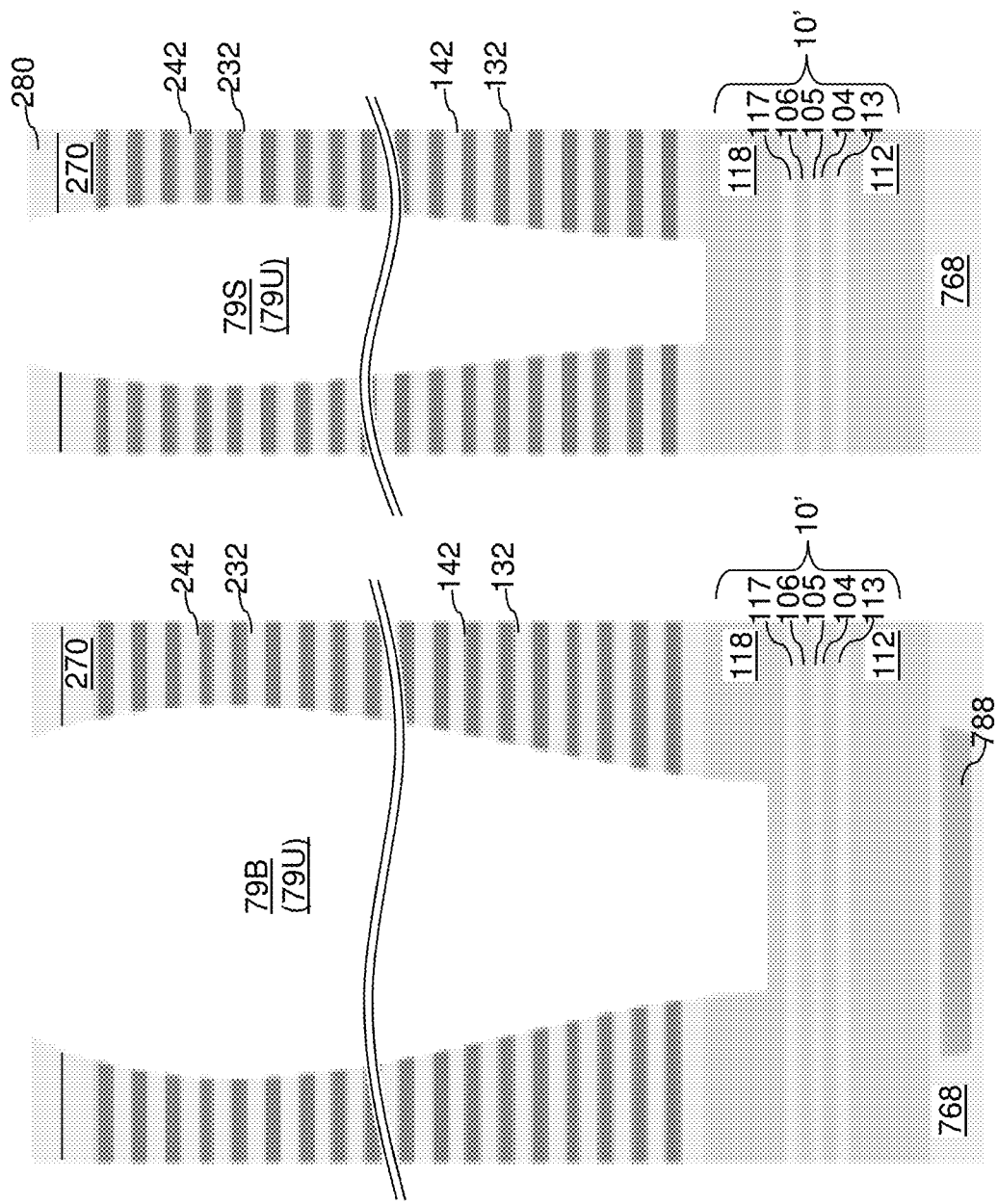

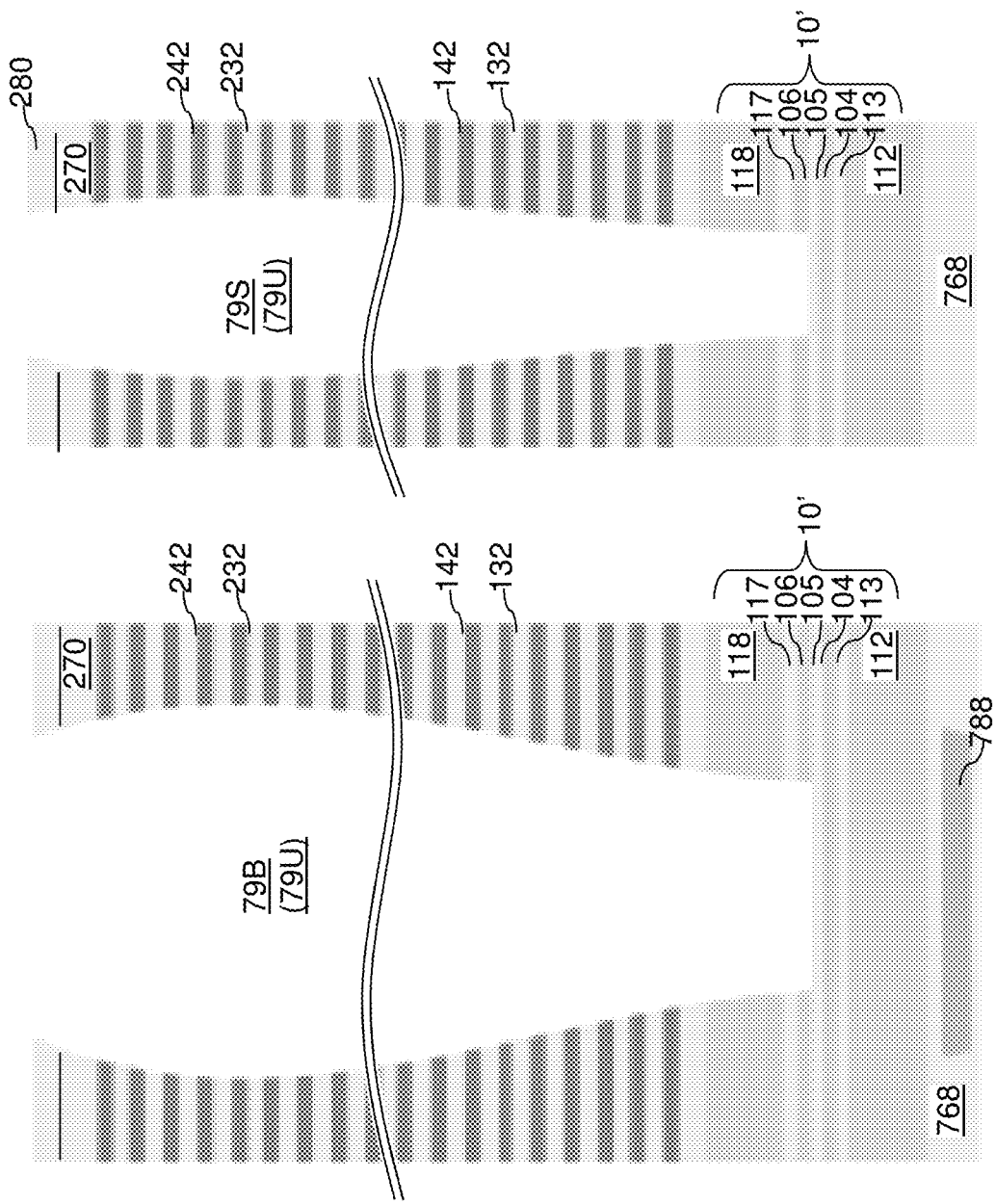

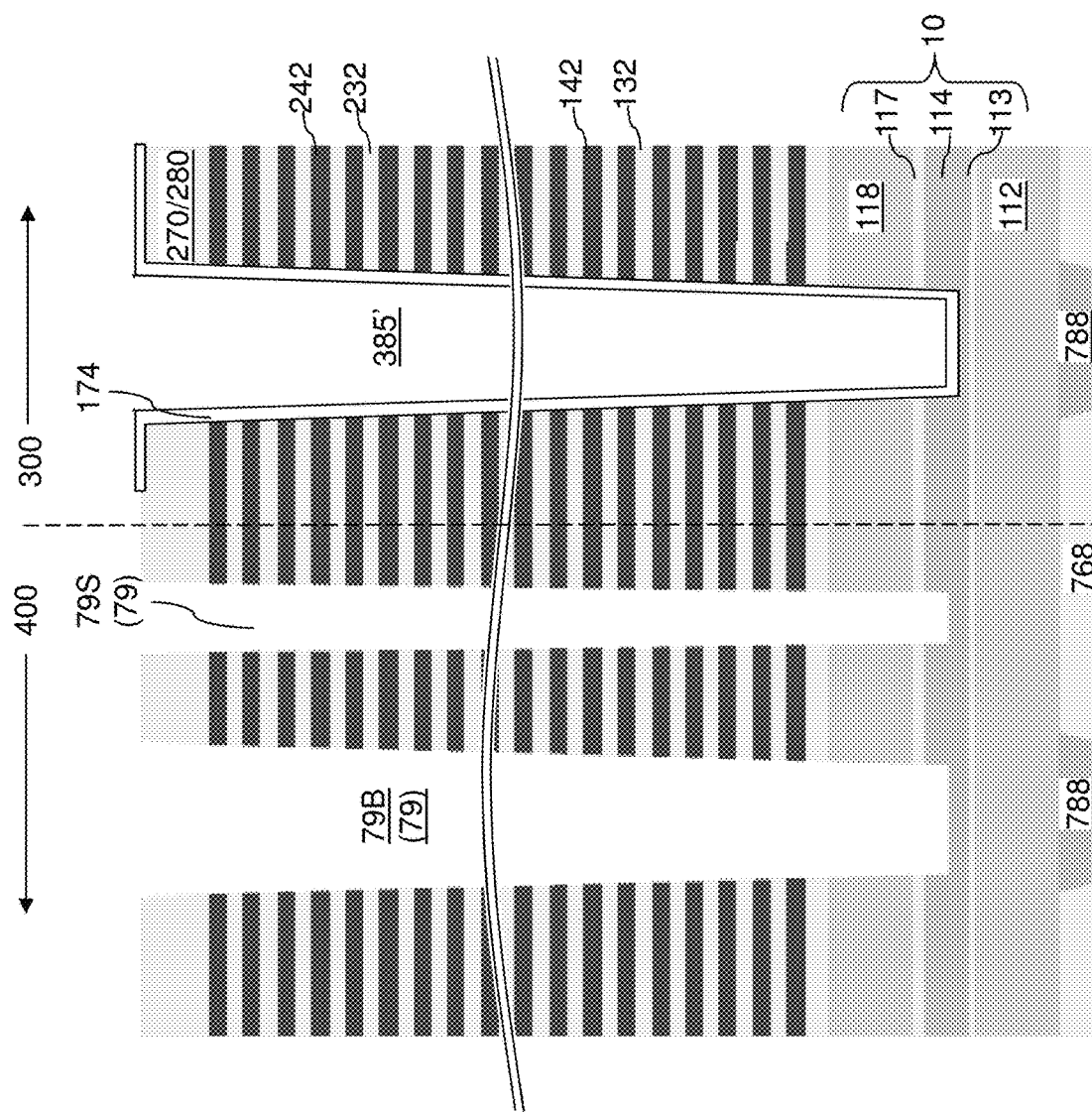

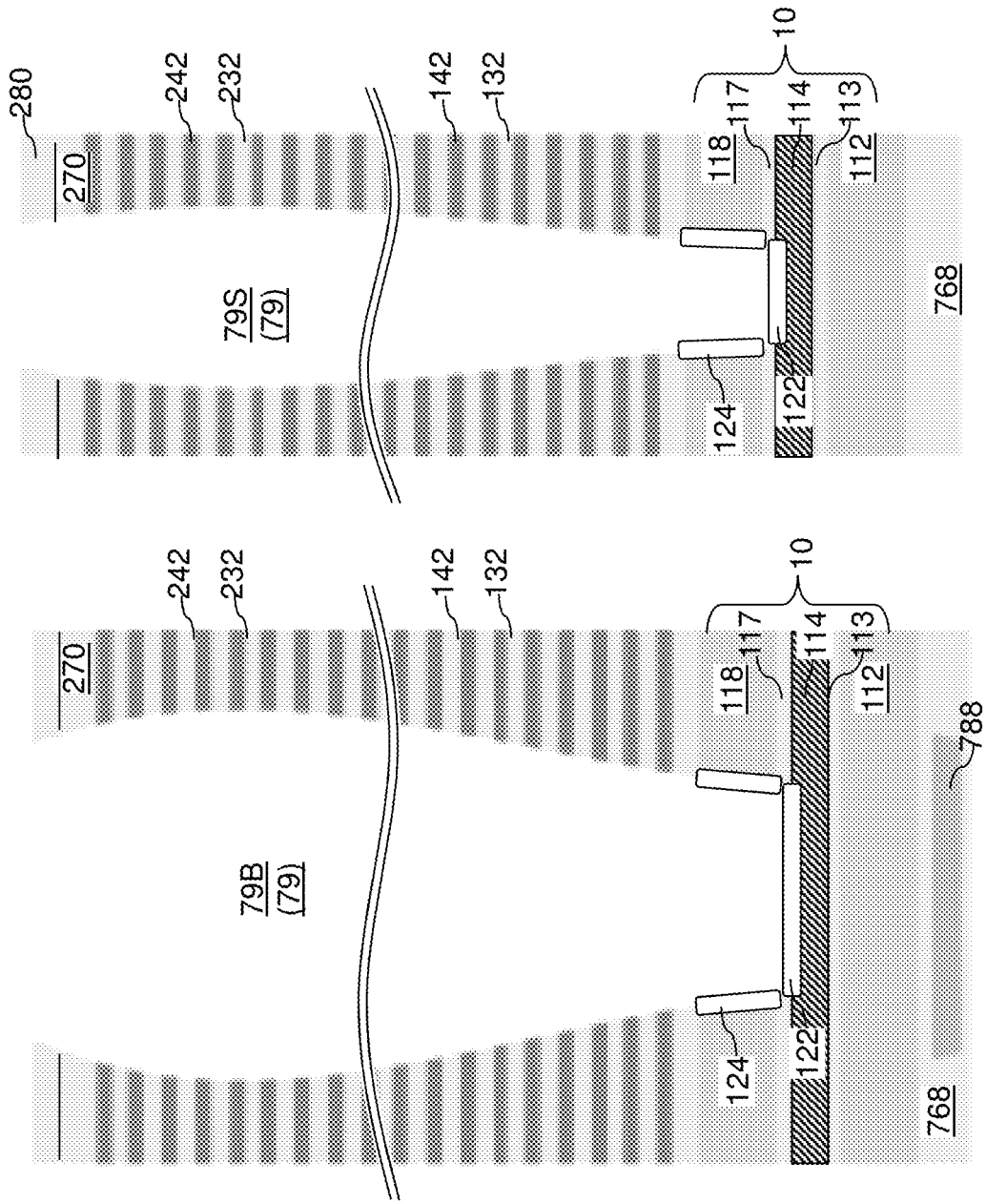

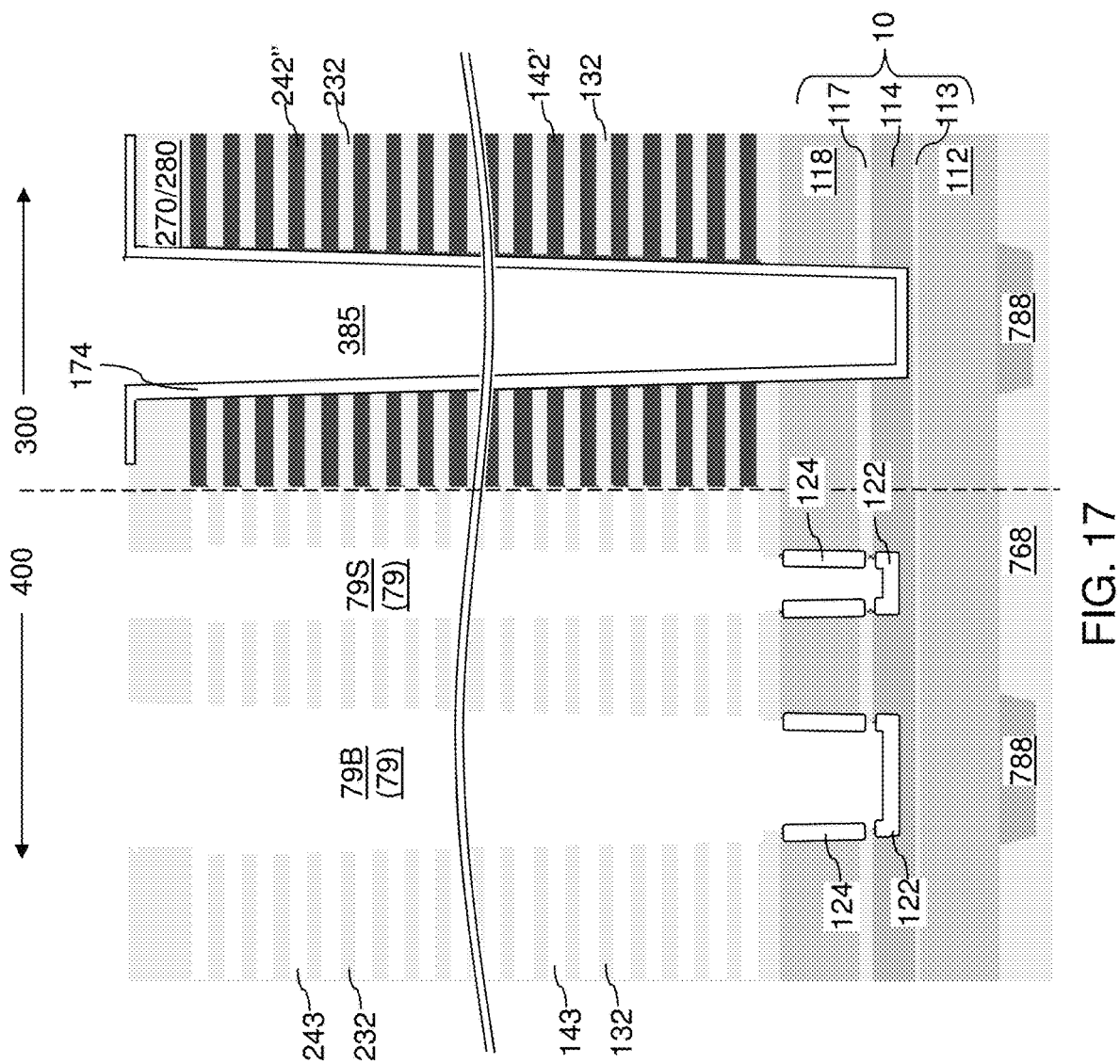

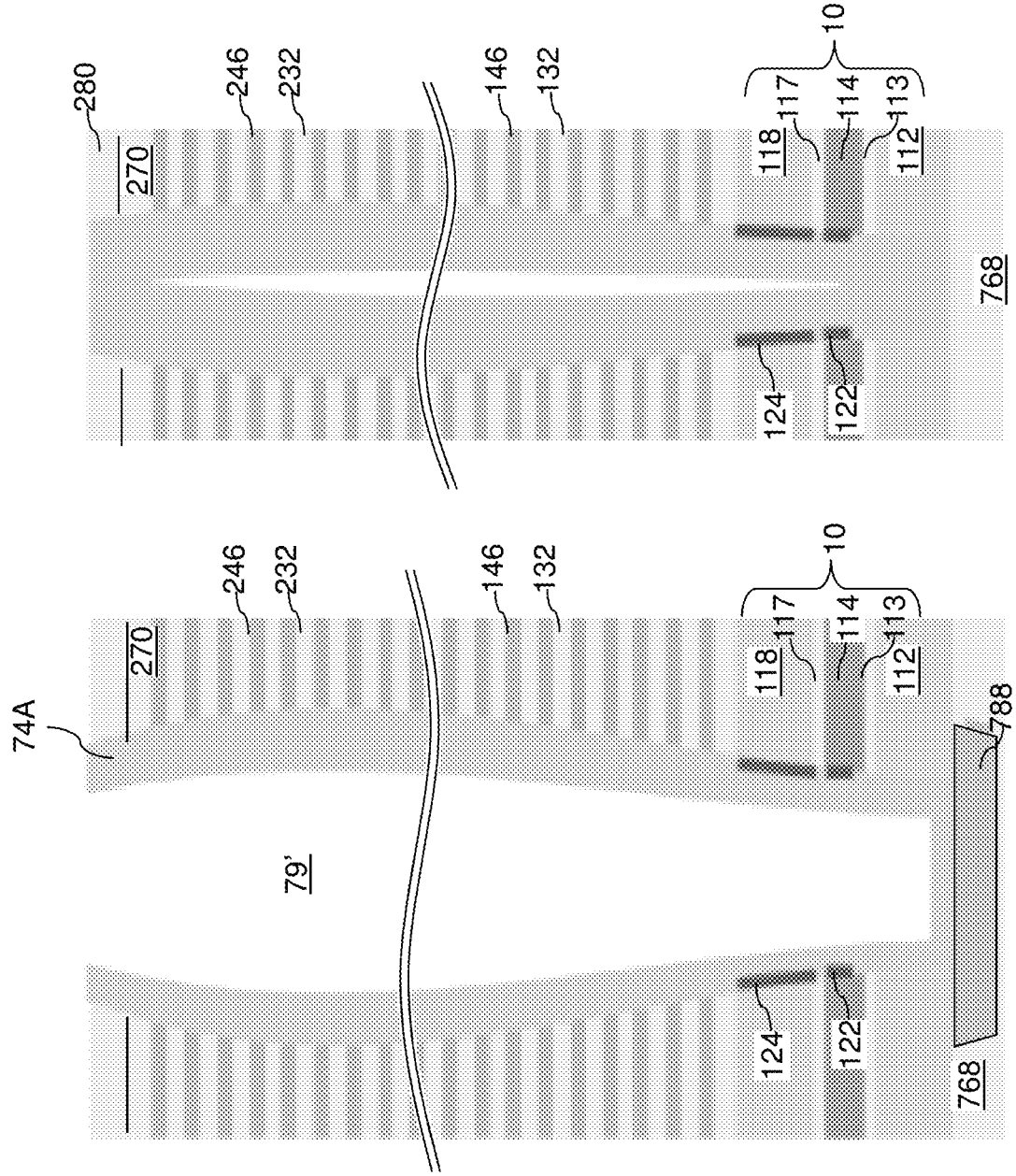

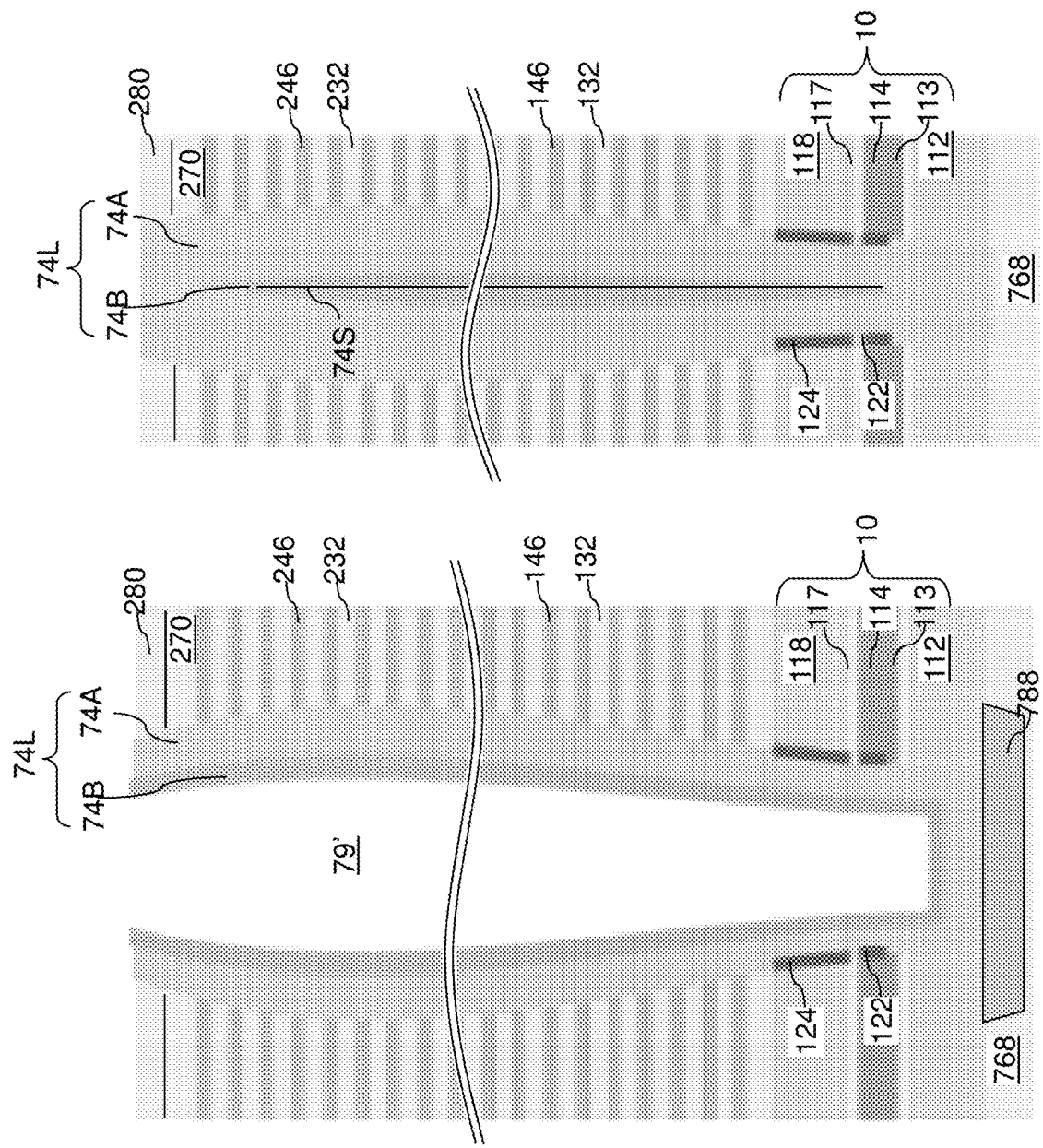

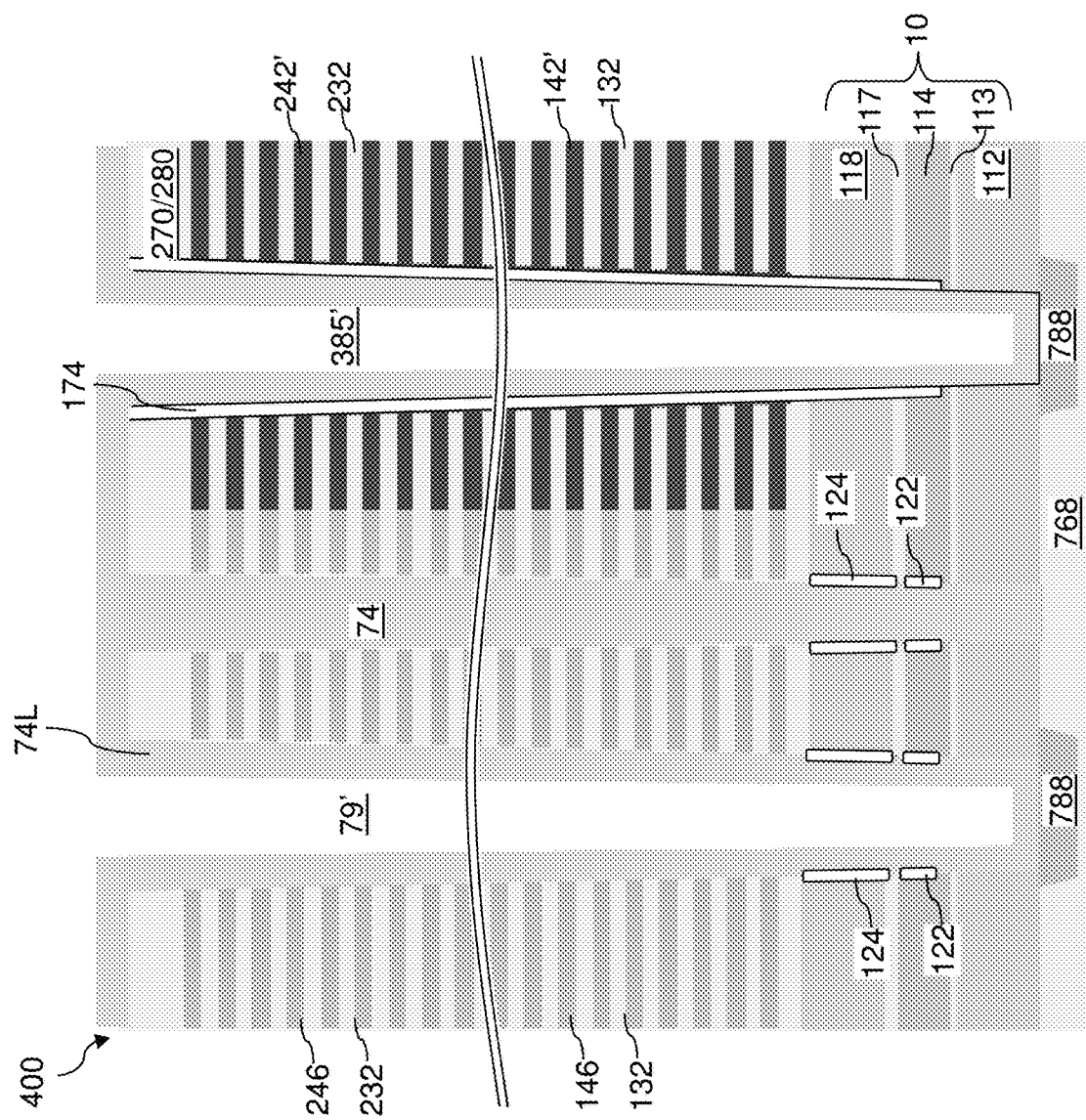

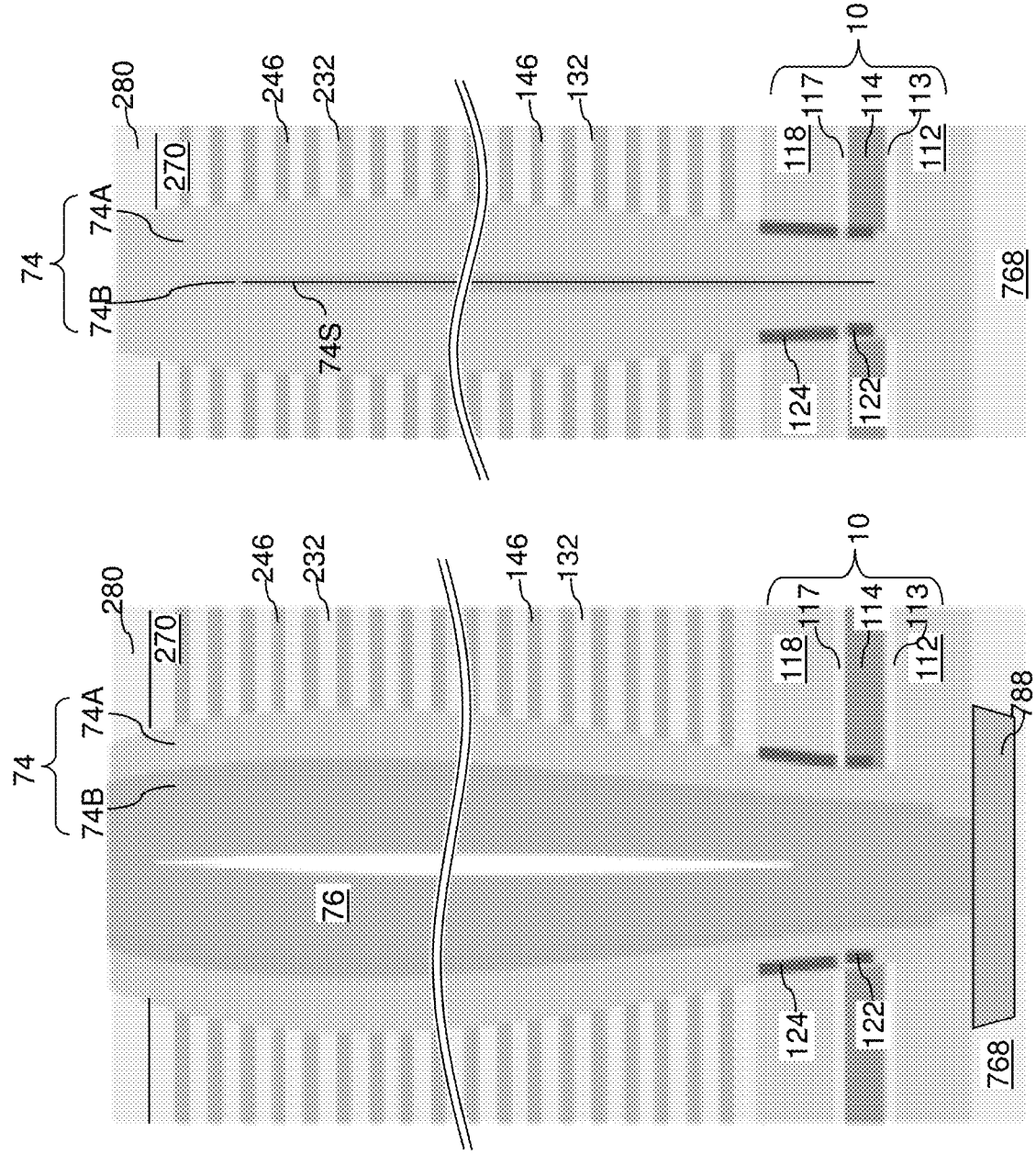

US 10,985,176 B2

THREE-DIMENSIONAL MEMORY DEVICE CONTAINING EYE-SHAPED CONTACT VIA STRUCTURES LOCATED IN LATERALLY-UNDULATING TRENCHES AND METHOD OF MAKING THE SAME

FIELD

The present disclosure relates generally to the field of semiconductor devices, and in particular, to a three-dimensional memory device including through-memory-level contact via structures formed in laterally-undulating trenches and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: alternating stacks of insulating layers and electrically conductive layers located over a semiconductor material layer; a group of memory stack structures extending through a first alternating stack selected from the alternating stacks that is located within a memory array region; laterally-undulating backside trenches located between neighboring pairs of the alternating stacks and laterally extending along a first horizontal direction, wherein each of the laterally-undulating backside trenches comprises a laterally alternating sequence of straight trench segments having a uniform trench width and bulging trench segments having a variable trench width that is greater than the uniform trench width; cavity-containing dielectric fill structures located within a respective one of the laterally-undulating backside trenches, wherein each of the cavity-containing dielectric fill structures comprises vertically-extending cavities within each region of bulging trench segments within the respective one of the laterally-undulating backside trenches, and each of the vertically-extending cavities is laterally spaced from a sidewall of a respective bulging trench segment by a uniform lateral width; and contact via structures located within the vertically-extending cavities of the cavity-containing dielectric fill structures and extending through the semiconductor material layer.

According to another embodiment of the present disclosure, a method of forming a three-dimensional memory device is provided, which comprises: forming a vertically alternating sequence of in-process insulating layers and in-process sacrificial material layers over a semiconductor material layer; forming memory stack structures through the vertically alternating sequence in a memory array region; forming laterally-undulating backside trenches that laterally extend along a first horizontal direction through the vertically alternating sequence, wherein remaining portions of the vertically alternating sequence comprise alternating stacks of insulating layers and sacrificial material layers, wherein each of the laterally-undulating backside trenches comprises a laterally alternating sequence of straight trench segments having a uniform trench width and bulging trench segments having a variable trench width that is greater than the uniform trench width; replacing the sacrificial material layers with electrically conductive layers; forming cavity-containing dielectric fill structures within a respective one of the laterally-undulating backside trenches, wherein each of the cavity-containing dielectric fill structures comprises vertically-extending cavities within each region of bulging trench segments within the respective one of the laterally-undulating backside trenches; and forming contact via structures within the vertically-extending cavities of the cavity-containing dielectric fill structures and extends through the semiconductor material layer.

According to a yet another embodiment of the present disclosure, a three-dimensional semiconductor device is provided, which comprises: alternating stacks of insulating layers and electrically conductive layers located over a semiconductor material layer; memory stack structures extending through a first alternating stack selected from the alternating stacks; laterally-undulating backside trenches located between neighboring pairs of the alternating stacks and laterally extending along a first horizontal direction; cavity-containing dielectric fill structures located within a respective one of the laterally-undulating backside trenches; first contact via structures located within the vertically-extending cavities of the cavity-containing dielectric fill structures and contacting the semiconductor material layer; a dielectric alternating stack of a subset of the insulating layers and dielectric spacer layers laterally adjoining one of the alternating stacks; and laterally-insulated contact via structures extending through the dielectric alternating stack, wherein each of the laterally-insulated contact via structures comprises a respective tubular dielectric spacer and a respective second contact via structure surrounded by the respective tubular dielectric spacer.

According to still another embodiment of the present disclosure, a method of forming a three-dimensional semiconductor device is provided, which comprises the steps of: forming a vertically alternating sequence of in-process insulating layers and in-process sacrificial material layers over a semiconductor material layer; forming memory stack structures extending through the vertically alternating sequence in a memory array region; forming laterally-undulating backside trenches and discrete via cavities through the vertically alternating sequence, wherein the laterally-undulating backside trenches laterally extend along a first horizontal direction through the vertically alternating sequence to divide the vertically alternating sequence into alternating stacks of insulating layers and sacrificial material layers, and the discrete via cavities are formed in a peripheral region that is free of the laterally-undulating backside trenches; covering surfaces of the discrete via cavities with a dielectric liner without covering sidewalls of the laterally-undulating backside trenches; replacing portions of the sacrificial material layers adjacent to the laterally-undulating backside trenches with electrically conductive layers without altering portions of the sacrificial material layers that are proximal to the dielectric liner; forming cavity-containing dielectric fill structures and tubular dielectric spacers in the laterally-undulating backside trenches and the discrete via cavities, respectively; and forming first contact via structures and second contact via structures within unfilled volumes of the laterally-undulating backside trenches and unfilled volumes of the discrete via cavities, respectively.

BRIEF DESCRIPTION OF THE DRAWINGS

FIGS. 9A-9D illustrate sequential vertical cross-sectional views of a memory opening during formation of a memory opening fill structure according to an embodiment of the present disclosure.

FIG. 10D is a vertical cross-sectional view of the exemplary structure along the vertical plane D-D' of FIG. 10C.

FIG. 10E is a vertical cross-sectional view of the exemplary structure along the vertical plane E-E' of FIG. 10C.

FIG. 11E is a vertical cross-sectional view of the exemplary structure along the vertical plane E-E' of FIG. 11B.

FIG. 11F is a vertical cross-sectional view of the exemplary structure along the vertical plane F-F' of FIG. 11B.

FIG. 12A is a vertical cross-sectional view of a bulging trench segment of the exemplary structure along a vertical plane perpendicular to a first horizontal direction after extending the laterally-undulating backside trenches and discrete via cavities.

FIG. 12B is a vertical cross-sectional view of a straight trench segment of the exemplary structure of FIG. 12A along a vertical plane perpendicular to the first horizontal direction.

FIGS. 15A-15D are sequential vertical cross-sectional views of the exemplary structure during deposition and patterning of a dielectric liner according to an embodiment of the present disclosure.

FIGS. 16A-16D are various vertical cross-sectional views of the exemplary structure after formation of semiconductor oxide spacers according to an embodiment of the present disclosure.

FIG. 17 is a vertical cross-sectional view of the exemplary structure after formation of backside recesses according to an embodiment of the present disclosure.

FIG. 20B is a vertical cross-sectional view of the exemplary structure along the vertical plane B-B' of FIG. 20A.

FIG. 20C is a vertical cross-sectional view of the exemplary structure along the vertical plane C-C' of FIG. 20A.

FIG. 21B is a vertical cross-sectional view of the exemplary structure along the vertical plane B-B' of FIG. 21A.

FIG. 21C is a vertical cross-sectional view of the exemplary structure along the vertical plane C-C' of FIG. 21A.

FIG. 21E is a vertical cross-sectional view of the exemplary structure along the vertical plane E-D' of FIG. 21D.

FIG. 23D is a vertical cross-sectional view of the exemplary structure along the vertical plane D-D' of FIG. 23C.

FIG. 23E is a vertical cross-sectional view of the exemplary structure along the vertical plane E-E' of FIG. 23C.

DETAILED DESCRIPTION

Figure 1A:
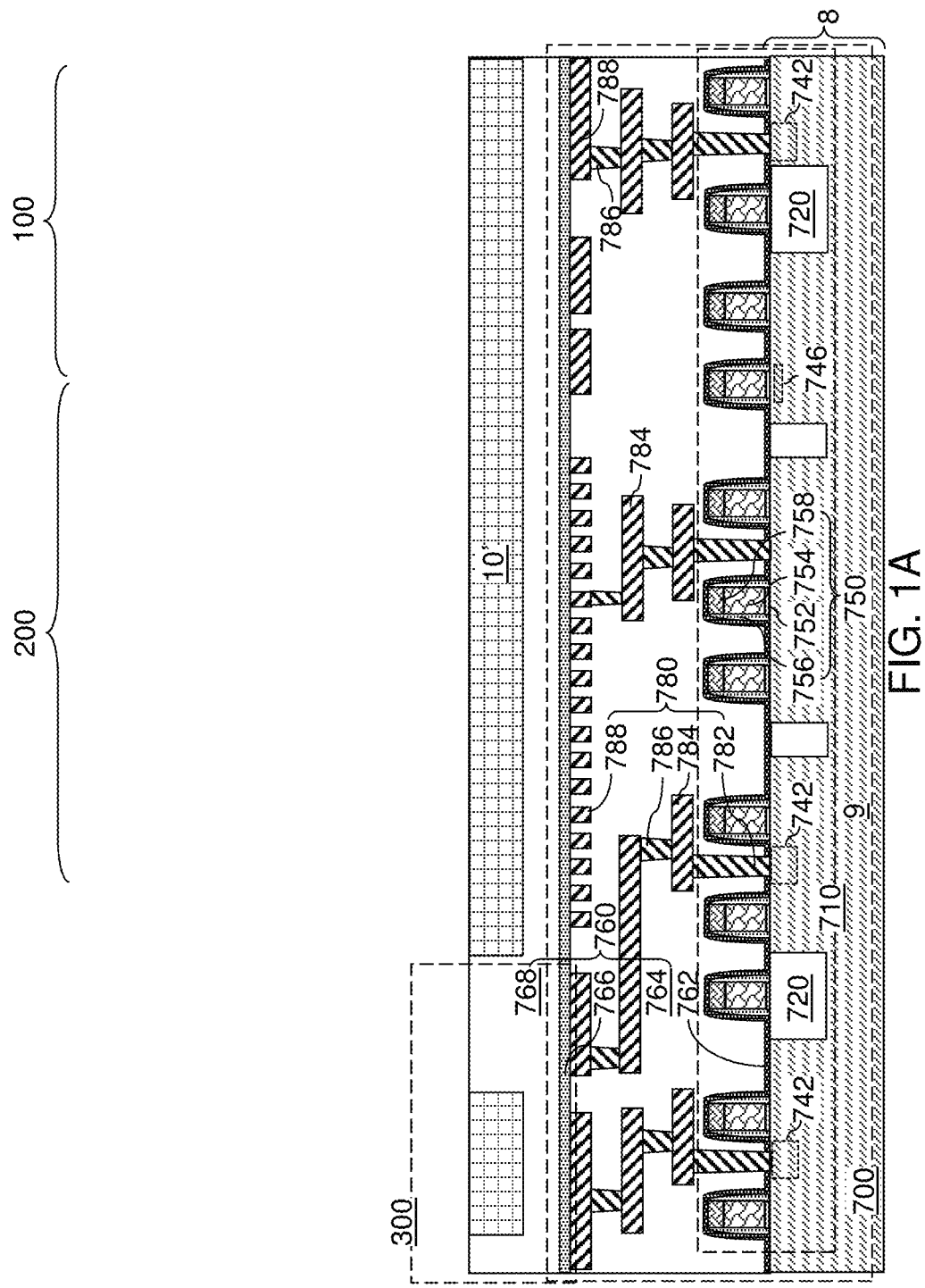
FIG. 1A is a vertical cross-sectional view of an exemplary structure after formation of semiconductor devices, lower-level dielectric layers, lower-level metal interconnect structures, and in-process source level material layers on a semiconductor substrate according to a first embodiment of the present disclosure.
Figure 1B:
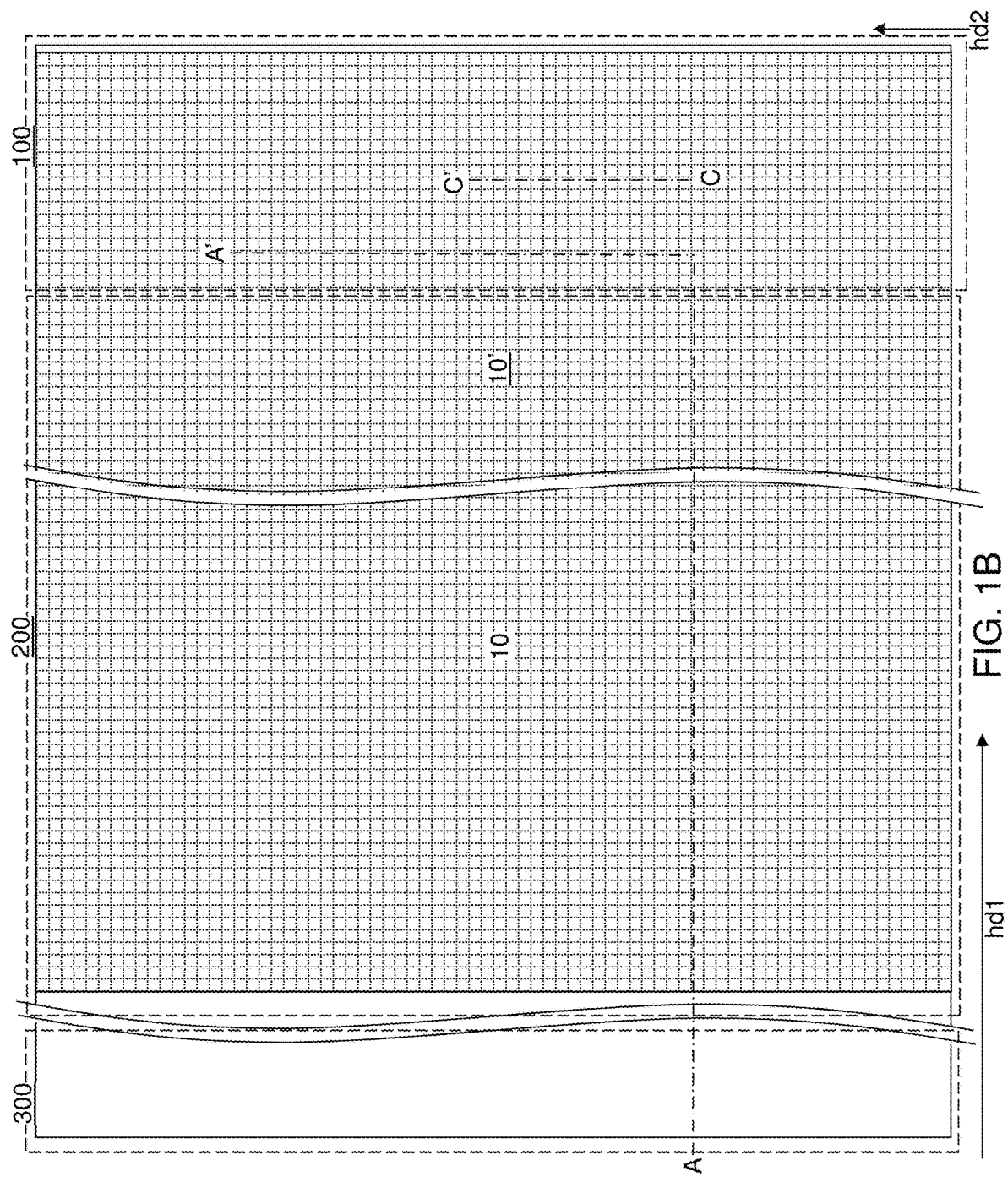
FIG. 1B is a top-down view of the exemplary structure of FIG. 1A. The hinged vertical plane A-A' is the plane of the vertical cross-sectional view of FIG. 1A.

As discussed above, the embodiments of the present disclosure are directed to a three-dimensional memory device including through-memory-level contact via structures formed in laterally-undulating slit trenches and methods of manufacturing the same, the various embodiments of which are described herein in detail. The embodiments of the present disclosure may be used to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1C:
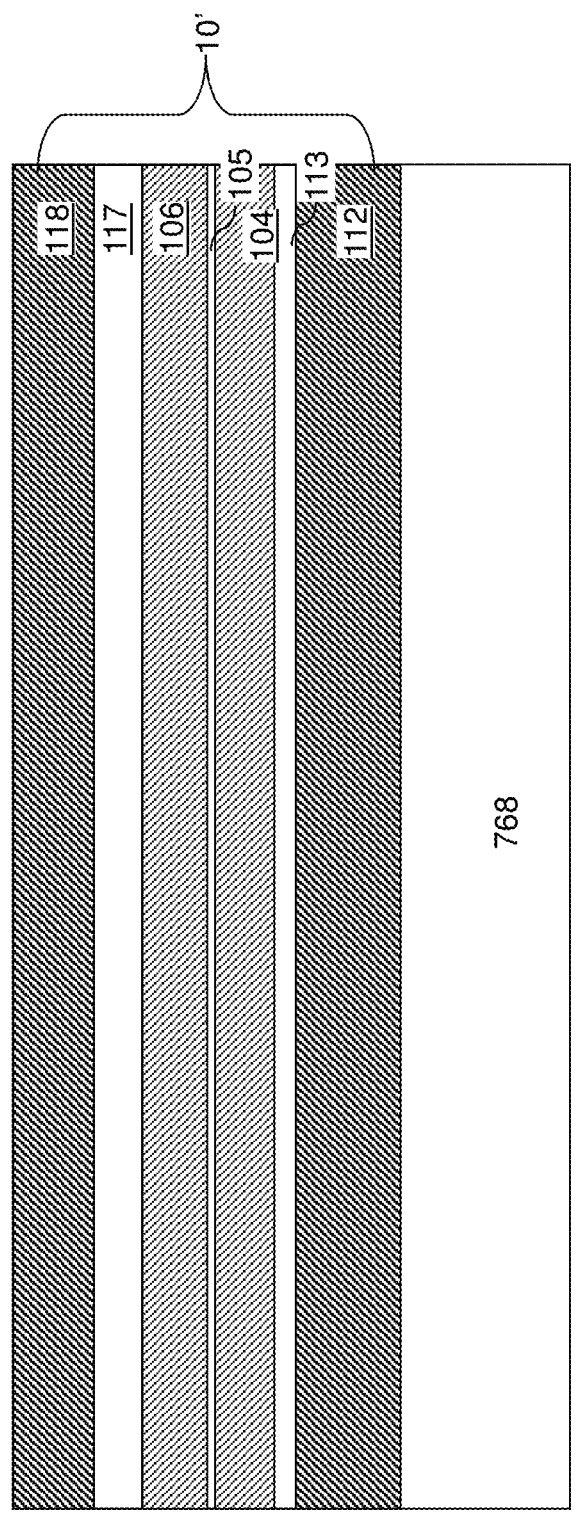
FIG. 1C is a magnified view of the in-process source level material layers along the vertical plane C-C' of FIG. 1B.

Referring to FIGS. 1A-1D, a first exemplary structure according to a first embodiment of the present disclosure is illustrated. FIG. 1C is a magnified view of an in-process source-level material layers 10' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices 710, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 may be formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

The in-process source-level material layers 10' may include various layers that are subsequently modified to form source-level material layers. The source-level material layers, upon formation, include a source semiconductor layer that functions as a common source region for vertical field effect transistors of a three-dimensional memory device. In one embodiment, the in-process source-level material layers 10' may include, from bottom to top, a lower source-level semiconductor layer 112, a lower source-level insulating liner 113, a lower source-level sacrificial layer 104, an etch stop sacrificial liner 105, an upper source-level sacrificial layer 106, an upper source-level insulating liner 117, and an optional source-select-level conductive layer 118.

The lower source-level semiconductor layer 112 may include a doped semiconductor material such as doped polysilicon or doped amorphous silicon. The thickness of each of the lower source-level semiconductor layer 112 may be in a range from 10 nm to 300 nm, such as from 20 nm to 150 nm, although lesser and greater thicknesses may also be used.

The lower source-level sacrificial layer 104 and the upper source-level sacrificial layer 106 include a sacrificial material that may be removed selective to the lower source-level insulating liner 113 and the upper source-level insulating liner 117. In one embodiment, the lower source-level sacrificial layer 104 and the upper source-level sacrificial layer 106 may include a semiconductor material such as undoped amorphous silicon or a silicon-germanium alloy with an atomic concentration of germanium greater than 20%. The thickness of each the lower source-level sacrificial layer 104 and the upper source-level sacrificial layer 106 may be in a range from 30 nm to 400 nm, such as from 60 nm to 200 nm, although lesser and greater thicknesses may also be used.

The lower source-level insulating liner 113 and the upper source-level insulating liner 117 include materials that may function as an etch stop material during removal of the source-level sacrificial layers (104, 106). For example, the lower source-level insulating liner 113 and the upper source-level insulating liner 117 may include silicon oxide, silicon nitride, and/or a dielectric metal oxide. In one embodiment, each of the lower source-level insulating liner 113 and the upper source-level insulating liner 117 may include a silicon oxide layer having a thickness in a range from 2 nm to 30 nm, although lesser and greater thicknesses may also be used.

The etch stop sacrificial liner 105 includes a dielectric material (such as silicon oxide) that may function as an etch stop structure during a subsequent anisotropic etch process. The thickness of the etch stop sacrificial liner 105 may be in a range from 5 nm to 50 nm, such as from 10 nm to 20 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The in-process source-level material layers 10' may be patterned to provide openings in areas in which through-memory-level contact via structures and through-dielectric contact via structures are to be subsequently formed. Patterned portions of the in-process source-level material layers 10' are present in each memory array region 100 in which three-dimensional memory stack structures are to be subsequently formed.

The in-process source-level material layers 10' may be patterned such that an opening extends over staircase regions 200 in which contact via structures contacting word line electrically conductive layers are to be subsequently formed. In one embodiment, the staircase regions 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the in-process source-level material layers 10' may be formed within the area of a memory array region 100, in which a three-dimensional memory array including memory stack structures is to be subsequently formed. A peripheral region 300 that is subsequently filled with a field dielectric material portion may be provided adjacent to the staircase regions 200.

Figure 1D:
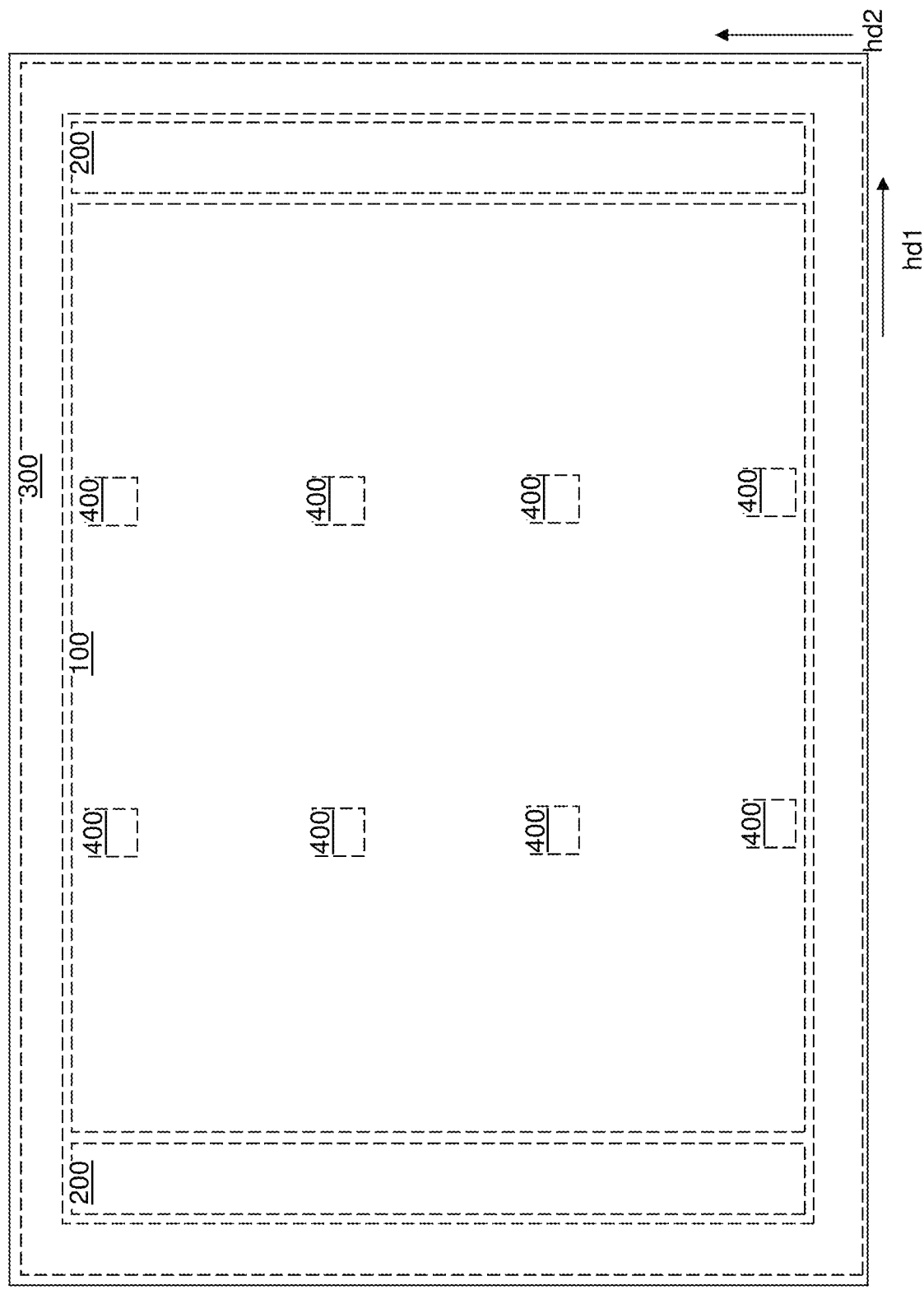
FIG. 1D is a large-scale top-down view of the exemplary structure of FIGS. 1A-1C.

With reference to FIG. 1D, contact tab regions 400 may be provided as discrete regions within the memory array region 100. The contact tab regions 400 are region in which contact via structures that extend through memory-level structures are subsequently formed to provide vertical electrically conductive paths connected to the lower-level metal interconnect structures 780 within the outer periphery of the memory array region 100. Peripheral regions 300 may be formed adjacent to the memory array region 100 and the staircase regions 200. The peripheral regions 300 may surround the memory array region 100 and the staircase region 200. In one embodiment, additional contact via structures extending through the memory-level structures may be subsequently formed in the peripheral region 300.

As shown in FIG. 1A, the region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
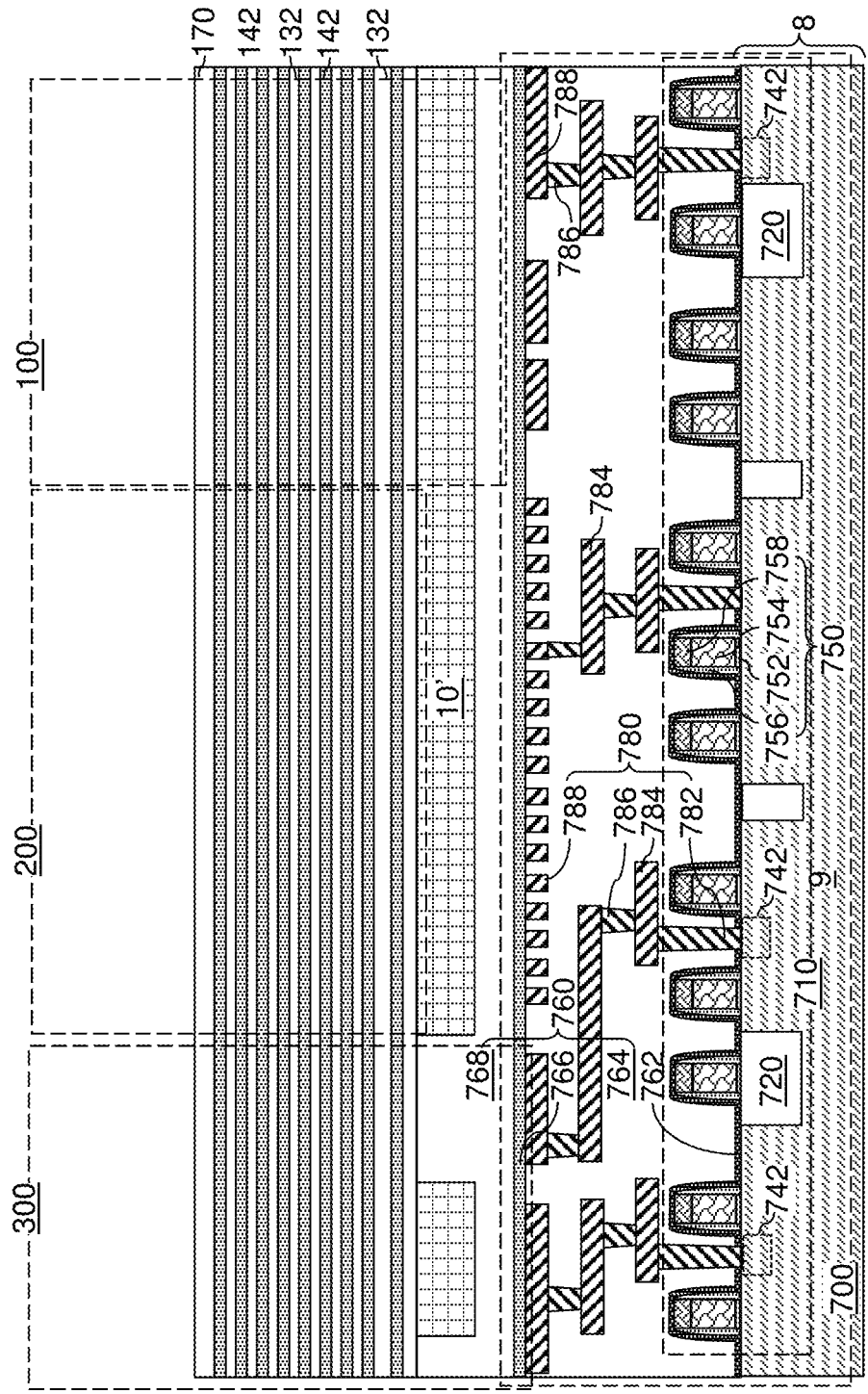
FIG. 2 is a vertical cross-sectional view of the exemplary structure after formation of a first-tier alternating stack of first insulting layers and first spacer material layers according to an embodiment of the present disclosure.

Referring to FIG. 2, a vertically alternating sequence of first material layers and second material layers may be subsequently formed. Each first material layer may include a first material, and each second material layer may include a second material that is different from the first material. In embodiments in which at least another vertically alternating sequence of material layers is subsequently formed over the vertically alternating sequence of the first material layers and the second material layers, the vertically alternating sequence is herein referred to as a first-tier vertically alternating sequence. The level of the first-tier vertically alternating sequence is herein referred to as a first-tier level, and the level of the vertically alternating sequence to be subsequently formed immediately above the first-tier level is herein referred to as a second-tier level, etc.

The first-tier vertically alternating sequence may include first insulting layers 132 as the first material layers, and first spacer material layers 142 as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the in-process source-level material layers 10'. As used herein, a "sacrificial material" refers to a material that is removed during a subsequent processing step.

As used herein, a vertically alternating sequence of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier vertically alternating sequence (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier vertically alternating sequence (132, 142) may have a uniform thickness that is substantially invariant within each respective first sacrificial material layer 142.

A first insulating cap layer 170 may be subsequently formed over the first vertically alternating sequence (132, 142). The first insulating cap layer 170 may include a dielectric material, which may be any dielectric material that may be used for the first insulating layers 132. In one embodiment, the first insulating cap layer 170 may include the same dielectric material as the first insulating layers 132. The thickness of the first insulating cap layer 170 may be in a range from 20 nm to 300 nm, although lesser and greater thicknesses may also be used.

Figure 3:
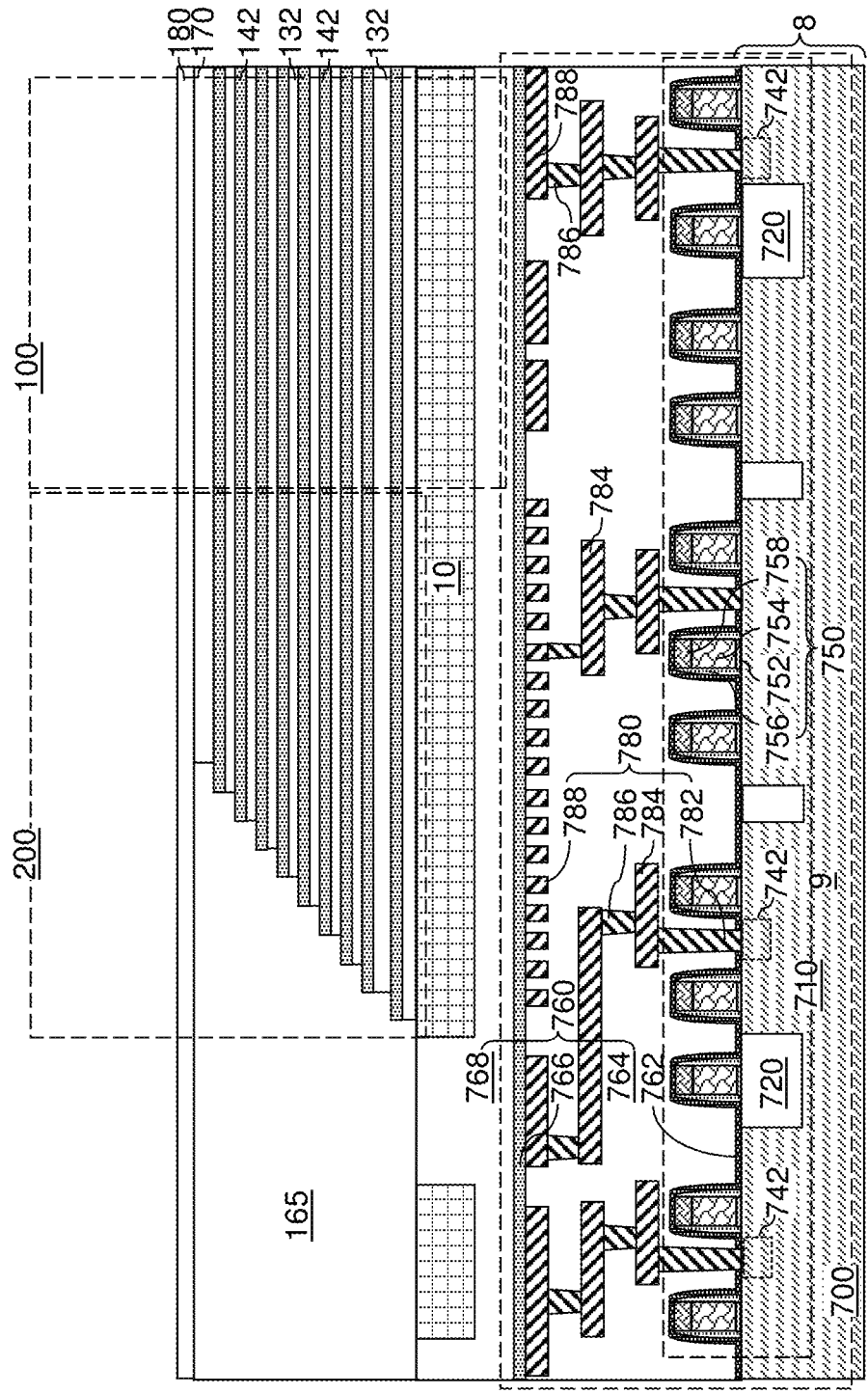
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier vertically alternating sequence (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 may include a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
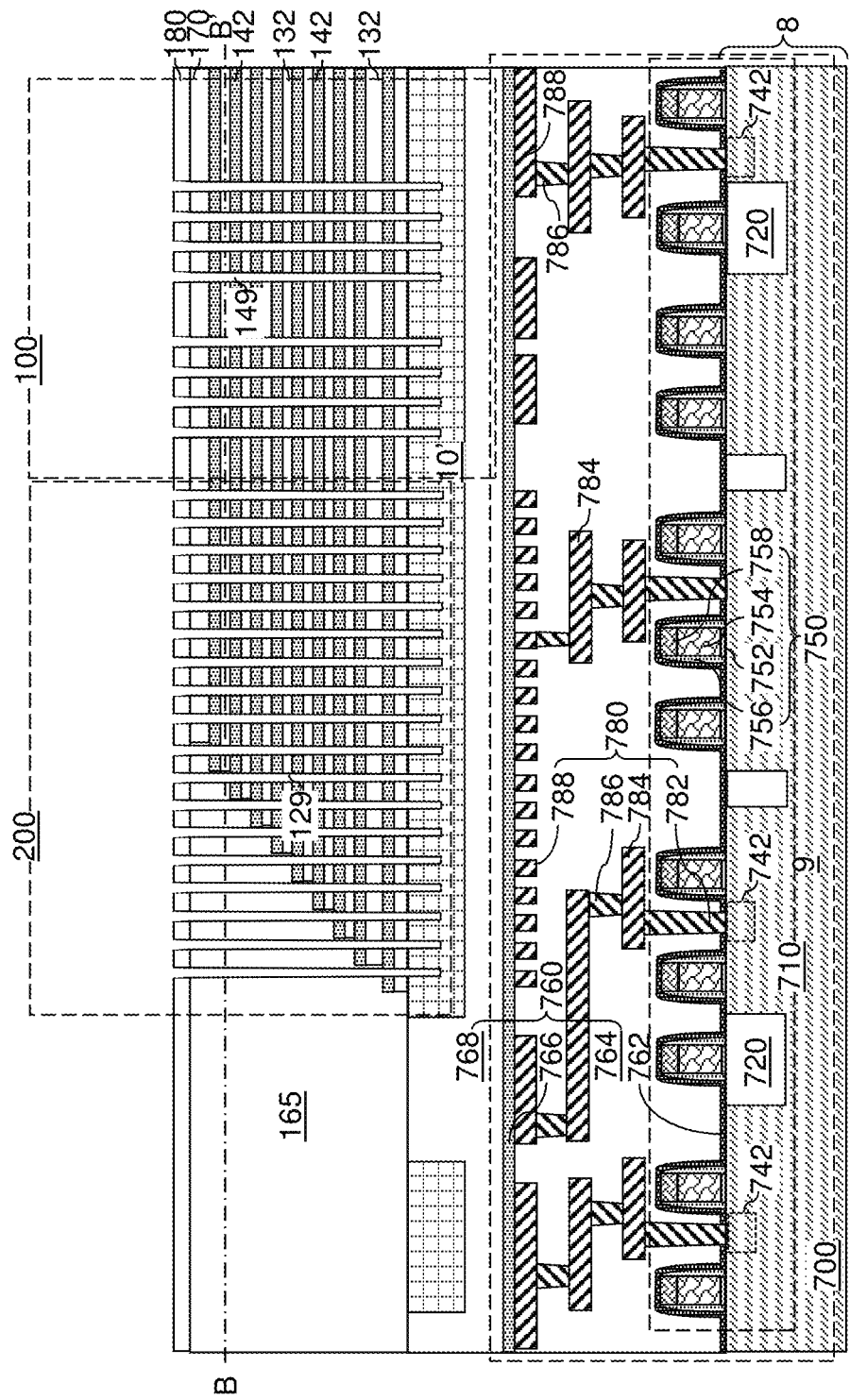
FIG. 4A is a vertical cross-sectional view of the exemplary structure after formation of first-tier memory openings and first-tier support openings according to an embodiment of the present disclosure.
Figure 4B:
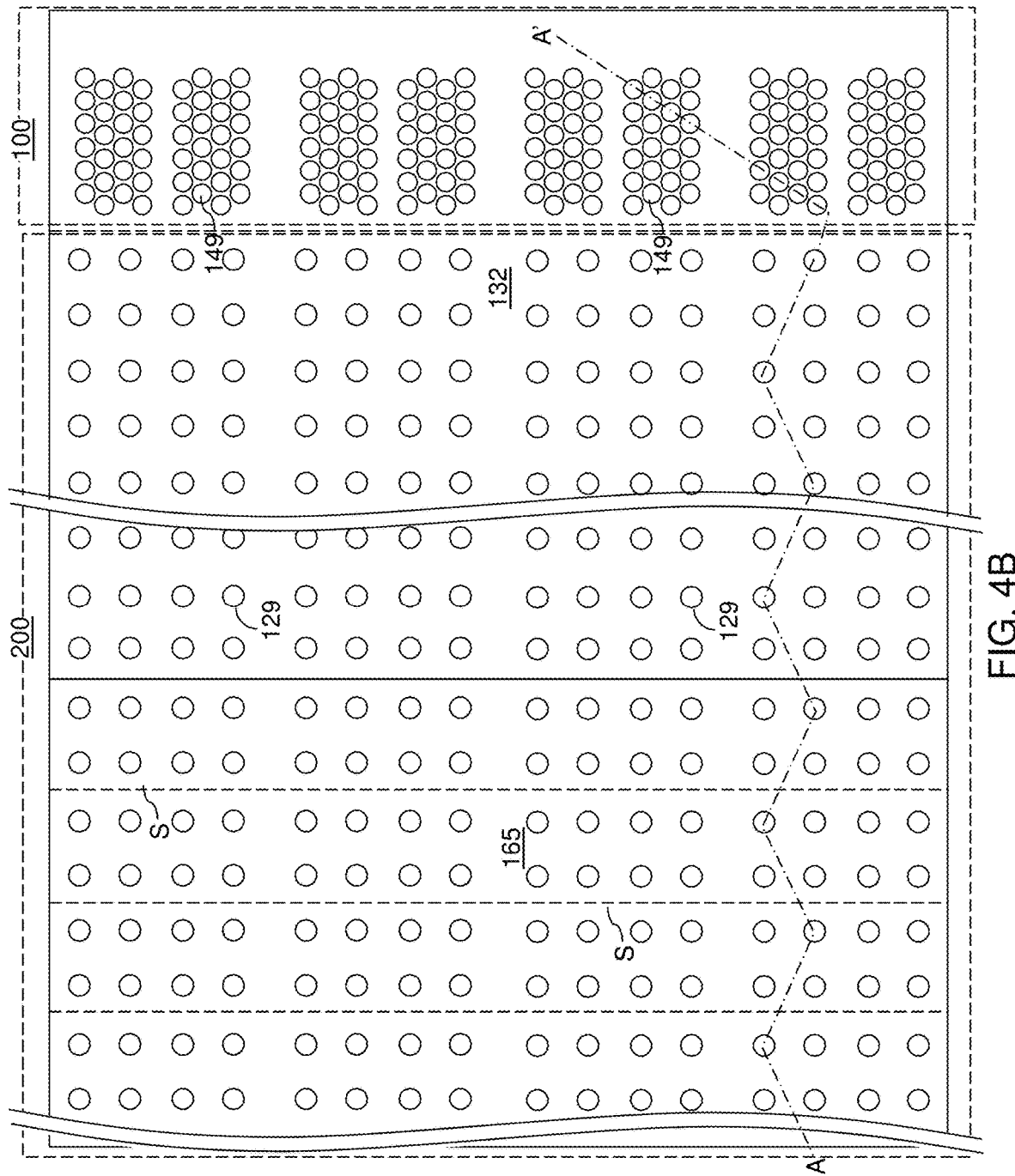
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first vertically alternating sequence (132, 142) are illustrated as dotted lines in FIG. 4B.

The first-tier memory openings 149 may be openings that are formed in the memory array region 100 through each layer within the first vertically alternating sequence (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200, and are subsequently used to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier vertically alternating sequence (132, 142) are etched concurrently with the material of the first retro-stepped dielectric material portion 165. The chemistry of the initial etch step may alternate to optimize etching of the first and second materials in the first-tier vertically alternating sequence (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the vertically alternating sequence (132, 142) and the first retro-stepped dielectric material portion 165, the chemistry of a terminal portion of the first anisotropic etch process may be selected to etch through the in-process source-level material layers 10'. The terminal portion of the first anisotropic etch process may include at least one etch chemistry for etching the various semiconductor materials of the in-process source-level material layers 10'. In one embodiment, the terminal portion of the first anisotropic etch process may etch through the source-select-level conductive layer 118, the upper source-level insulating liner 117, and the upper source-level sacrificial layer 106. The etch stop sacrificial liner 105 may be used as an etch stop layer. The anisotropic etch process may stop on the etch stop sacrificial liner 105, or may stop in the middle of the lower source-level sacrificial layer 104. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier vertically alternating sequence (to be subsequently formed prior to formation of the second-tier memory openings).

Figure 5:
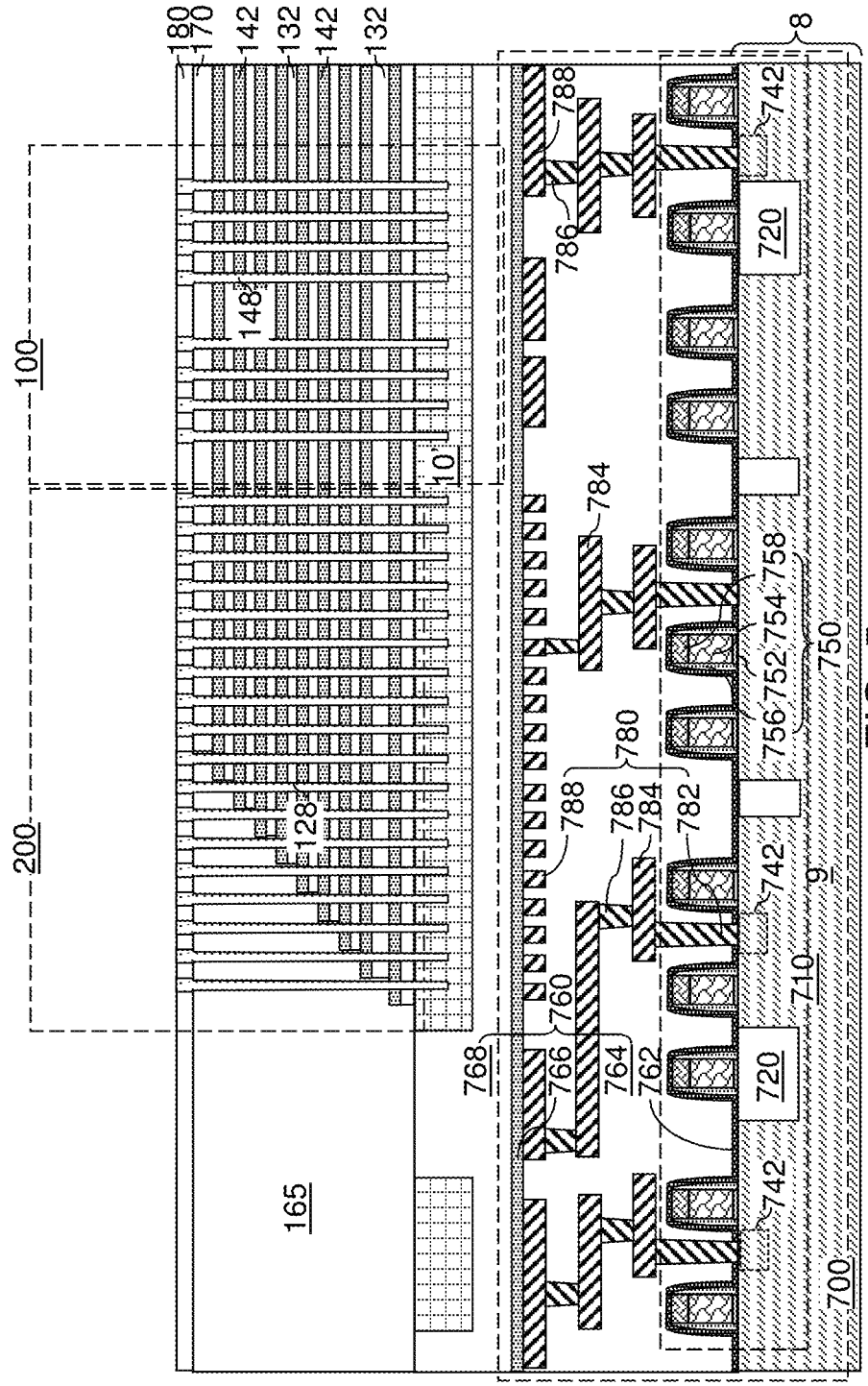
FIG. 5 is a vertical cross-sectional view of the exemplary structure after formation of various sacrificial fill structures according to an embodiment of the present disclosure.

Referring to FIG. 5, sacrificial first-tier opening fill portions (148, 128) may be formed in the various first-tier openings (149, 129). For example, a sacrificial first-tier fill material may be concurrently deposited in each of the first-tier openings (149, 129). The sacrificial first-tier fill material may include a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first vertically alternating sequence (132, 142).

Portions of the deposited sacrificial material may be removed from above the topmost layer of the first-tier vertically alternating sequence (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first vertically alternating sequence (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
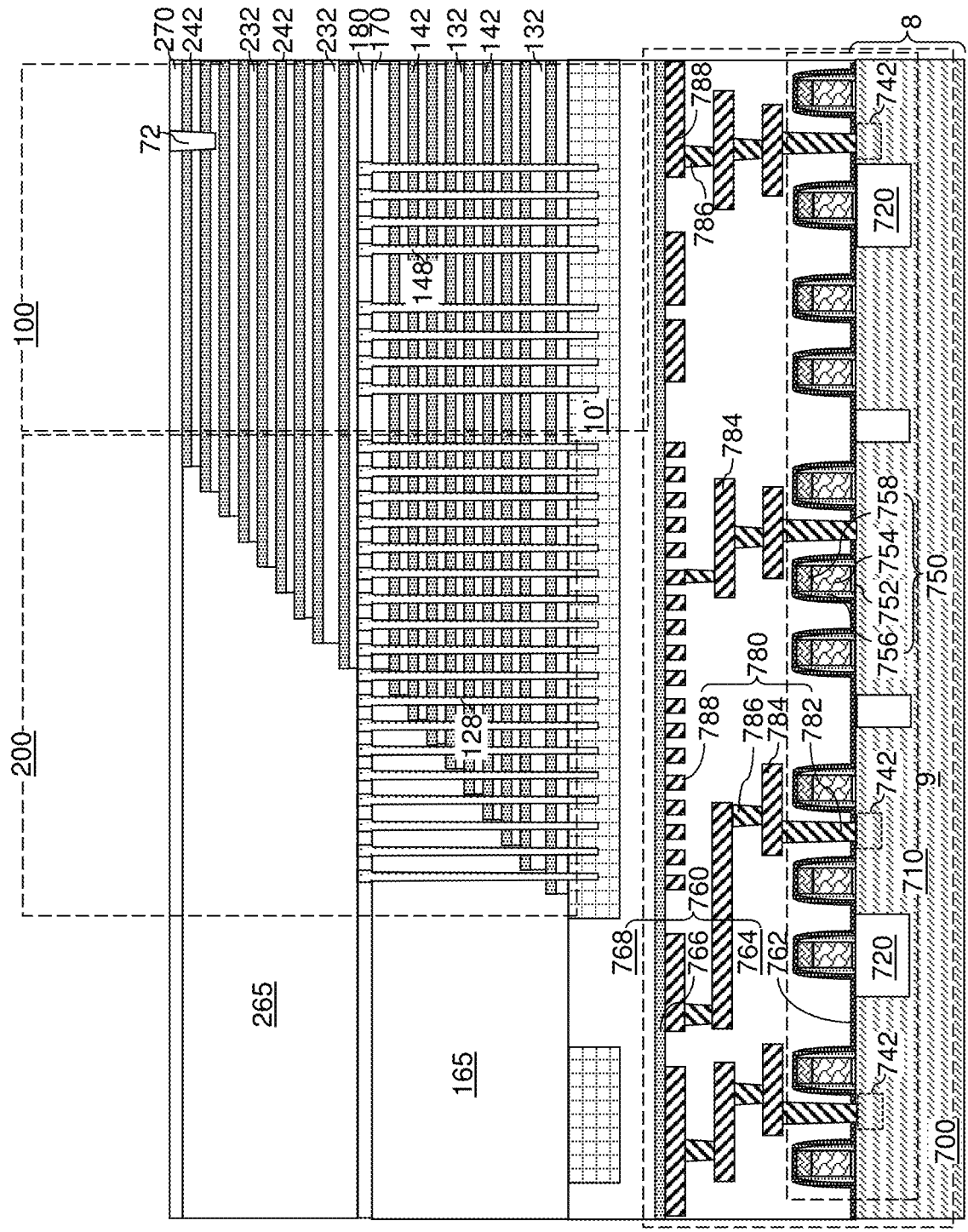
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the first-tier structure (132, 142, 170, 148). The second-tier structure may include an additional vertically alternating sequence of insulating layers and spacer material layers, which may be sacrificial material layers. For example, a second vertically alternating sequence (232, 242) of material layers may be subsequently formed on the top surface of the first vertically alternating sequence (132, 142). The second vertically alternating sequence (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second vertically alternating sequence (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second vertically alternating sequence (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second vertically alternating sequence (232, 242). The second insulating cap layer 270 may include a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one vertically alternating sequence of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one vertically alternating sequence (132, 142, 232, 242).

Optionally, drain-select-level isolation structures 72 may be formed through a subset of layers in an upper portion of the second-tier vertically alternating sequence (232, 242). The second sacrificial material layers 242 that are cut by the drain-select-level isolation structures 72 correspond to the levels in which drain-select-level electrically conductive layers are subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second vertically alternating sequence (232, 242), the second retro-stepped dielectric material portion 265, the second insulating cap layer 270, and the optional drain-select-level isolation structures 72 collectively constitute a second-tier structure (232, 242, 265, 270, 72).

Figure 7A:
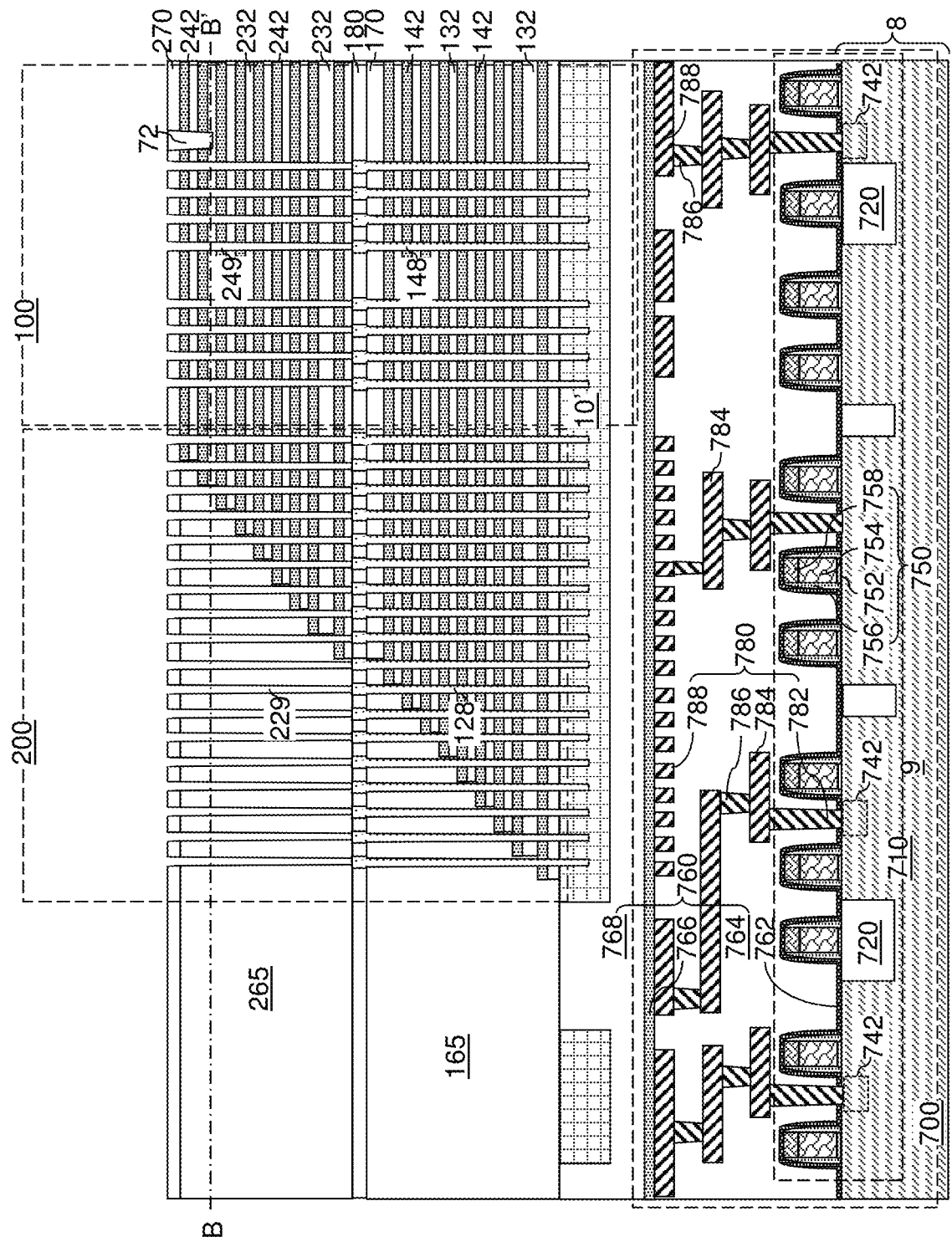
FIG. 7A is a vertical cross-sectional view of the exemplary structure after formation of second-tier memory openings and second-tier support openings according to an embodiment of the present disclosure.
Figure 7B:
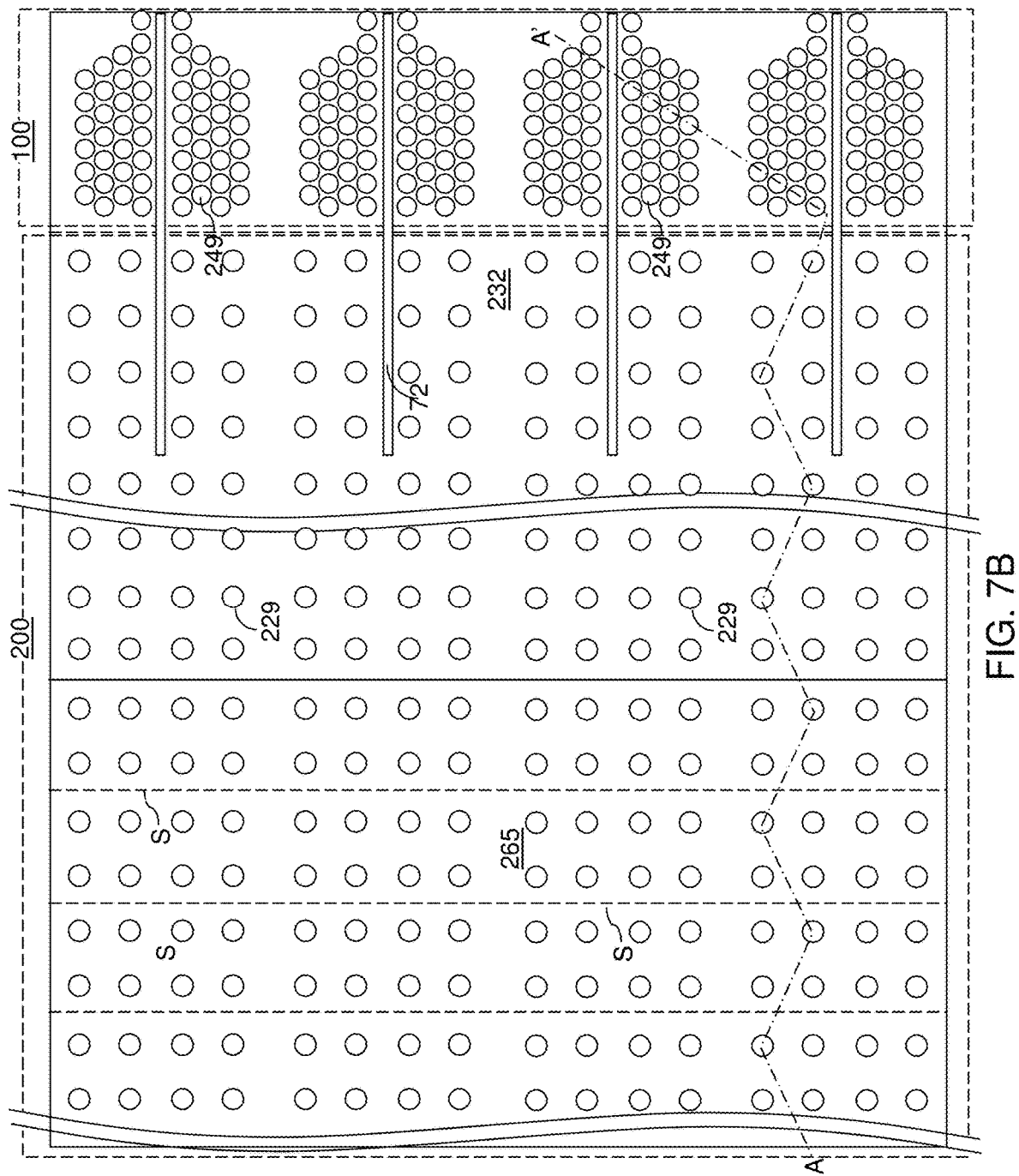
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each second-tier support openings 229 may be formed through a horizontal surface within the second stepped surfaces, which include the interfacial surfaces between the second vertically alternating sequence (232, 242) and the second retro-stepped dielectric material portion 265. Locations of steps S in the first-tier vertically alternating sequence (132, 142) and the second-tier vertically alternating sequence (232, 242) are illustrated as dotted lines in FIG. 7B.

The second anisotropic etch process may include an etch step in which the materials of the second-tier vertically alternating sequence (232, 242) are etched concurrently with the material of the second retro-stepped dielectric material portion 265. The chemistry of the etch step may alternate to optimize etching of the materials in the second-tier vertically alternating sequence (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
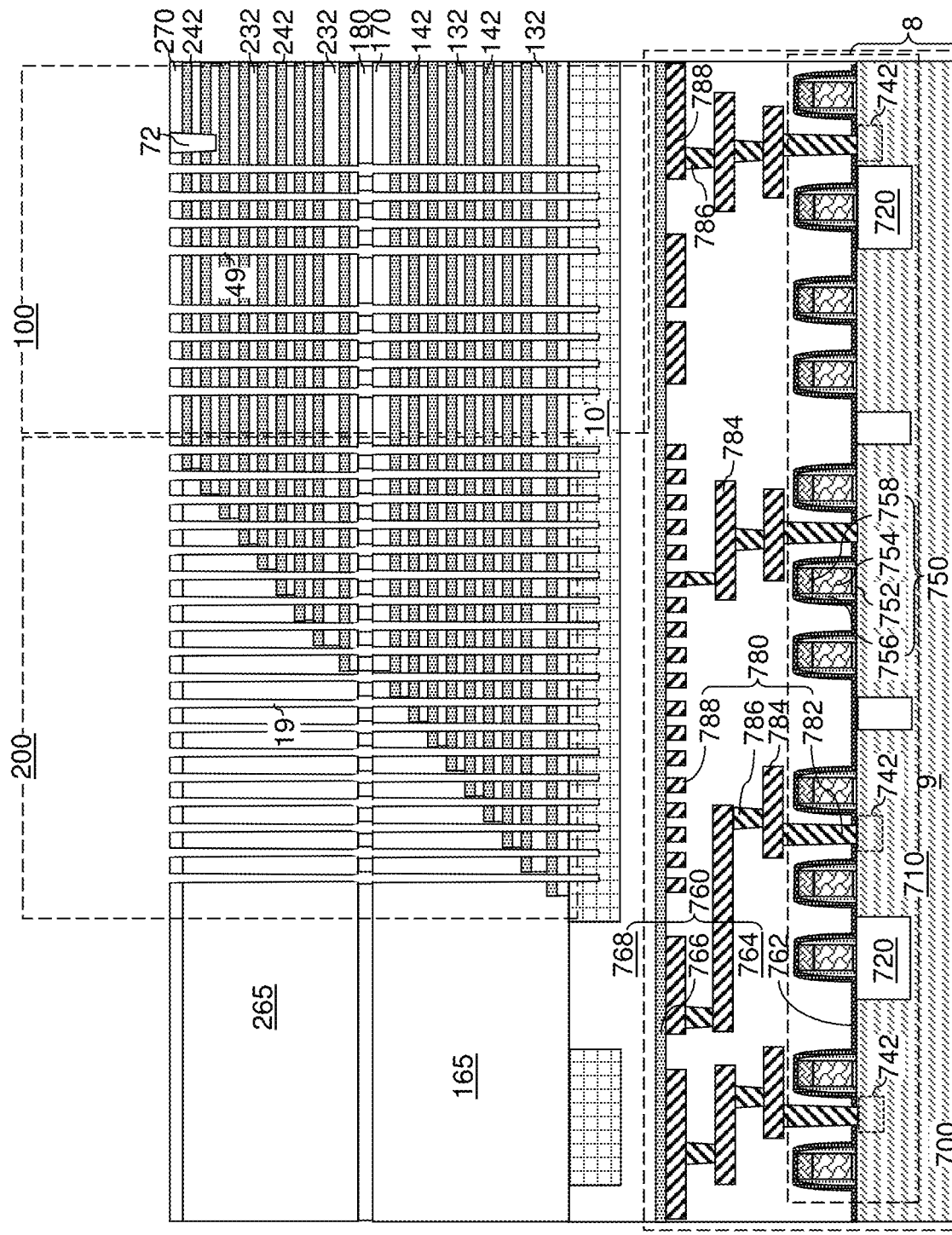
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a memory opening 49 in the first exemplary device structure of FIG. 8 is illustrated. The memory opening 49 extends through the first-tier structure and the second-tier structure.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., inactive gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L may include a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265, 72), the inter-tier dielectric layer 180, and the memory opening fill structures 58 collectively constitute a memory-level assembly.

Referring to FIGS. 10A-10G, the first exemplary structure is illustrated after formation of the memory opening fill structures 58. Composite support pillar structures 20 are formed in the support openings 19 concurrently with formation of the memory opening fill structures 58. Each composite support pillar structure 20 may have a same set of components as a memory opening fill structure 58.

Generally, at least one vertically alternating sequence of in-process insulating layers (132, 232) and in-process sacrificial material layers (142, 242) is formed over a semiconductor material layer such as a lower source-level semiconductor layer 112. Memory stack structures 55 may be formed through the vertically alternating sequence {(132, 142), (232, 242)} in a memory array region 100. Composite support pillar structures 20 may vertically extend through the vertically alternating sequence {(132, 142), (232, 242)} in the staircase regions 200, the contact tab regions 400, and optionally in the peripheral region 300. In addition, some composite support pillar structures 20 may be formed in the memory array region 100 in areas adjacent to the areas of staircase region 200, adjacent to the areas of the contact tab regions 400, or adjacent to areas in which laterally-undulated backside trenches are to be subsequently formed. In one embodiment, the contact tab regions 400 may be free of any memory stack structures 55.

Clusters of memory opening fill structures 58 in the memory array region 100 may be laterally spaced apart along the second horizontal direction hd2. In one embodiment, a gap between neighboring clusters of memory opening fill structures 58 may have a laterally-undulating width along the second horizontal direction hd2 which varies along the first horizontal direction hd1. As illustrated in FIG. 10C, each bulging region of a gap between neighboring clusters of memory opening fill structures 58 may have a generally circular area or a generally elliptical area. Each gap between neighboring pairs of clusters of memory opening fill structures 58 may laterally extend along the first horizontal direction hd1 within the memory array region 100 and optionally into one or more contact tab regions 400 and/or into at least one staircase region 200. The memory opening fill structures 58 of FIG. 10C are not shown in FIG. 10E for simplicity.

Each of the staircase regions 200 and/or the contact tab regions 400 may include composite support pillar structures 20 including a same set of material portions as a memory opening fill structure 58. Alternative, or additionally, each of the staircase regions 200 and/or contact tab regions 400 may include dielectric support pillar structures 120 in lieu of, or in addition to, the composite support pillar structures 20. The dielectric support pillar structures 120 and/or the composite support pillar structures 20 may have a respective circular horizontal cross-sectional shape and/or a respective elliptical horizontal cross-sectional shape. The dielectric support pillar structures 120, if used, may be formed by filling the support openings 19 with at least one dielectric material such as silicon oxide. Thus, the dielectric support pillar structures 120 may consist essentially of at least one dielectric material. In this case, a sacrificial fill material may be deposited in the memory openings 49 and the support openings 19 after the processing steps of FIGS. 7A and 7B, and the sacrificial fill material may be removed from one set of openings selected from the memory openings 49 and the support openings 19 without removing the sacrificial fill material from the other set of openings using a patterned mask layer and a selective etch step that etches the sacrificial fill material. In case the sacrificial fill material is removed from the memory openings 49 during the selective etch step, memory opening fill structures 58 may be formed in the memory openings 49, and the sacrificial fill material in the support openings 19 may be subsequently removed to be replaced with the dielectric support pillar structures 120. In case the sacrificial fill material is removed from the support openings 19 during the selective etch step, the dielectric support pillar structures 120 may be formed in the support openings, and the sacrificial material in the memory openings 49 may be subsequently replaced with the memory opening fill structures 58.

In some embodiments, composite support pillar structures 20 may be used in addition to, or in lieu of, the dielectric support pillar structures 120. In this case, the composite support pillar structures 20 may be formed concurrently with formation of the memory opening fill structures 58. Generally, support pillar structures (20, 120) may include a same set of material portions as memory opening fill structures 58 or may consist of at least one dielectric material. In case the composite support pillar structures 20 are used, the composite support pillar structures 20 may be electrically inactive. As used herein, an element is electrically inactive if the element does not flow electrical current therethrough as a portion of conductive electrical path, does not store electrical charges therein as a capacitor, and does not function as an inductor.

Figure 10A:
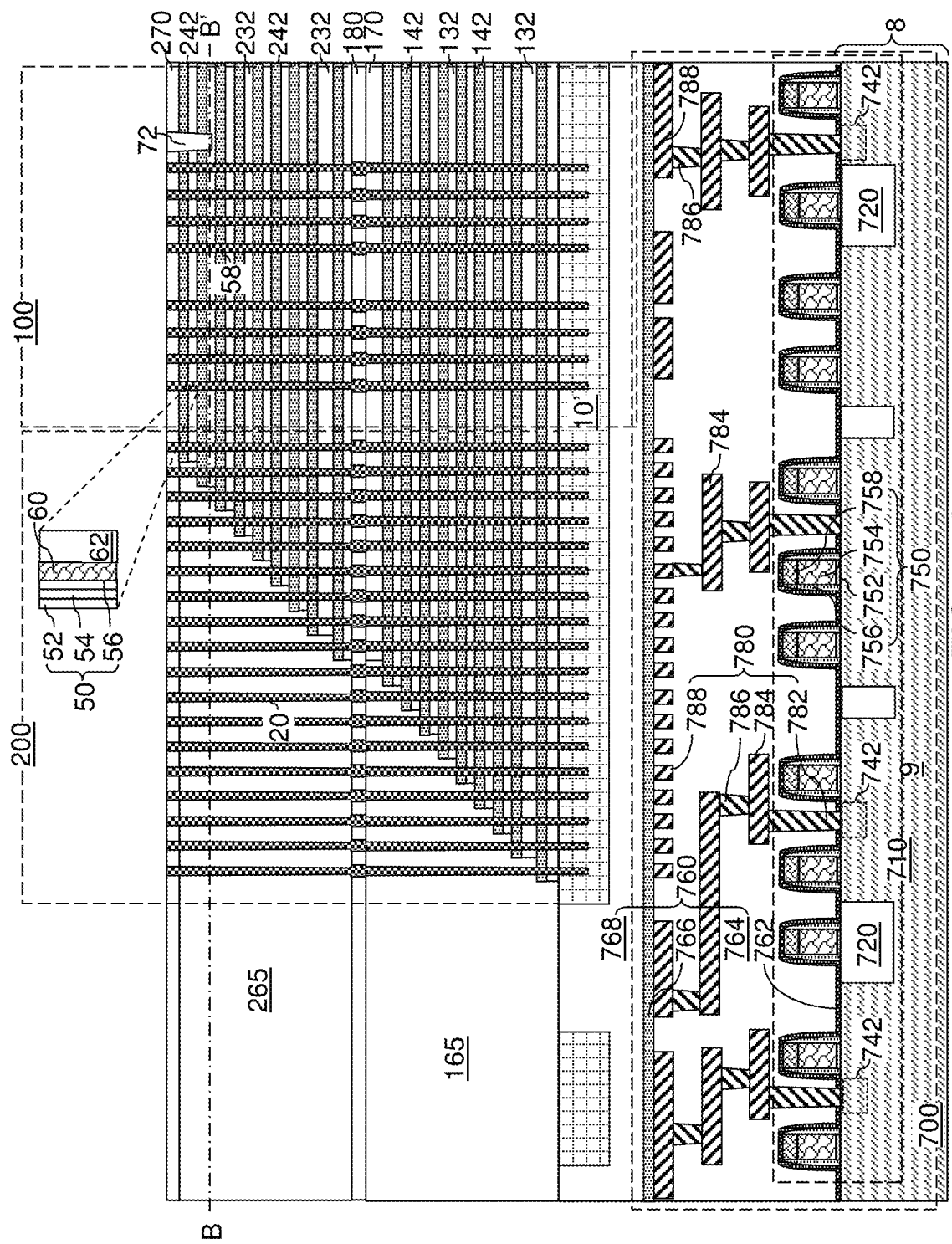
FIG. 10A is a vertical cross-sectional view of the exemplary structure after formation of memory opening fill structures and support pillar structures according to an embodiment of the present disclosure.
Figure 10B:
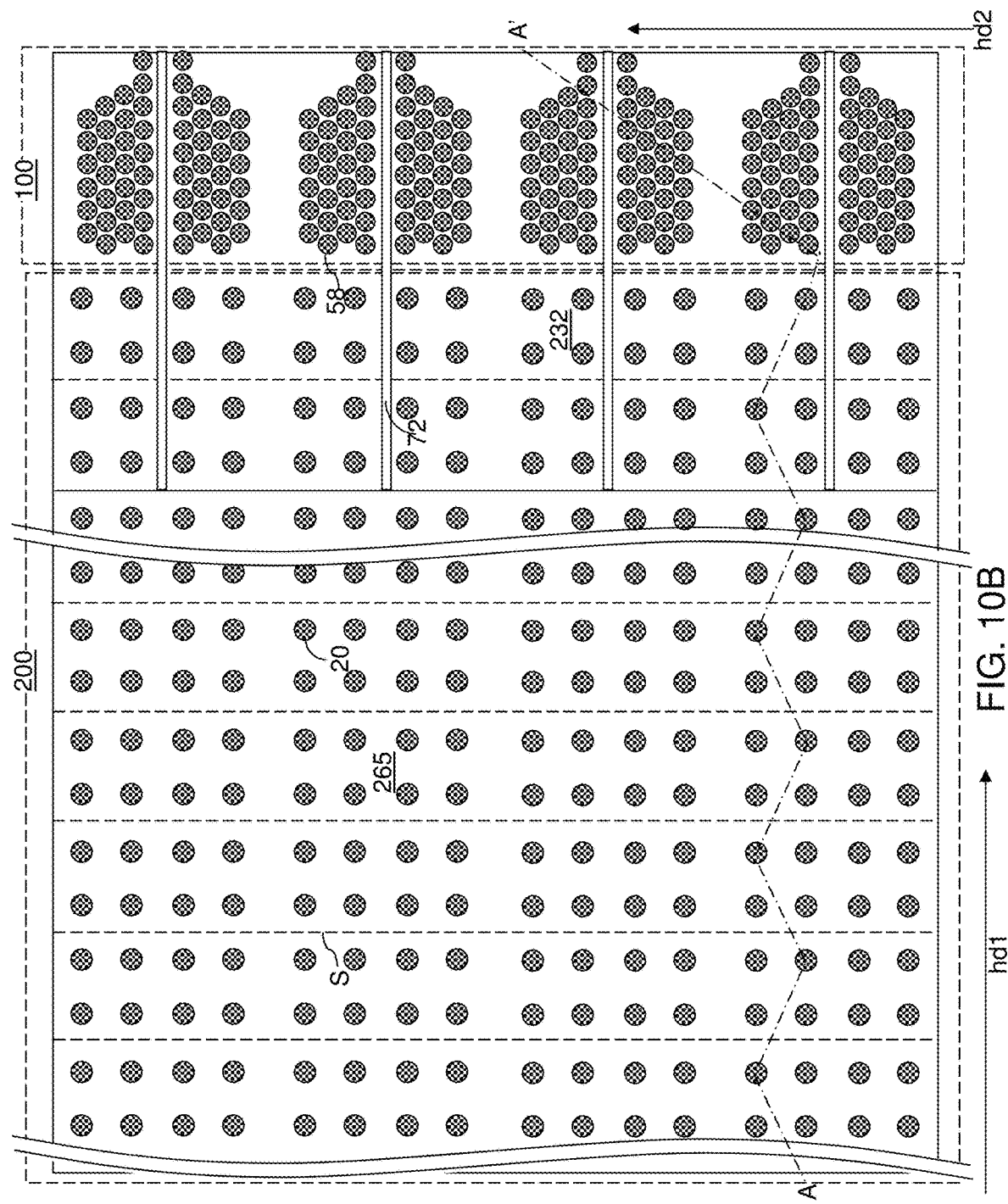
FIG. 10B is a horizontal cross-sectional view of the exemplary structure along the horizontal plane B-B' of FIG. 10A. The hinged vertical plane A-A' corresponds to the plane of the vertical cross-sectional view of FIG. 10A.
Figure 10C:
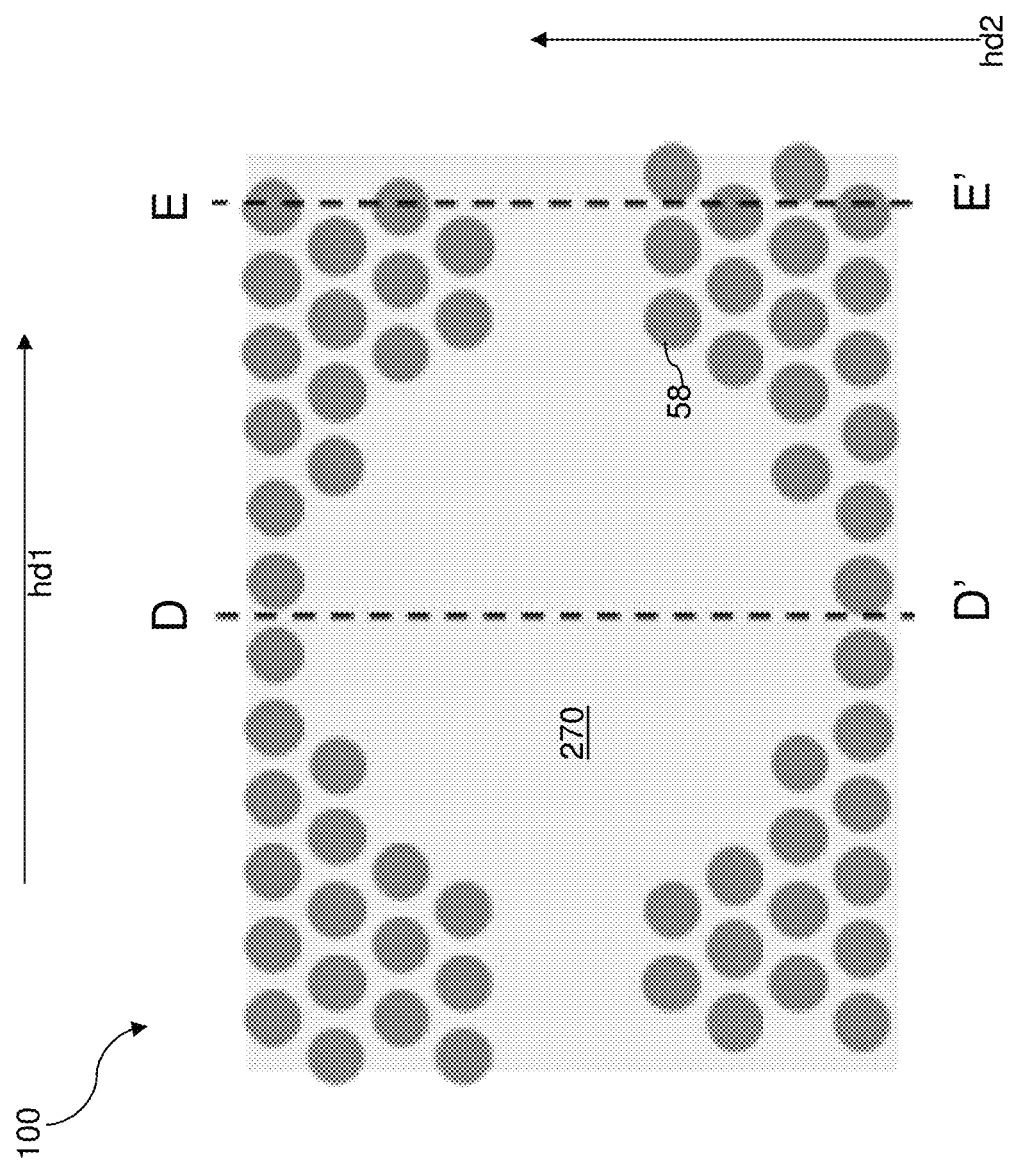
FIG. 10C is a magnified horizontal cross-sectional view of a memory array region along the horizontal plane B-B' of FIG. 10A.
Figure 10F:
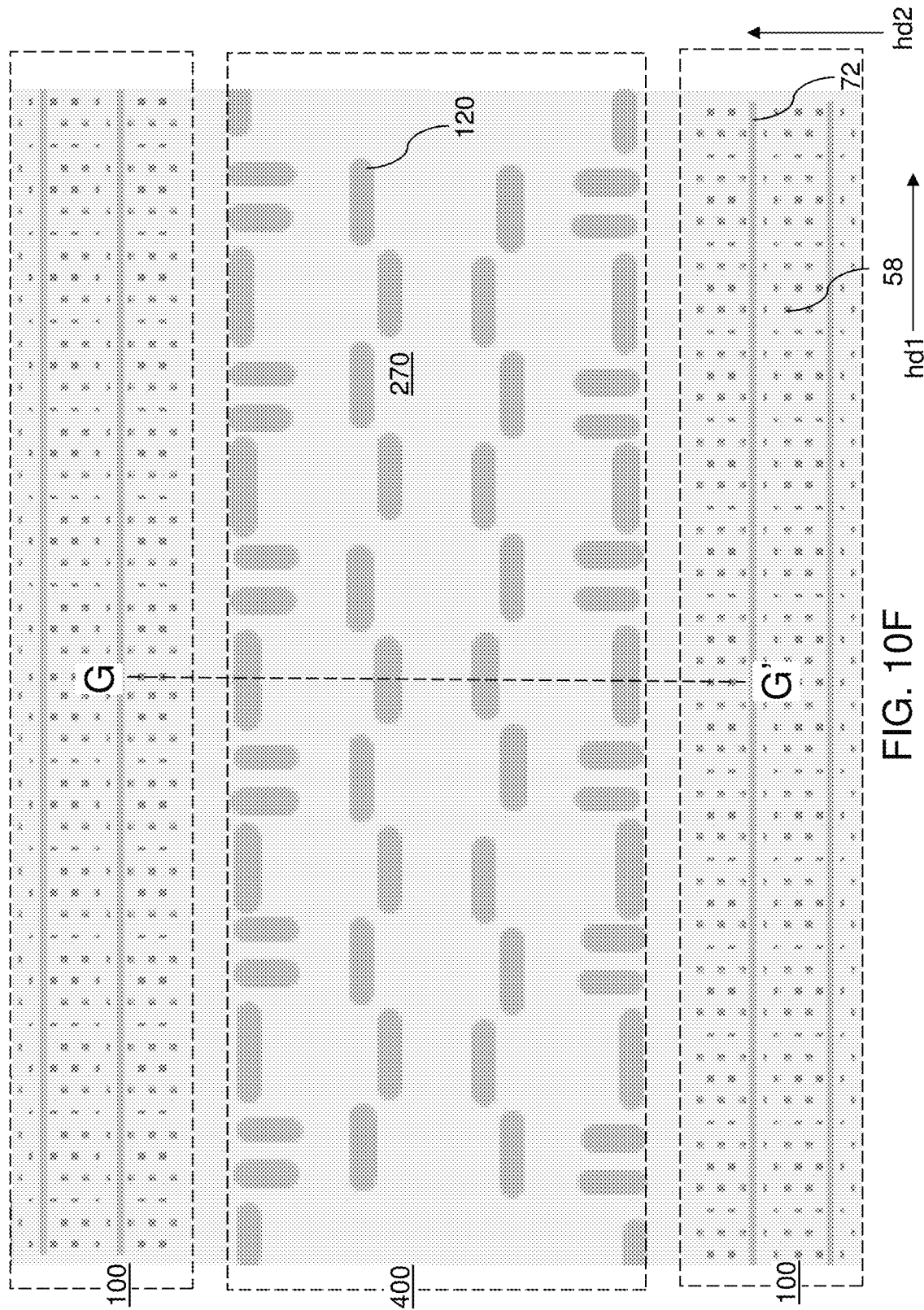
FIG. 10F is a top-down view of another area of the exemplary structure that includes a via connection region and a portion of a memory array region at the processing steps of FIGS. 10A-10E.
Figure 10G:
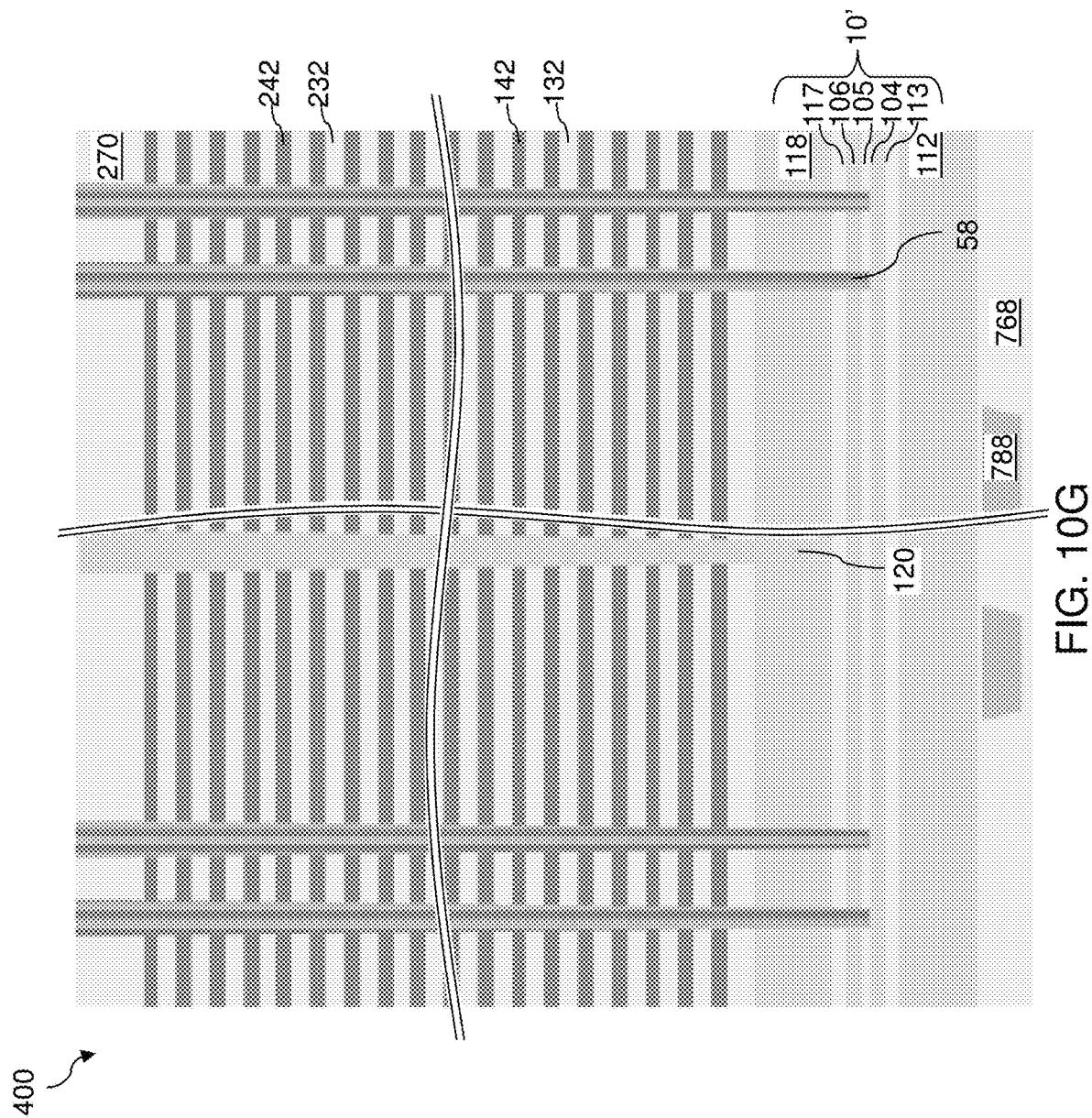
FIG. 10G is a vertical cross-sectional view of the exemplary structure along the vertical plane G-G' of FIG. 10F.

The various configurations of FIGS. 10A-10F may be used in parallel, or may be selectively used without using at least one configuration of the FIGS. 10A-10F. For example, the feature of laterally-undulating gaps between neighboring pairs of clusters of memory opening fill structures 58 in the memory array region 100 illustrated in FIGS. 10C-10E may be used in conjunction with, or in lieu of the feature of laterally-undulating gaps between support pillar structures (20 and/or 120) in a contact tab region 400 illustrated in FIGS. 10F and 10G. Likewise, the feature of laterally-undulating gaps between support pillar structures (20 and/or 120) in a contact tab region 400 illustrated in FIGS. 10F and 10G may be used in conjunction with, or in lieu of the feature of laterally-undulating gaps between neighboring pairs of clusters of memory opening fill structures 58 in the memory array region 100 illustrated in FIGS. 10C-10E. While composite support pillar structures 20 are illustrated in FIGS. 10A and 10B and dielectric support pillar structures 120 are illustrated in FIG. 10F, it is understood that the layout of the exemplary structure may be modified to use the composite support pillar structures 20 and/or dielectric support pillar structures 120 in any of the staircase regions 200, the contact tab regions 400, segments of the memory array region 100, and/or the peripheral region 300.

Referring to FIGS. 11A-11H, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

Figure 11A:
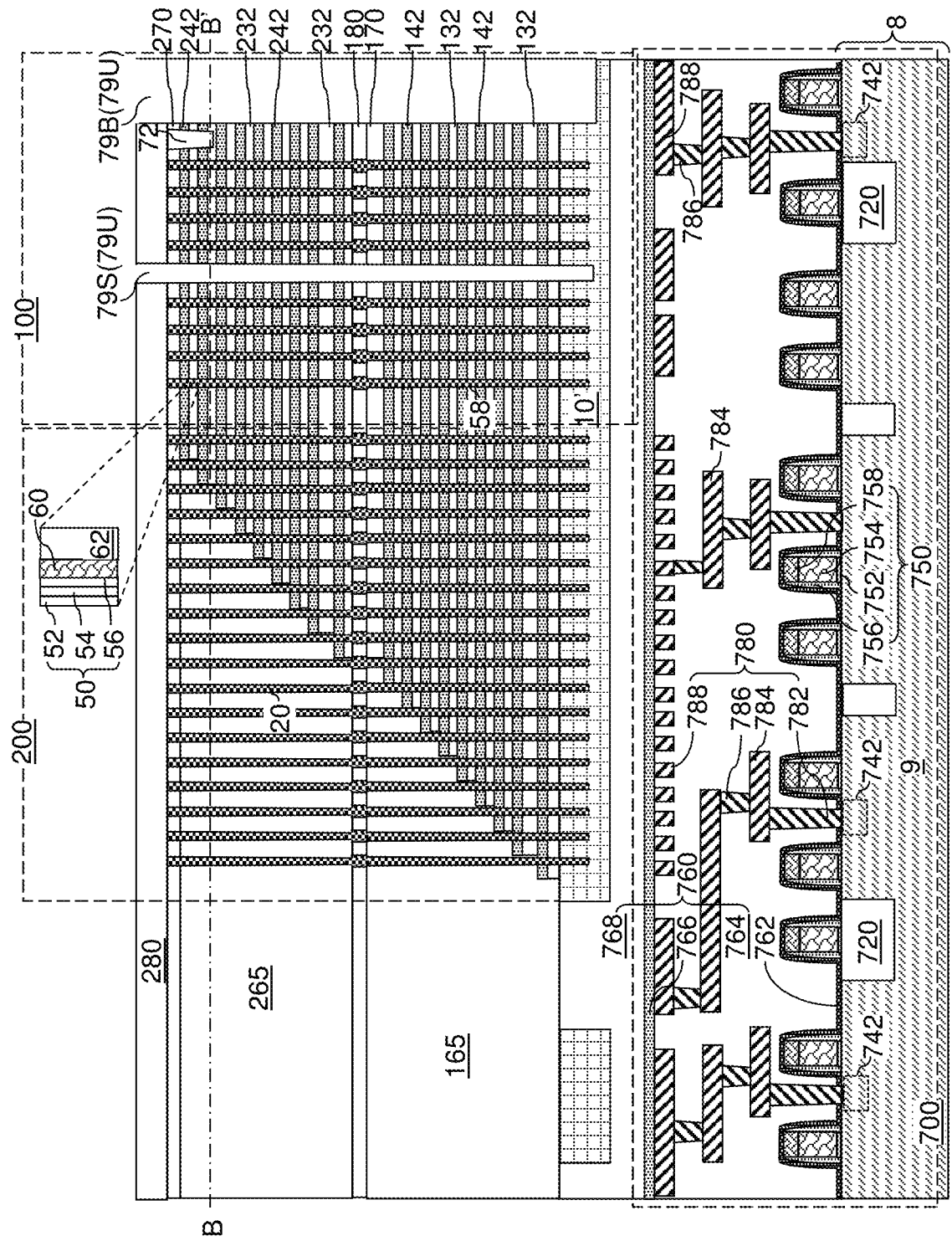
FIG. 11A is a vertical cross-sectional view of the exemplary structure after formation of laterally-undulating backside trenches according to an embodiment of the present disclosure.
Figure 11B:
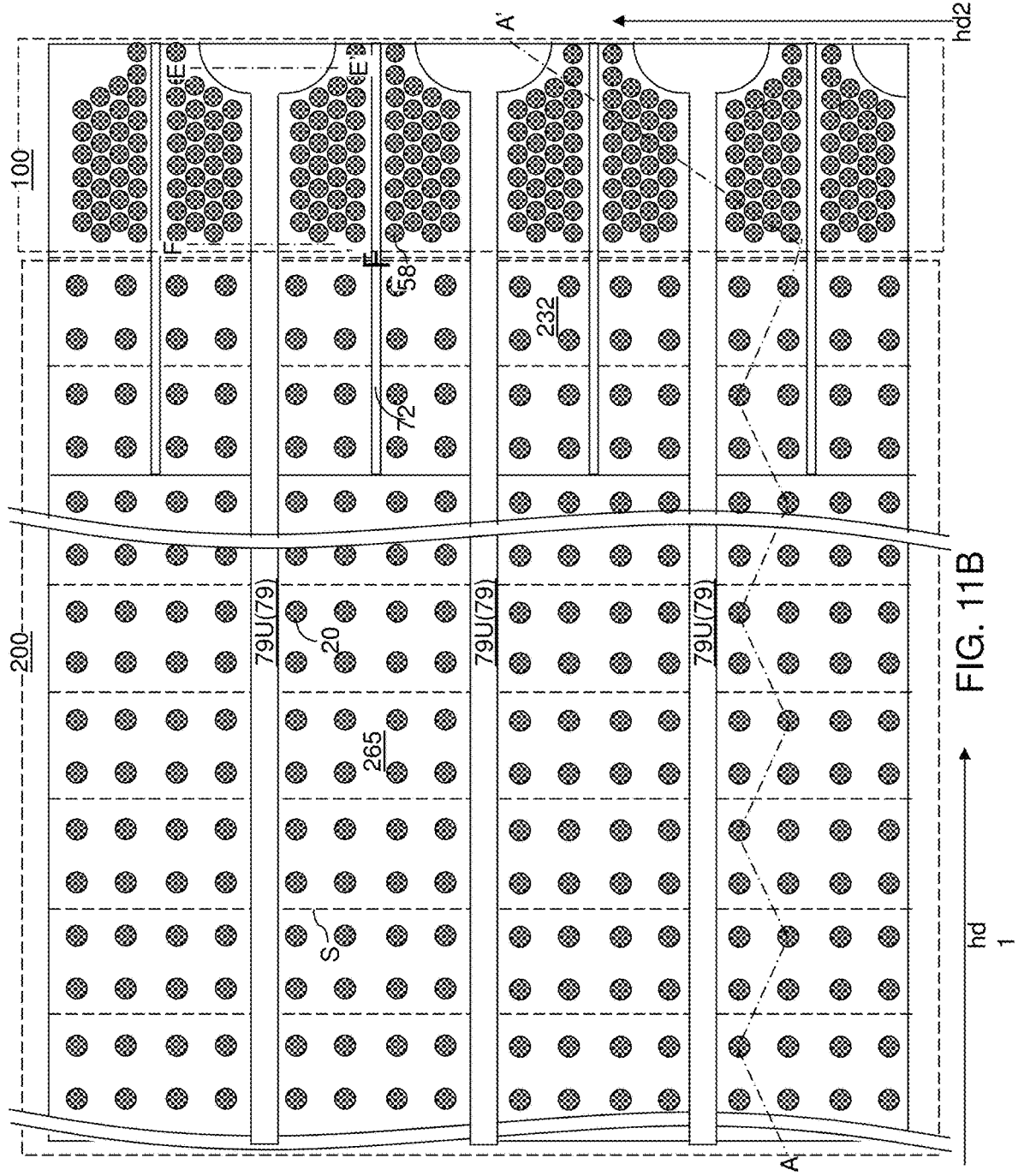
FIG. 11B is a horizontal cross-sectional view of a first area of the exemplary structure along the horizontal plane B-B' of FIG. 11A. The hinged vertical plane A-A' corresponds to the plane of the vertical cross-sectional view of FIG. 11A.
Figure 11C:
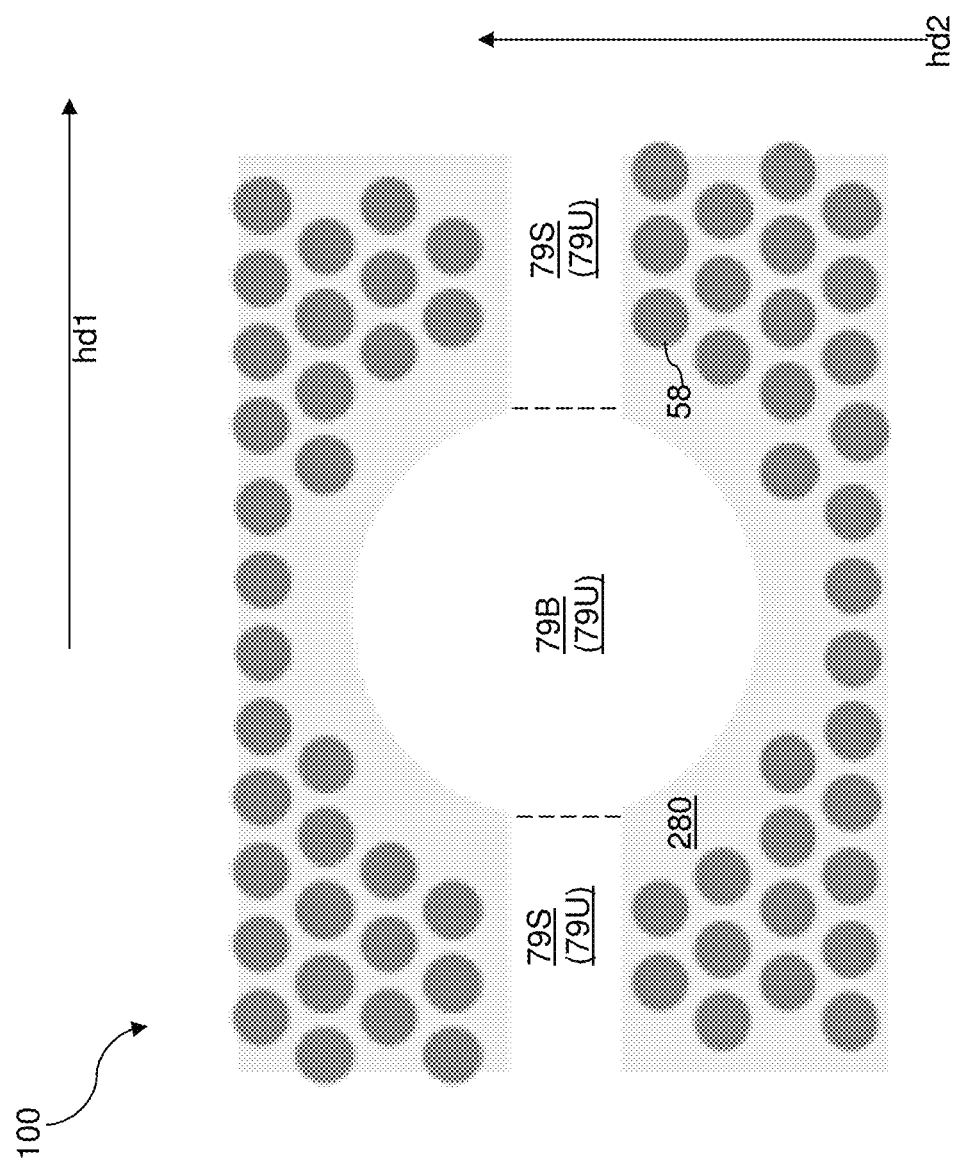
FIG. 11C is a magnified horizontal cross-sectional view of a memory array region along the horizontal plane B-B' of FIG. 11A.

A photoresist layer (not shown) may be applied over the first contact level dielectric layer 280, and may be lithographically patterned to form openings within areas in which memory opening fill structures 58 and support pillar structures (20, 120) are not present. The openings in the photoresist layer may include elongated openings that laterally extend along a horizontal direction with a lateral width modulation and discrete openings. A subset of the elongated openings may laterally extend, for example, along the first horizontal direction hd1 with bulging portions in areas in which memory opening fill structures 58 are laterally spaced apart in the memory array region 100 (for example, as illustrated in FIG. 11C) and/or in areas in which the support pillar structures (20, 120) are laterally spaced apart in the contact tab region 400. Optionally, another subset of the elongated openings may laterally extend along a respective horizontal direction with a respective uniform width, i.e., without any bulging region. Further, the openings in the photoresist layer may include discrete openings that are formed in the peripheral region 300. The discrete openings in the photoresist layer may have a circular or elliptical horizontal cross-sectional shape, and may overlie the retro-stepped dielectric material portions (165, 265).

Figure 11D:
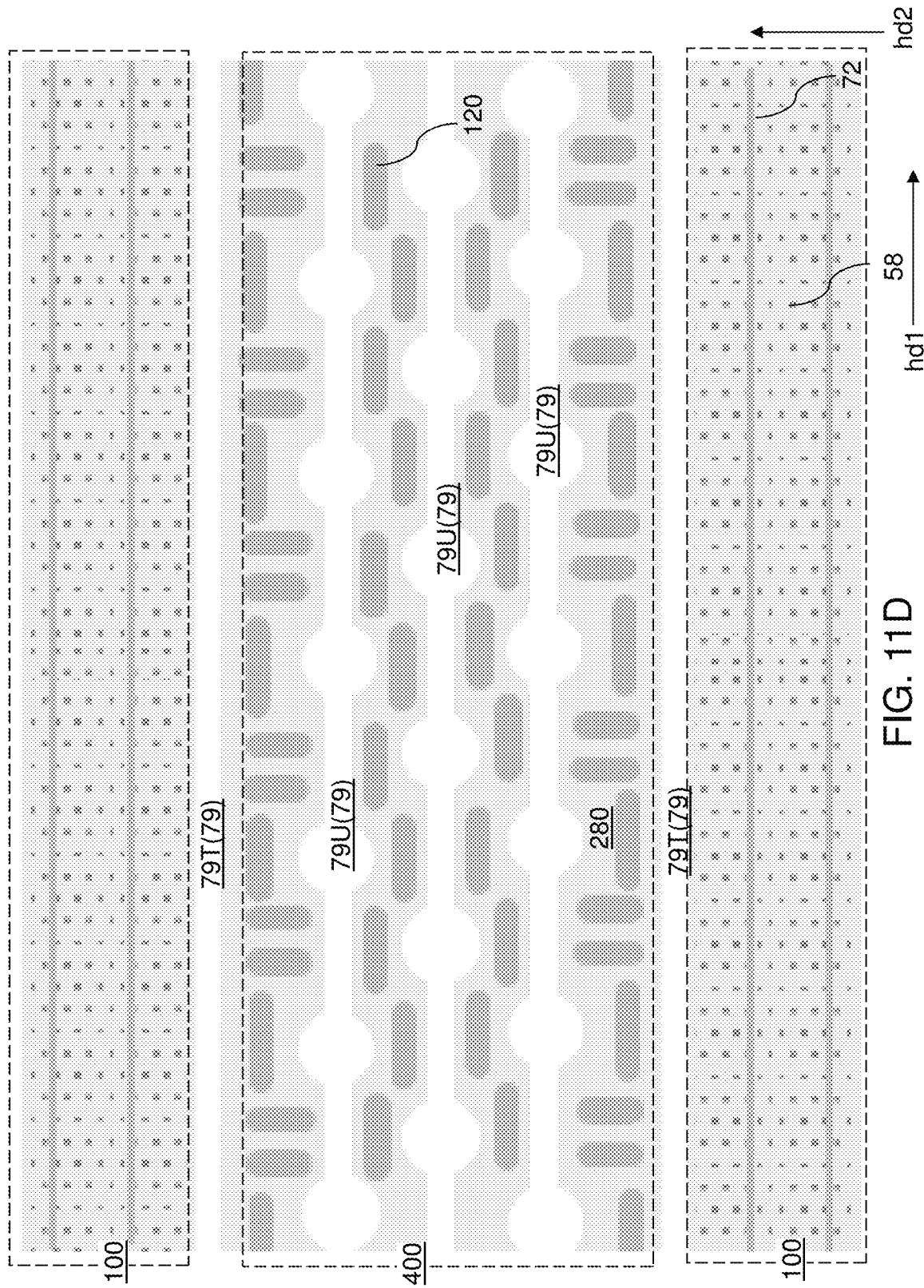
FIG. 11D is a top-down view of a second area of the exemplary structure that includes a via connection region and a portion of a memory array region at the processing steps of FIGS. 10A-10C.
Figure 11G:
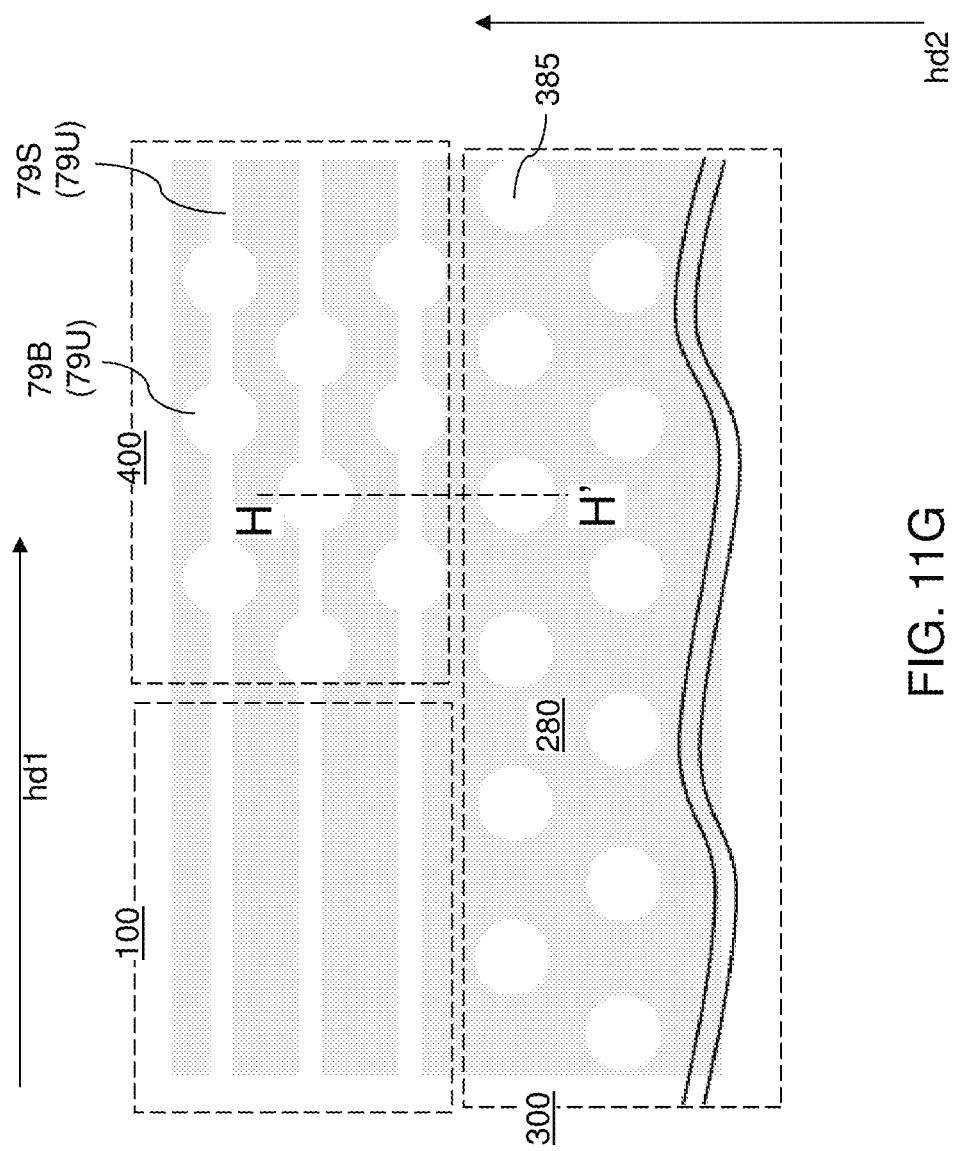
FIG. 11G is a top-down view of a third area of the exemplary structure that include a portion of a memory array region, a portion of a via connection region, and a peripheral connection region at the processing steps of FIGS. 11A-11F.
Figure 11H:
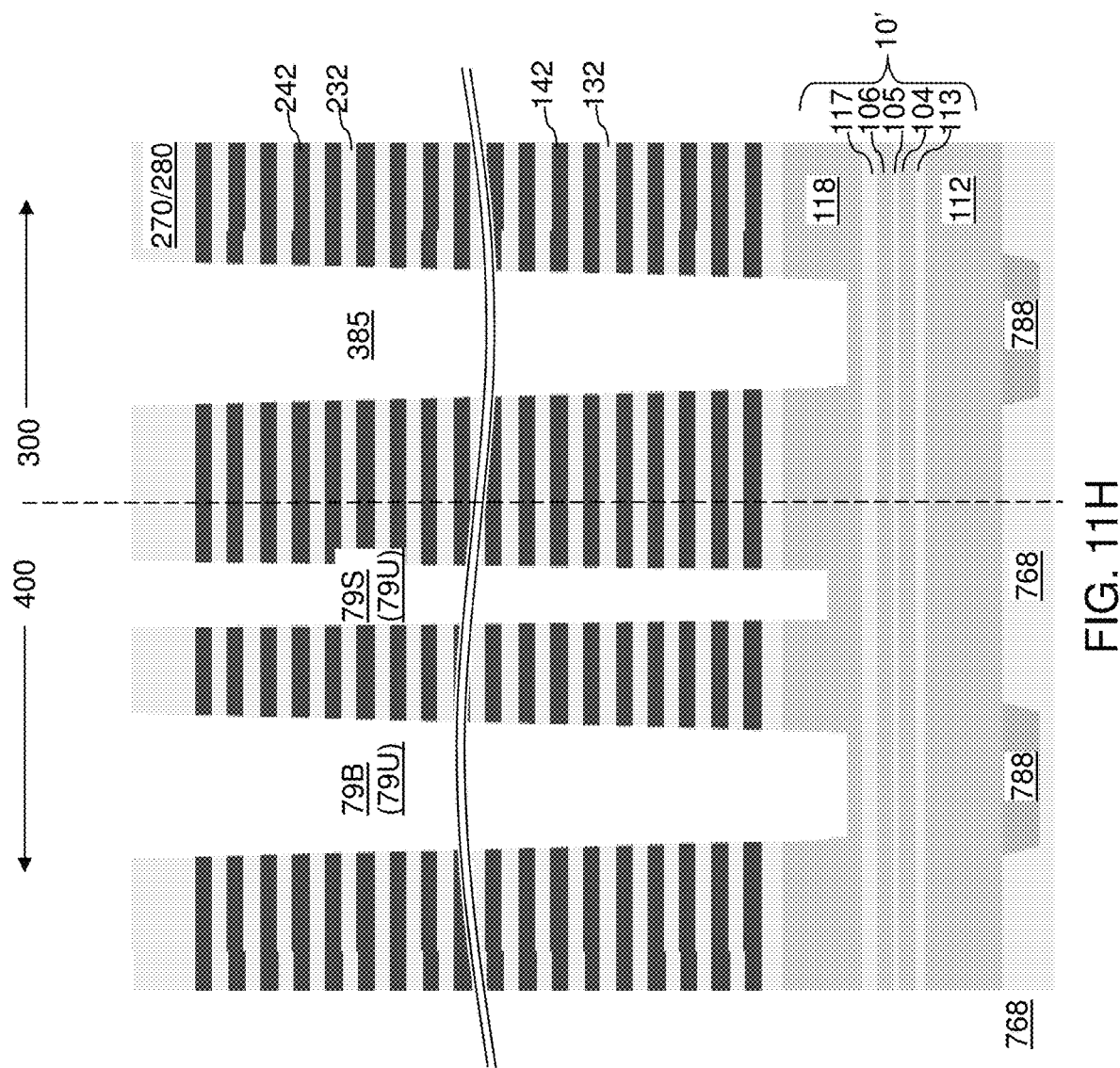
FIG. 11H is a vertical cross-sectional view of the exemplary structure along the vertical plane H-H' of FIG. 11G.
Figure 12C:
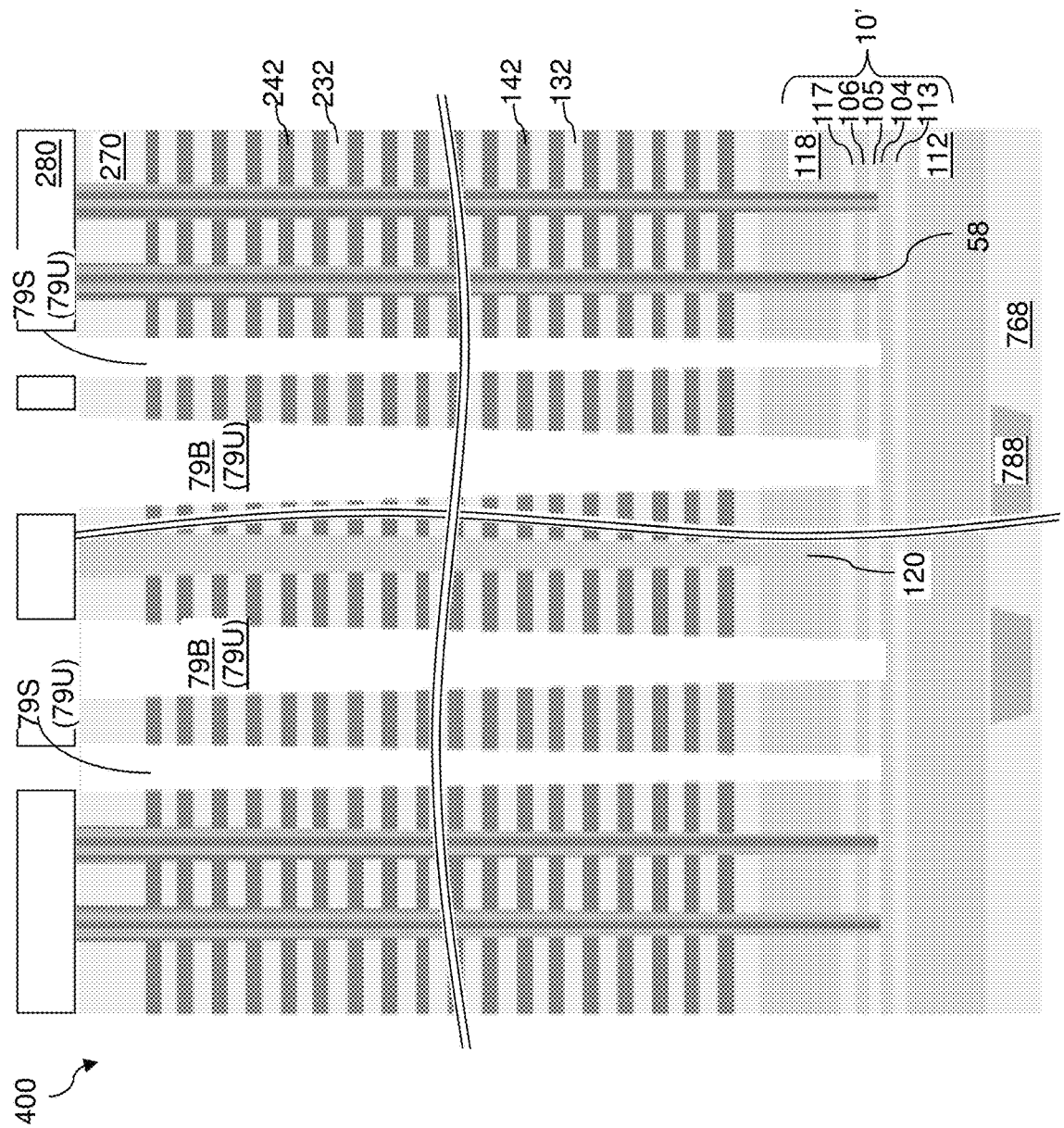
FIG. 12C is a vertical cross-sectional view of the exemplary structure at the processing steps of FIGS. 12A and 12B along a vertical cross-sectional plane that corresponds to the vertical cross-sectional plane of FIG. 10G.
Figure 12D:
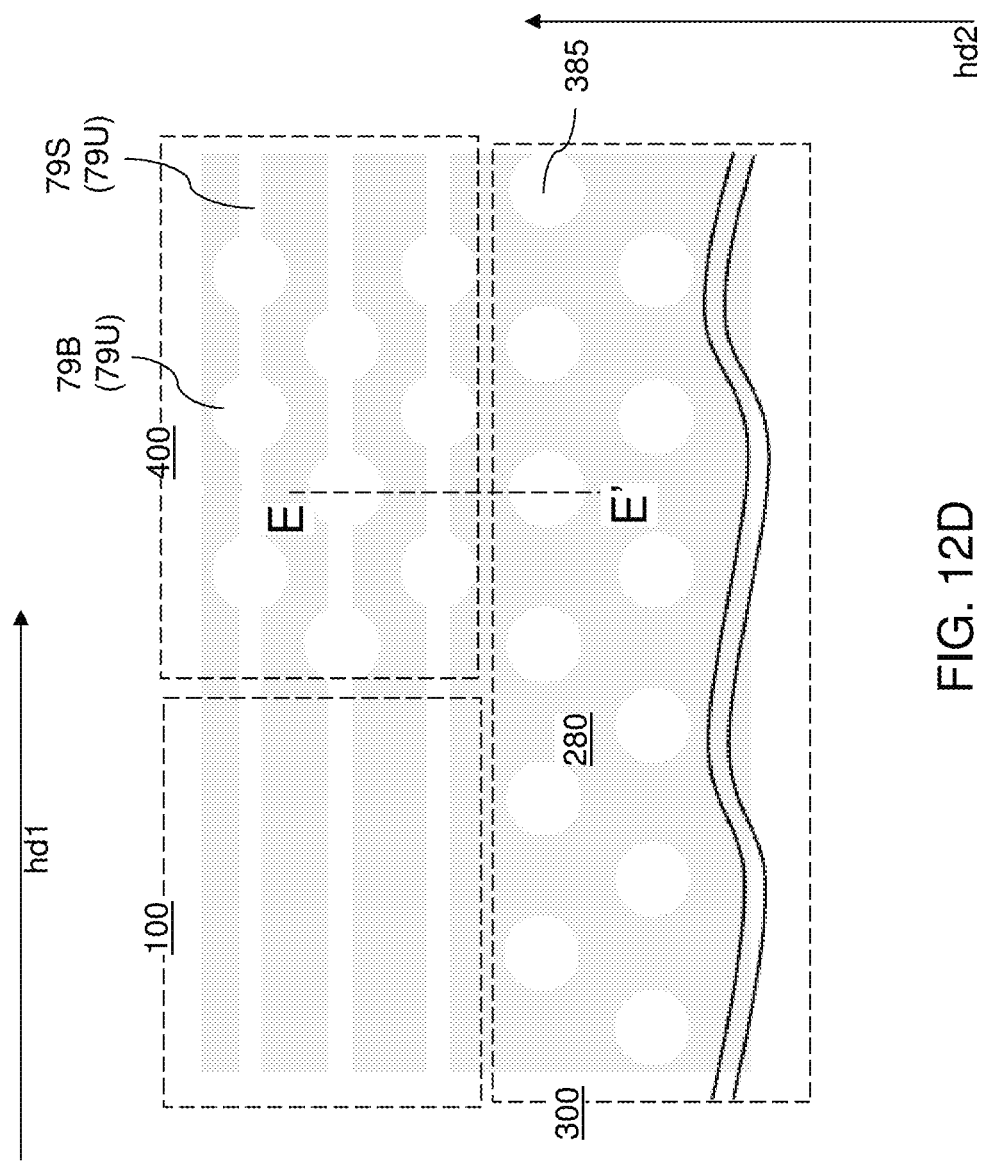
FIG. 12D is a top-down view of an area of the exemplary structure that corresponds to the third area of FIG. 11G at the processing steps of FIGS. 12A-12C.
Figure 12E:
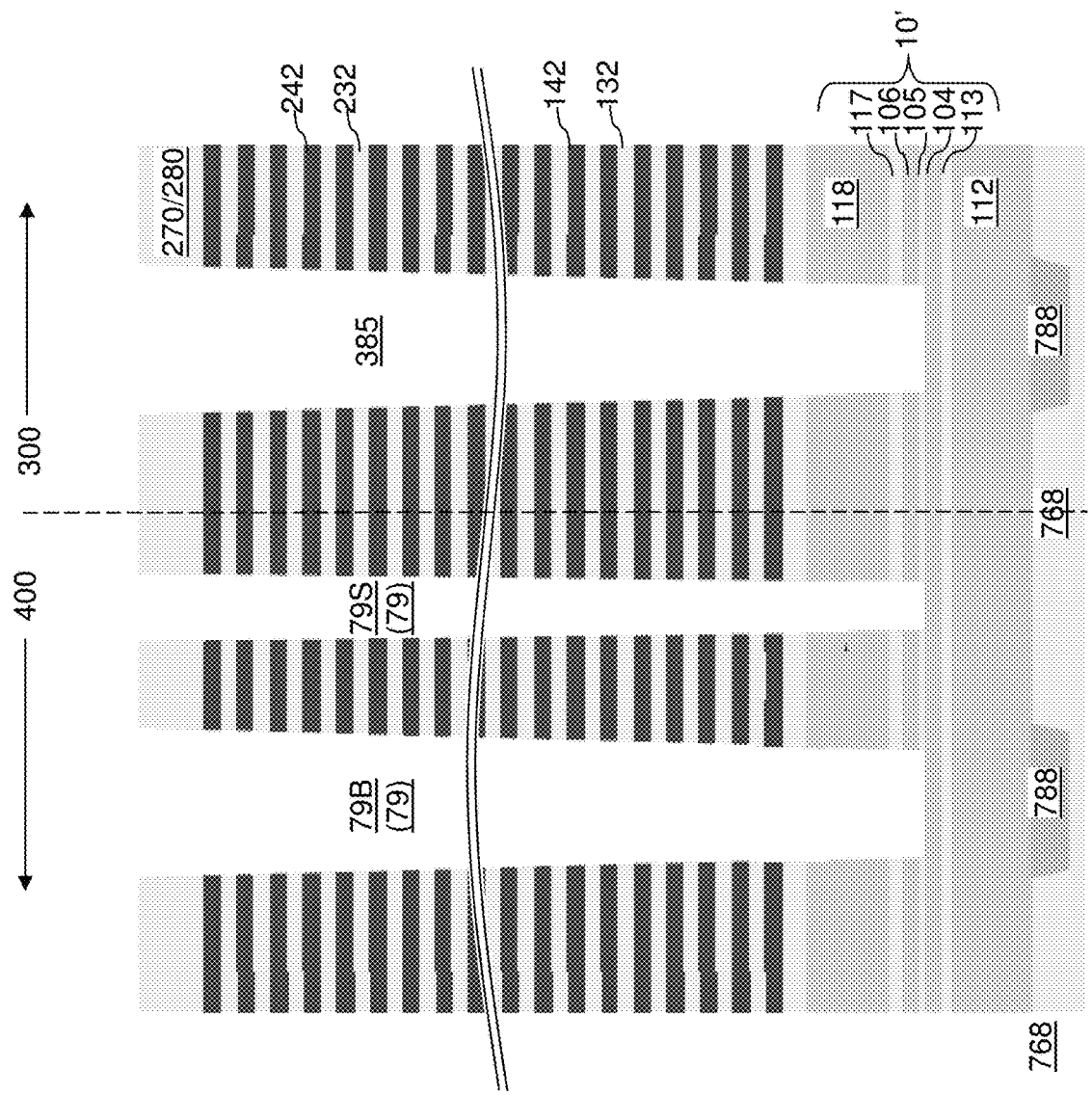
FIG. 12E is a vertical cross-sectional view of the exemplary structure of FIGS. 12A-12D along a vertical plane that corresponds to the vertical cross-sectional view of FIG. 11H.

An anisotropic etch process is performed to transfer the pattern of the openings through the vertically alternating sequence of insulating layers (132, 232) and sacrificial material layers (142, 242) and through the retro-stepped dielectric material portions (165, 265) and into the in-process source-level material layers 10'. The pattern of the elongated openings may be transferred through the vertically alternating sequence {(132, 142), (232, 242)} and the retro-stepped dielectric material portions (165, 265) to form backside trenches 79. The pattern of the discrete openings may be transferred through the vertically alternating sequence {(132, 142), (232, 242)} (as illustrated in FIG. 11H), an through the retro-stepped dielectric material portions (165, 265) and/or through other isolated dielectric material portions to form discrete via cavities 385.

The backside trenches 79 may include laterally-undulating backside trenches 79U that laterally extend along a first horizontal direction hd1 through the vertically alternating sequence {(132, 142), (232, 242)}. Each laterally-undulating backside trench 79U includes straight trench segments 79S at least one bulging trench segment 79B that has a variable trench width. In one embodiment, each of the laterally-undulating backside trenches comprises a laterally alternating sequence of straight trench segments 79S having a uniform trench width and bulging trench segments 79B having a variable trench width that is greater than the uniform trench width. Optionally, the backside trenches 79 may include straight trenches 79T having a uniform width throughout. The straight trenches 79T may extend through the memory array region 100 and/or through the staircase region 200 and/or through the contact tab regions 400.

The vertically alternating sequence of the insulating layers (132, 232) and the sacrificial material layers (142, 242) may be divided into multiple discrete remaining portions by the backside trenches 79. Each set of remaining material portions from the vertically alternating sequence of the insulating layers (132, 232) and the sacrificial material layers (142, 242) constitutes an alternating stack of insulating layers (132, 232) and the sacrificial material layers (142, 242). Each insulating layer (132, 232) within an alternating stack {(132, 232), (142, 242)} is a patterned remaining portion of a respective insulating layer (132, 232) of the vertically alternating sequence, and each sacrificial material layer (142, 242) within an alternating stack {(132, 232), (142, 242)} is a patterned remaining portion of a respective sacrificial material layer (142, 242). Generally, remaining portions of the vertically alternating sequence comprise a plurality of alternating stacks of insulating layers (132, 232) and sacrificial material layers (142, 242). In one embodiment, the discrete via cavities 385 may be formed in the peripheral region 300. In one embodiment, the peripheral region 300 may be free of laterally-undulating backside trenches 79.

Multiple alternating stacks {(132, 232), (142, 242)} may be formed. In one embodiment, a subset of the laterally-undulating line trenches 79 is formed within the memory array region 100 between a first alternating stack of first insulating layers (132, 232) and first sacrificial material layers (142, 242) and a second alternating stack of second insulating layers (132, 232) and second sacrificial material layers (142, 242). The first insulating layers and the second insulating layers may be subsets of the insulating layers (132, 232), and the first sacrificial material layers and the second sacrificial material layers may be subsets of the sacrificial material layers (142, 242). Subsets of the memory stack structures 55 may vertically extend through the first alternating stack and the second alternating stack. At least one, and/or each, of the multiple alternating stacks {(132, 232), (142, 242)} may laterally extend into a contact tab region 400 and/or into a staircase region 200. Further, a portion of an alternating stack {(132, 232), (142, 242)} may protrude into an edge portion of the peripheral region 300. The support pillar structures (20, 120) may vertically extend through a respective one of the multiple alternating stacks {(132, 232), (142, 242)}. In one embodiment, at least one contact tab region 400 does not include any of the memory stack structures 55 therein. In one embodiment, a contact tab region 400 may be laterally spaced from a memory array region 100 in which the memory stack structures 55 extend through an additional one of the alternating stacks by a straight trench 79T that extends along the first horizontal direction hd1 with a uniform width throughout, for example, as illustrated in FIG. 11D.

The sidewalls of each backside trench 79 may be vertical and planar, may be tapered and planar, or may have a non-linear vertical profile such as a bowing profile illustrated in FIGS. 11E and 11F. In such embodiments, the degree of bowing of the sidewalls of the backside trenches 79 may be dependent on the local width of the backside trenches 79. In one embodiment, the etch chemistry of the anisotropic etch process that forms the backside trenches 79 may be selected such that the anisotropic etch process etches the materials of the insulating layers (132, 232) and the sacrificial material layers (142, 242) selective to a semiconductor material such as polysilicon. The anisotropic etch process may collaterally etch into a topmost semiconductor layer in the in-process source-level material layers 10' such as an optional source-select-level conductive layer 118 or an upper source-level sacrificial layer 106.

According to an embodiment of the present disclosure, the bulging trench segments 79B and the straight trench segments 79S may be formed with a depth differential due to different aspect ratios between the bulging trench segments 79B and the straight trench segments 79S. In this case, the chemistry of the anisotropic etch process may be selected to be sensitive to the aspect ratio of the backside trenches 79. Materials in segments of the backside trenches 79 with a low height-to-width ratio (such as the bulging trench segments 79B) are etched at a higher etch rate than materials in segments of the backside trenches 79 with a high height-to-width ratio (such as the bulging trench segments 79S). For example, the bulging trench segments 79B of the laterally-undulating backside trenches 79U may extend through more than 50% (such as 70%-100%) of the thickness of the source-select-level conductive layer 118, and the straight trench segments 79S of the laterally-undulating backside trenches 79U may extend through less than 20% (such as less than 10%) of the thickness of the source-select-level conductive layer 118 as illustrated in FIGS. 11E and 11F. In one embodiment, a lateral dimension (such as a diameter of a major axis) of each discrete via cavity 385 may be selected to be comparable to the maximum lateral dimension of the bulging trench segments 79B along a widthwise direction (such as the second horizontal direction hd2). In this case, the depth of each discrete via cavity 385 may be comparable to the depth of the bulging trench segments 79B of the laterally-undulating backside trenches 79U. In one embodiment, a subset of the landing-pad-level metal line structures 788 may be located underneath a center portion of a respective one of the bulging trench segment 79B and the discrete as illustrated in FIGS. 11E and 11H. FIG. 11H illustrates an embodiment in which Referring to FIGS. 12A-12E and 13A, an anisotropic etch process may be performed to extend the backside trenches 79 and the discrete via cavities 385 to the same depth. In one embodiment, the upper source-level insulating liner 117, the upper source-level sacrificial layer 106, and the etch stop sacrificial liner 105 may be sequentially used as etch stop structures. For example, the upper source-level insulating liner 117 may be used as an etch stop structure during vertical extension of the backside trenches 79 and the discrete via cavities 385 through the source-select-level conductive layer 118, the upper source-level sacrificial layer 106 may be used as an etch strop structure during vertical extension of the backside trenches 79 and the discrete via cavities 385 through the upper source-level insulating liner 117, and the etch stop sacrificial liner 105 may be used as an etch strop structure during vertical extension of the backside trenches 79 and the discrete via cavities 385 through the upper source-level sacrificial layer 106. A surface of the lower source-level sacrificial layer 104 may be physically exposed at the bottom of each backside trench 79 and at the bottom of each discrete via cavity 385 that extends through a respective alternating stack {(132, 232), (142, 242)}. Optionally, additional discrete via cavities 385 extending through the retro-stepped dielectric material portions (165, 265) may be formed in the peripheral region 300.

Figure 13A:
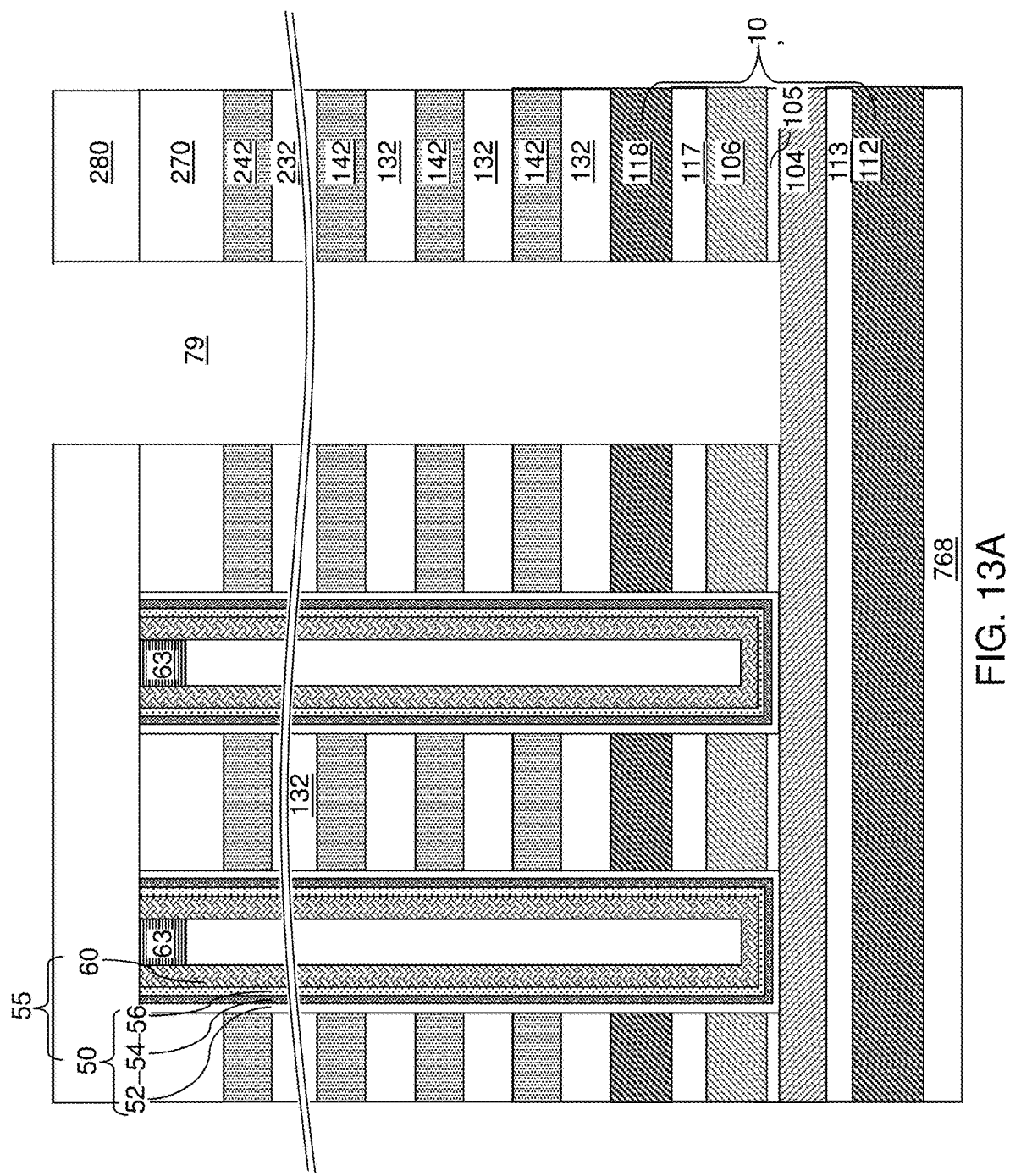
FIGS. 13A-13D illustrate sequential vertical cross-sectional views of memory opening fill structures and a backside trench during formation of source-level material layers according to an embodiment of the present disclosure.
Figure 13B:
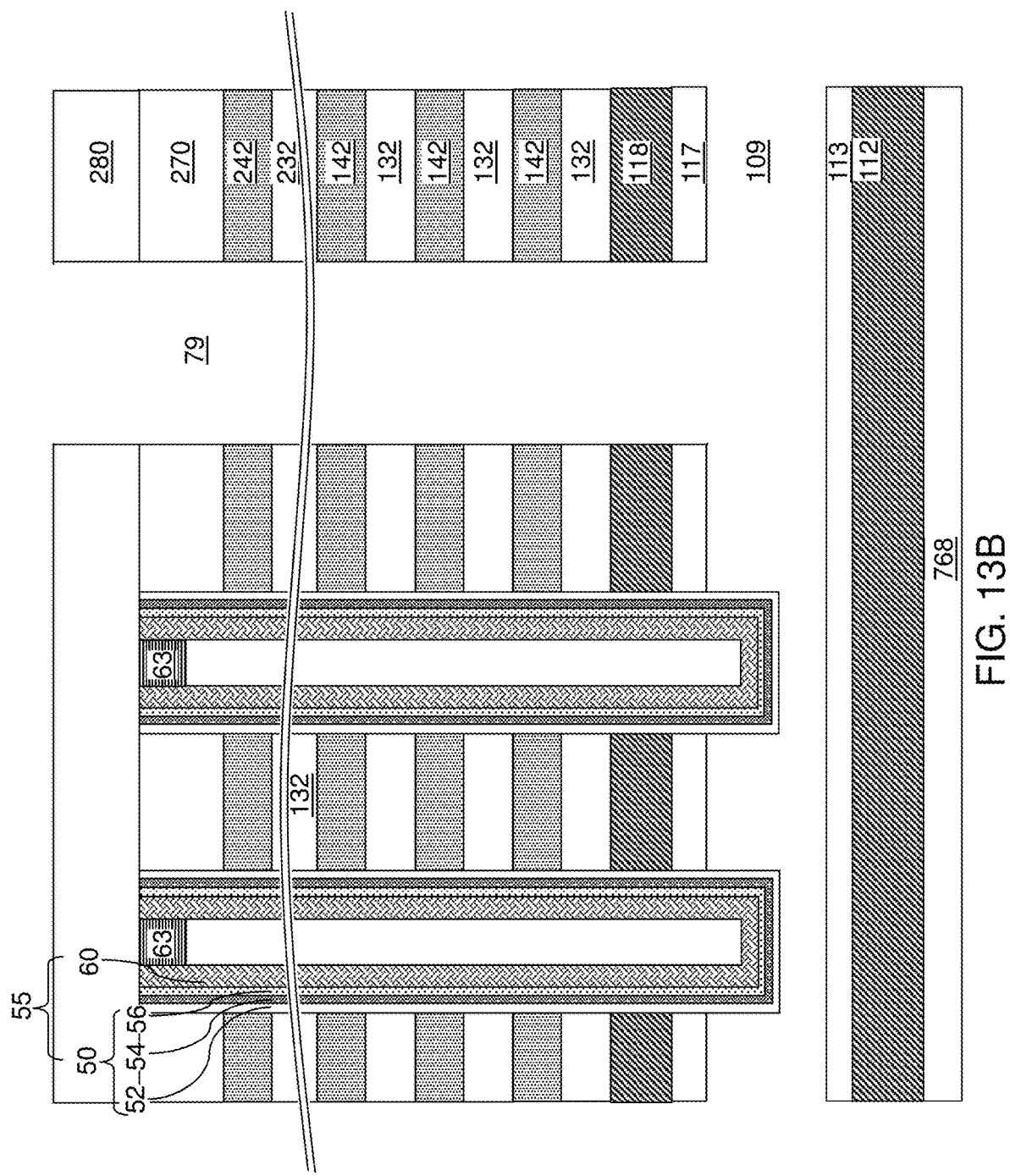

Referring to FIG. 13B, an etchant that etches the materials of the lower source-level sacrificial layer 104 and the upper source-level sacrificial layer 106 selective to the materials of the alternating stacks {(132, 232), (142, 242)}, the first and second insulating cap layers (170, 270), the first contact level dielectric layer 280, the upper source-level insulating liner 117, the lower source-level insulating liner 113, and the optional source-select-level conductive layer 118 may be introduced into the backside trenches in an isotropic etch process. For example, if the lower source-level sacrificial layer 104 and the upper source-level sacrificial layer 106 include undoped amorphous silicon or an undoped amorphous silicon-germanium alloy, and if the upper source-level insulating liner 117 and the lower source-level insulating liner 113 include silicon oxide, a wet etch process using hot trimethyl-2 hydroxyethyl ammonium hydroxide ("hot TMY") or tetramethyl ammonium hydroxide (TMAH) may be used to remove the lower source-level sacrificial layer 104 and the upper source-level sacrificial layer 106 selective to the alternating stacks {(132, 232), (142, 242)}, the upper source-level insulating liner 117, and the lower source-level insulating liner 113. The etch stop sacrificial liner 105 may be thin enough to be collaterally removed during removal of the upper source-level insulating liner 117 and the lower source-level insulating liner 113. A source cavity 109 is formed in the volume from which the upper source-level insulating liner 117, the etch stop sacrificial liner 105, and the lower source-level insulating liner 113 are removed.

Wet etch chemicals such as hot TMY and TMAH are selective to doped semiconductor materials such as the p-doped semiconductor material and/or the n-doped semiconductor material of the source-select-level conductive layer 118. Thus, use of selective wet etch chemicals such as hot TMY and TMAH for the wet etch process that forms the source cavity 109 provides a large process window for formation of the source cavity 109. A bottom portion of each of the memory opening fill structures 58 is physically exposed to the source cavity 109. Specifically, each of the memory opening fill structures 58 includes a sidewall and that are physically exposed to the source cavity 109. In case the source-select-level conductive layer 118 is omitted, any isotropic etchant may be used that etches the semiconductor materials of the lower source-level sacrificial layer 104 and the upper source-level sacrificial layer 106 selective to the materials of the alternating stacks {(132, 232), (142, 242)}, the upper source-level insulating liner 117, and the lower source-level insulating liner 113.

Figure 13C:
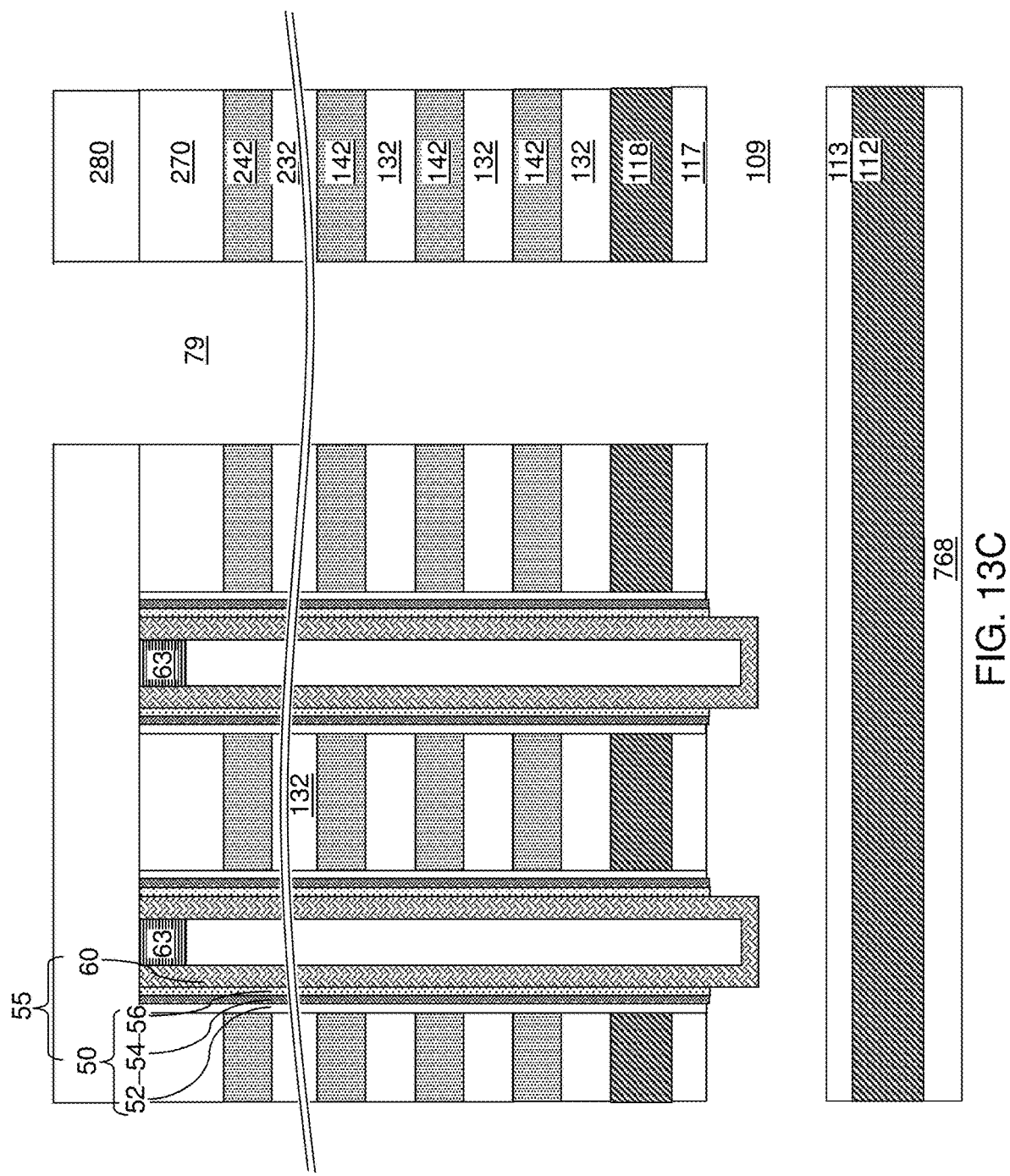

Referring to FIG. 13C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The source cavity 109 may be expanded in volume by removal of the portions of the memory films 50 located at the level of the source cavity 109. The photoresist layer may be removed, for example, by ashing.

Figure 13D:
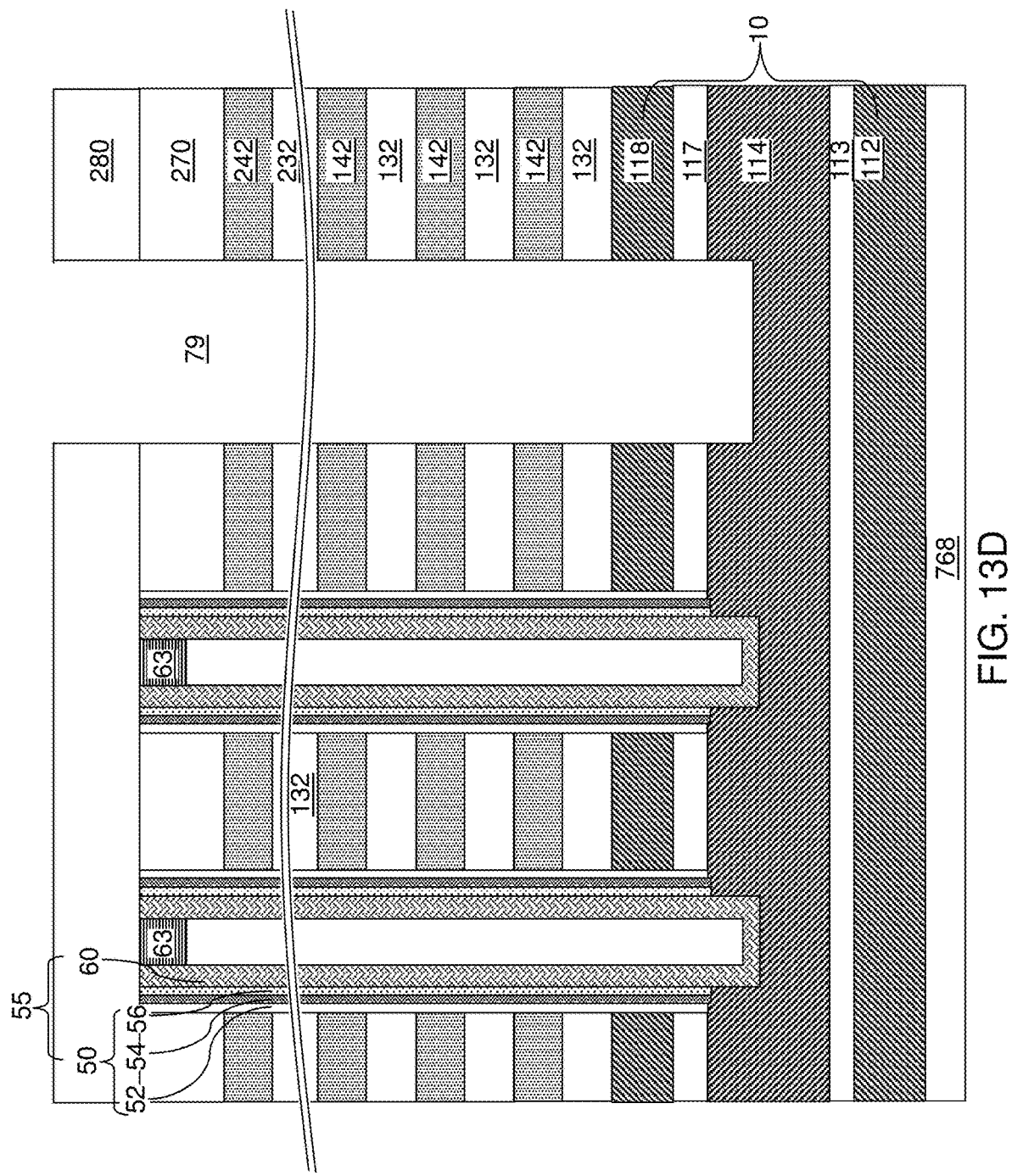
Figure 14A:
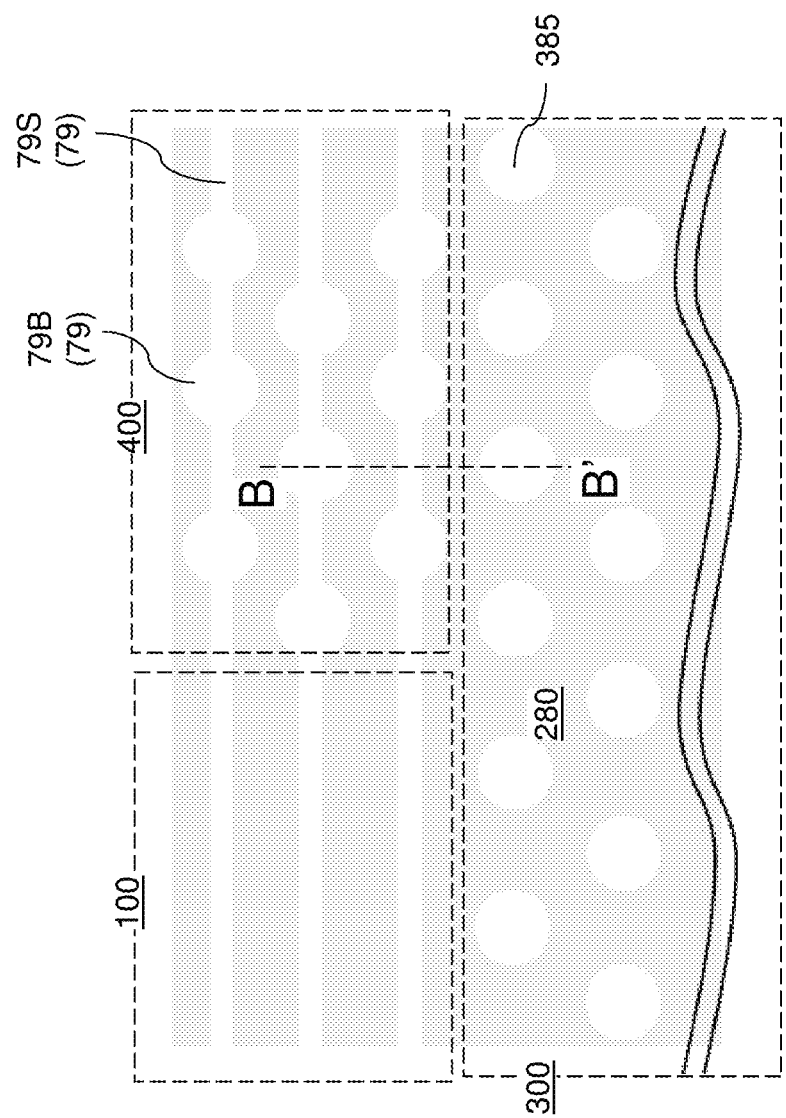
FIG. 14A is a top-down view of an area of the exemplary structure at the processing step of FIG. 13D.
Figure 14B:
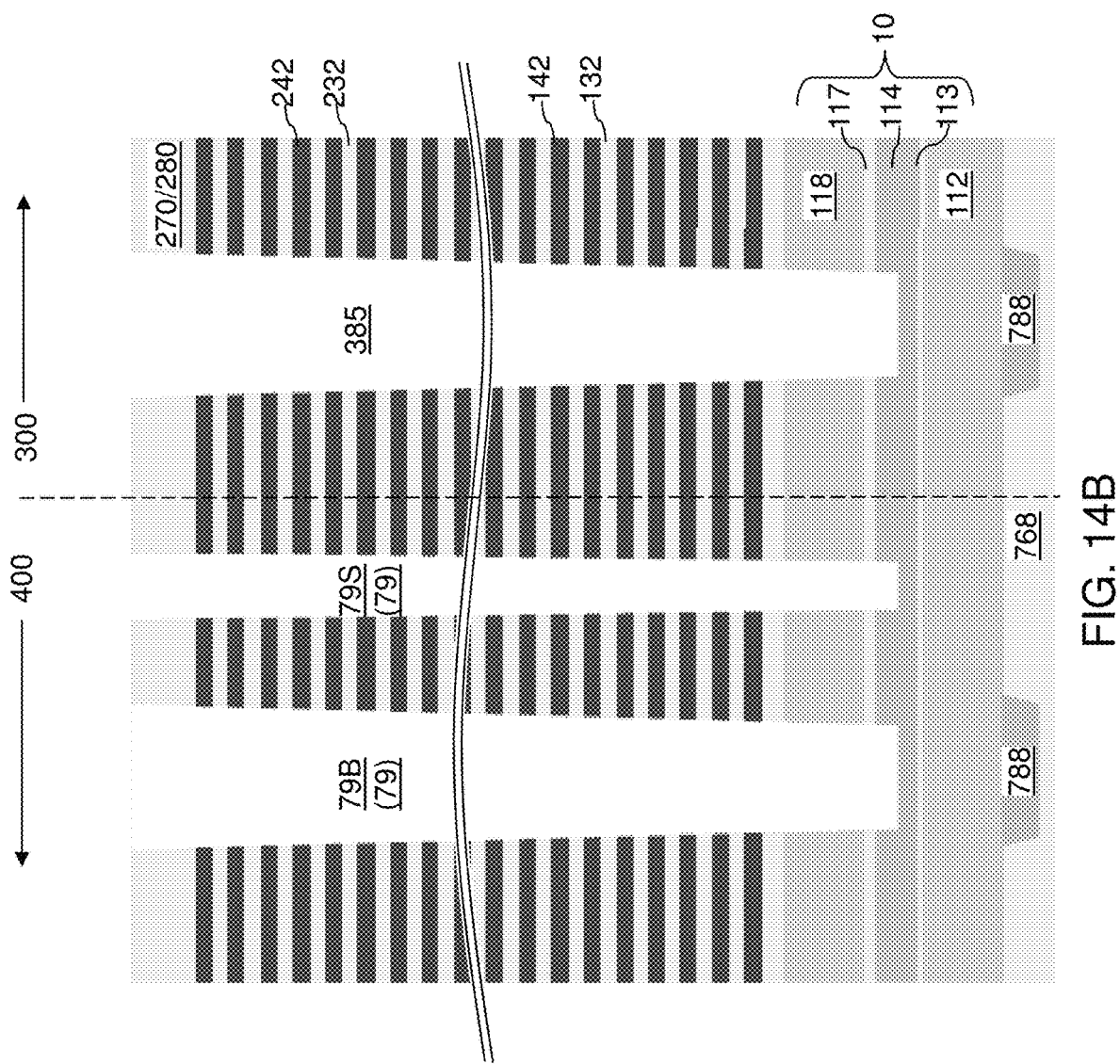
FIG. 14B is a vertical cross-sectional view of the exemplary structure along the vertical cross-sectional plane B-B' of FIG. 14A.

Referring to FIGS. 13D, 14A, and 14B, a semiconductor material having a doping of the second conductivity type may be deposited in the source cavity 109 on the physically exposed semiconductor surfaces of the vertical semiconductor channels 60. In one embodiment, the doped semiconductor material of the second conductivity type may be deposited on the physically exposed semiconductor surfaces of the vertical semiconductor channels 60 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109.

The deposited doped semiconductor material forms a source semiconductor layer 114, which contacts sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source semiconductor layer 114 as initially formed may consist essentially of semiconductor atoms and dopant atoms of the second conductivity type. Alternatively, at least one non-selective doped semiconductor material deposition process may be repeatedly used in combination with etch back processes to form the source semiconductor layer 114. Generally, one or more etch back processes may be optionally used in combination with a plurality of selective or non-selective deposition processes to provide a source semiconductor layer 114 without voids or with reduced voids.

The duration of the selective semiconductor deposition process may be selected such that the source cavity 109 is filled with the source semiconductor layer 114. In one embodiment, the source semiconductor layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layers (104, 106) may be replaced with the source semiconductor layer 114.

The layer stack including the lower source-level semiconductor layer 112, the lower source-level insulating liner 113, the source semiconductor layer 114, the upper source-level insulating liner 117, and the optional source-select-level conductive layer 118 constitutes source-level material layers 10, which replaces the in-process source-level material layers 10'.

Figure 15A:
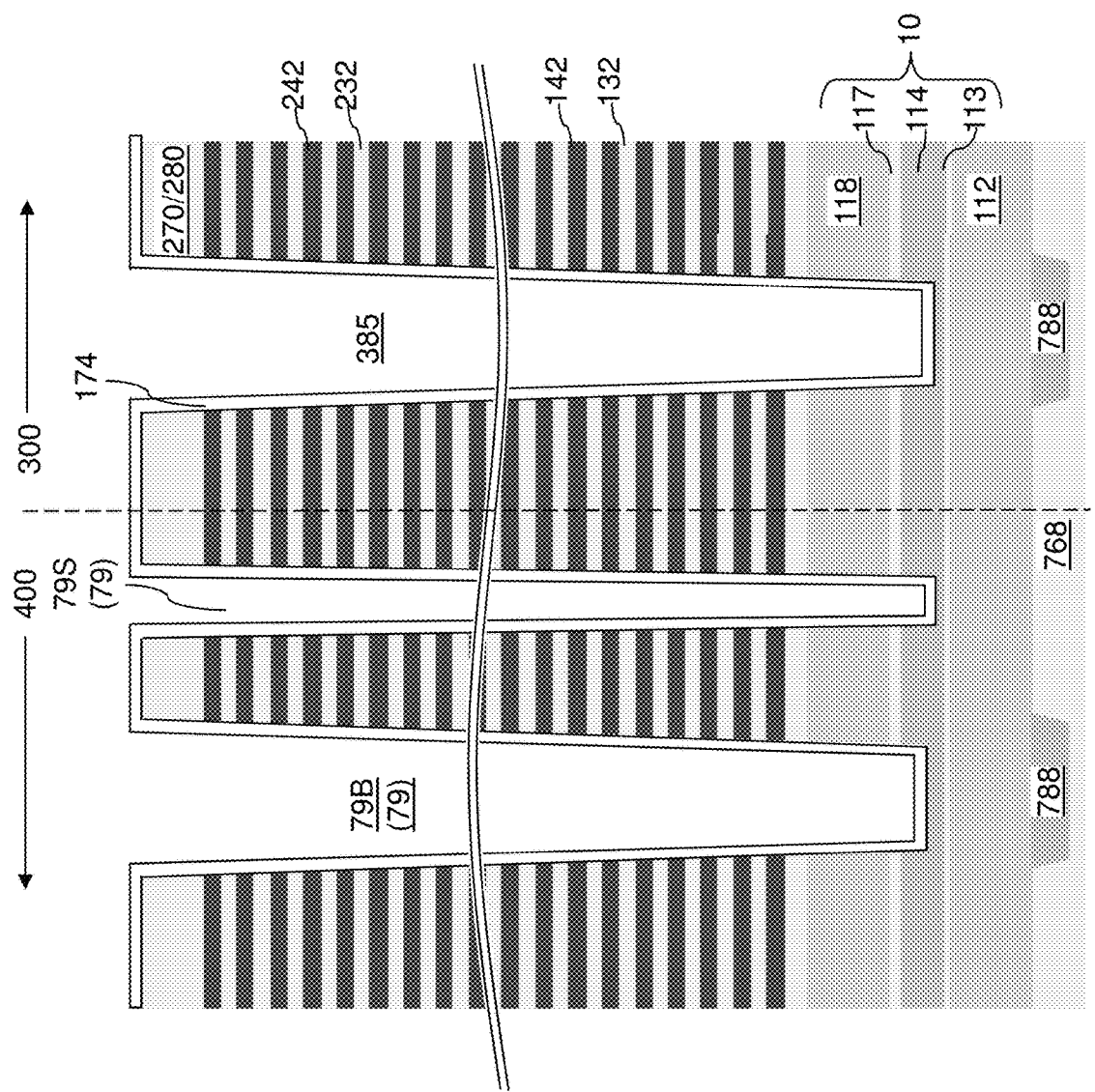

Referring to FIG. 15A, a dielectric liner 174 may be deposited on sidewalls of the backside trenches 79 and the discrete via cavities 385 and over the first contact level dielectric layer 280 by a conformal deposition method. The dielectric liner 174 includes a dielectric material that is different from the materials of the sacrificial material layers (142, 242). For example, the sacrificial material layers (142, 242) may include silicon nitride, and the dielectric liner 174 may include silicon oxide or a dielectric metal oxide such as aluminum oxide. The thickness of the dielectric liner 174 may be in a range from 4 nm to 80 nm, such as from 8 nm to 40 nm, although lesser and greater thicknesses may also be used.

Figure 15B:
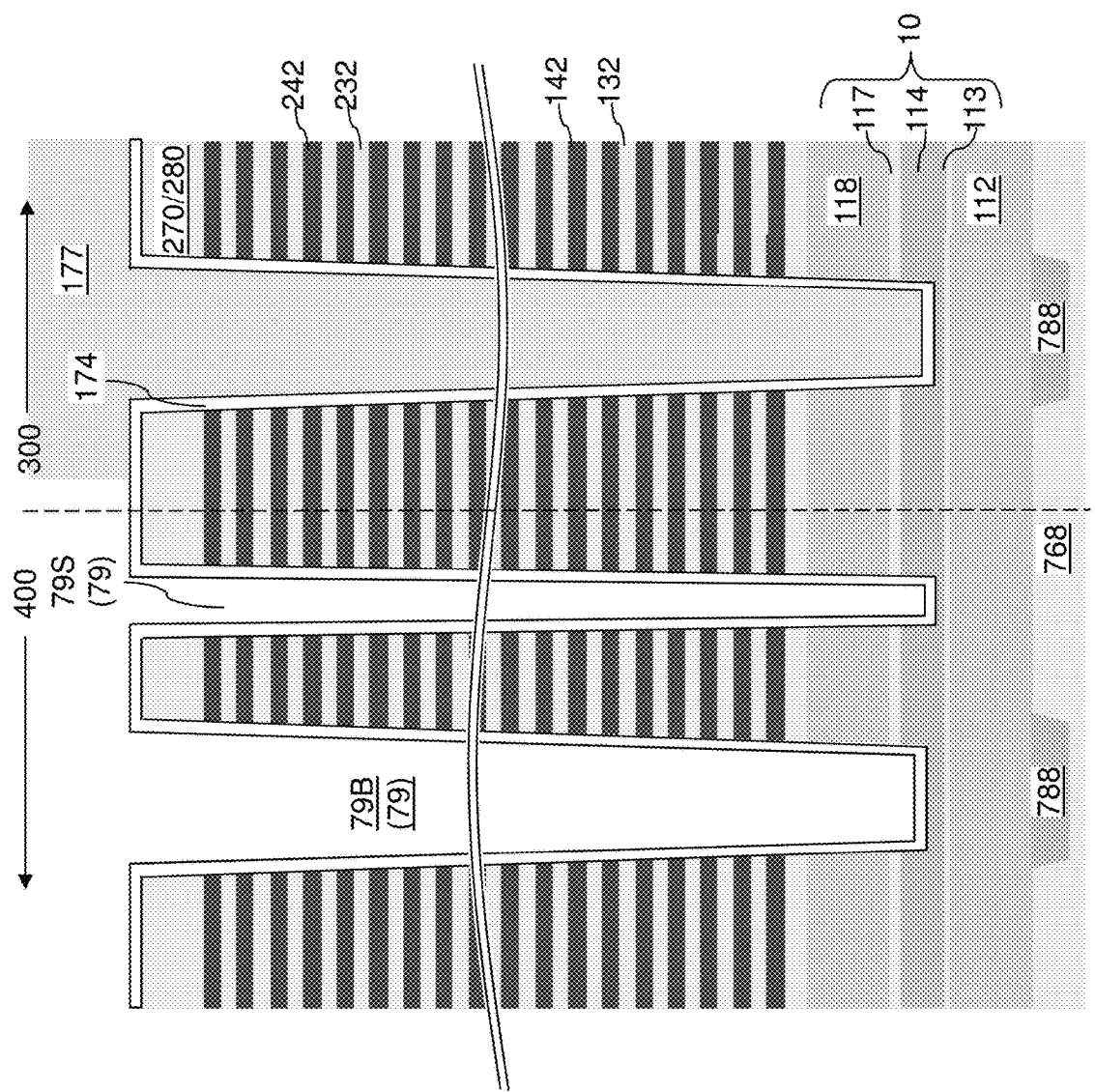

Referring to FIG. 15B, a photoresist layer 177 may be applied over the exemplary structure, and may be lithographically patterned to cover the peripheral region 300 without covering the memory array region 100 or the contact tab regions 400.

Figure 15C:
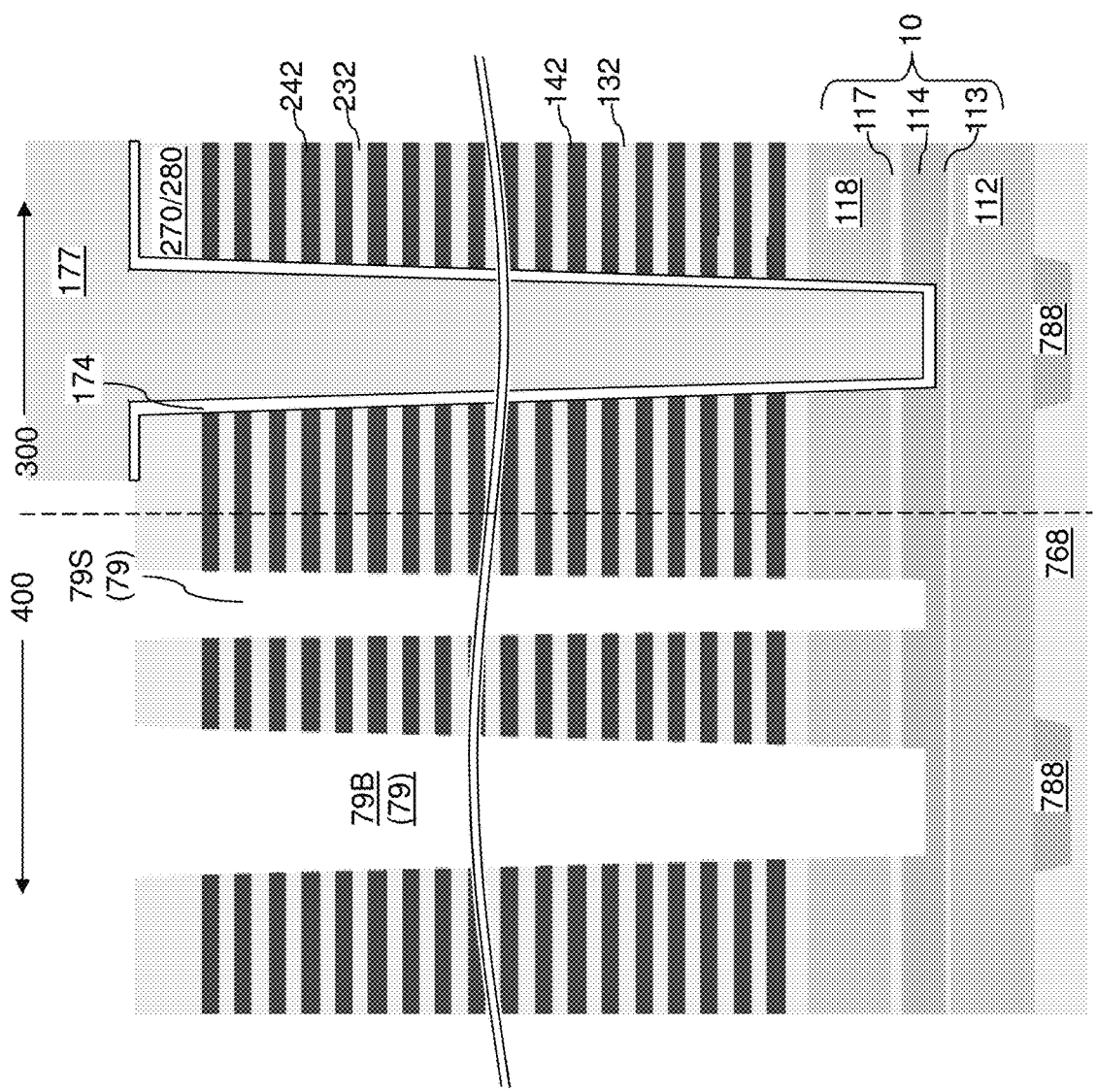
Figure 16A:
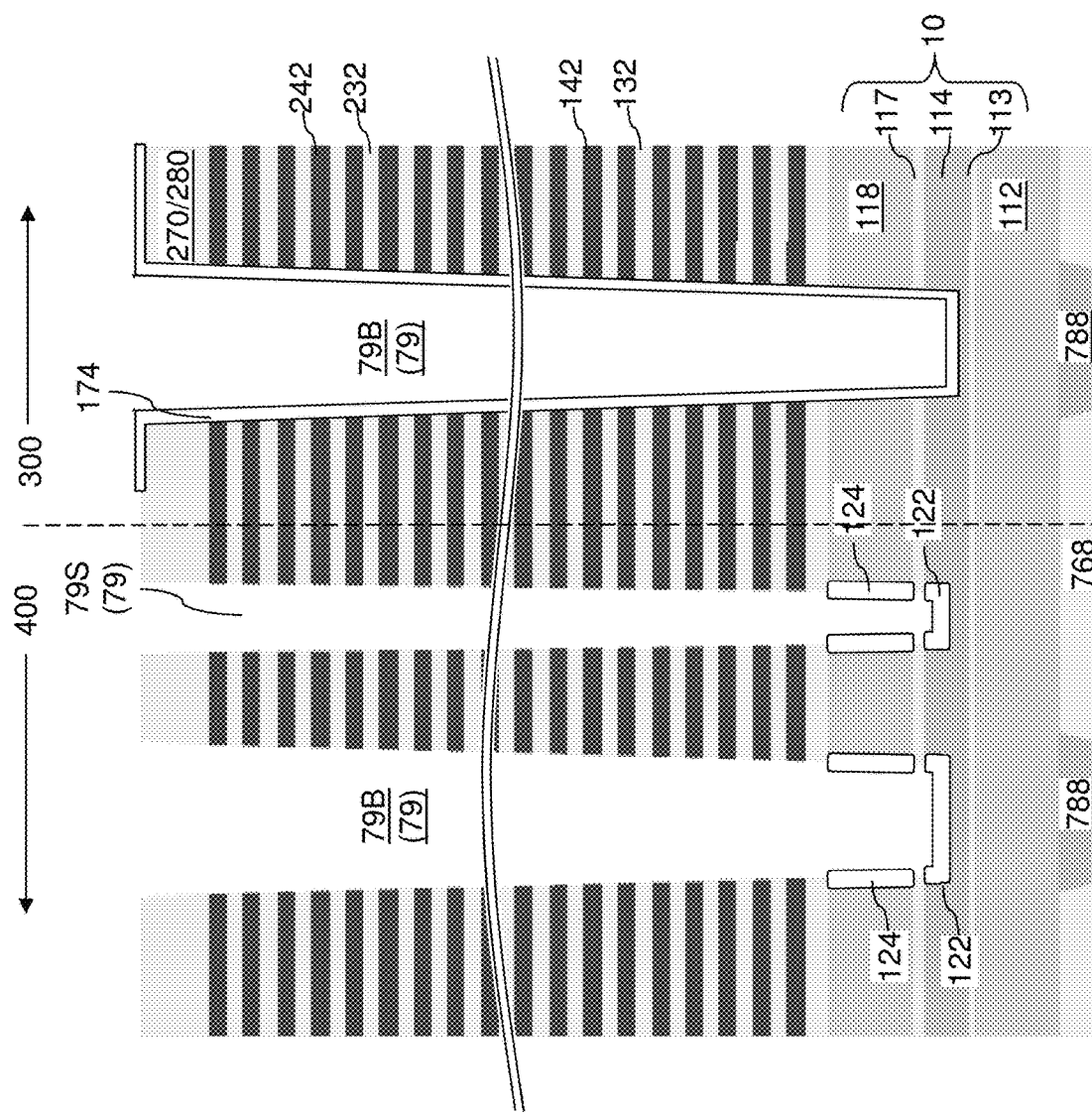
Figure 16D:
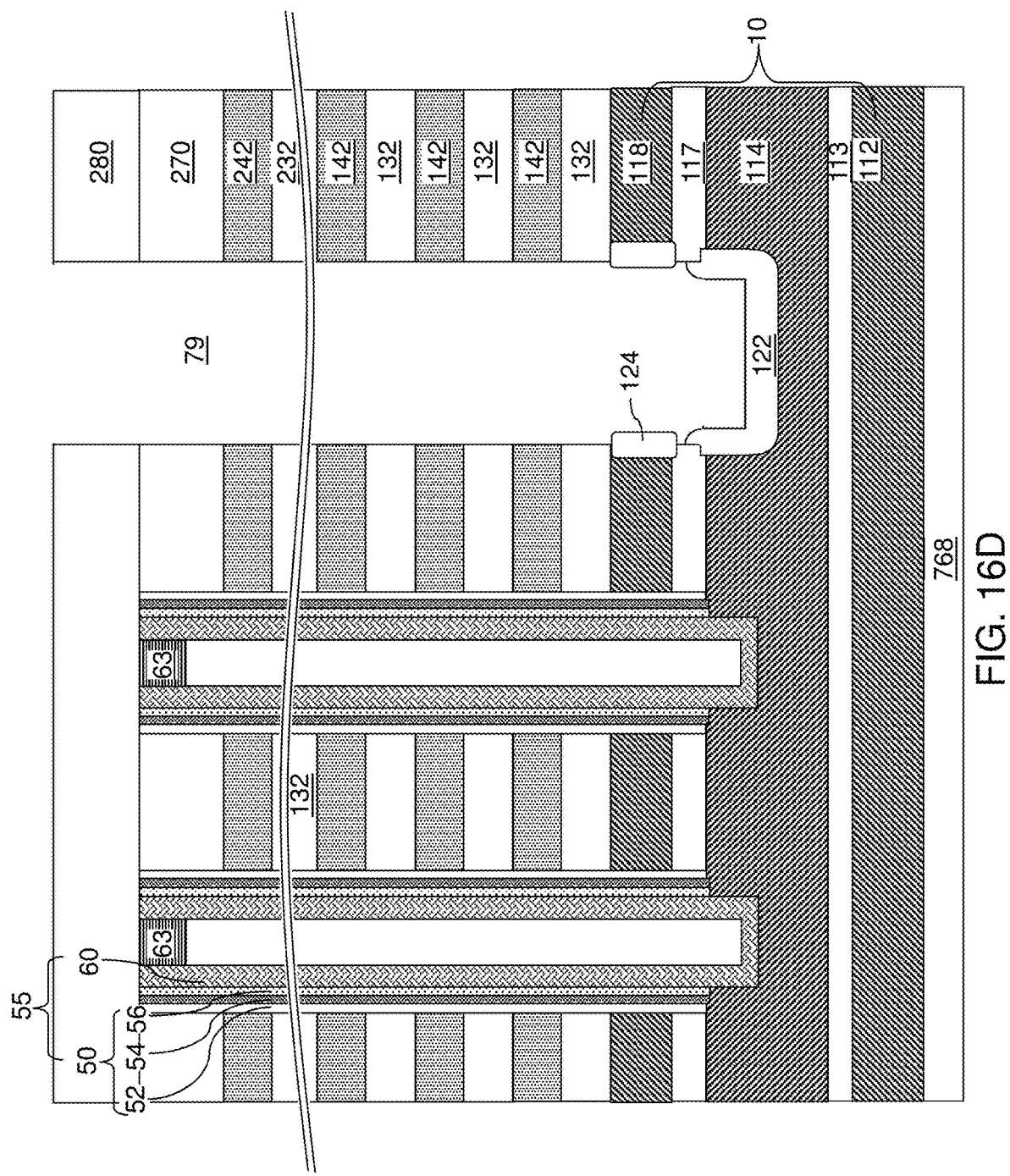

Referring to FIG. 15C, unmasked portions of the dielectric liner 174 may be removed by an etch process. For example, a wet etch process may be used to remove the unmasked portions of the dielectric liner 174 from the memory array region and the contact tab regions 400.

Referring to FIG. 15D, the photoresist layer 177 may be removed, for example, by ashing. The dielectric liner 174 may cover each of the discrete via cavities 385 in the peripheral region 300. Discrete voids 385' are present within the discrete via cavities 385. Generally, surfaces of the discrete via cavities 385 are covered with a dielectric liner 174 without covering sidewalls of the backside trenches 79.

Referring to FIGS. 16A-16D, an oxidation process may be performed to convert physically exposed surface portions of semiconductor materials into dielectric semiconductor oxide spacers (122, 124). For example, surfaces portions of the source semiconductor layer 114 and the source-select-level conductive layer 118 may be converted into semiconductor oxide portions 122, and surface portions of the source-select-level conductive layer 118 may be converted into annular semiconductor oxide spacers 124.

Referring to FIG. 17, the sacrificial material layers (142, 242) are may be removed selective to the insulating layers (132, 232), the first and second insulating cap layers (170, 270), the first contact level dielectric layer 280, and the source semiconductor layer 114, the semiconductor oxide portions 122, and the annular semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The dielectric liner 174 blocks access of the etchant of the isotropic etch process to the portions of the sacrificial material layers (142, 242) in the peripheral region 300. Thus, an alternating stack of insulating layers (132, 232) and sacrificial material layers (142, 242) is present within the peripheral region 300. In one embodiment, the sacrificial material layers (142, 242) include a dielectric material such as silicon nitride, and the alternating stack of insulating layers (132, 232) and sacrificial material layers (142, 242) may be a dielectric alternating stack of insulating layers and dielectric spacer layers (142', 242'). The dielectric spacer layers (142', 242') include first dielectric spacer layers 142' that are remaining portions of the first sacrificial material layer 142 and second dielectric spacer layers 242' that are remaining portions of the second sacrificial material layers 242.

Figure 18:
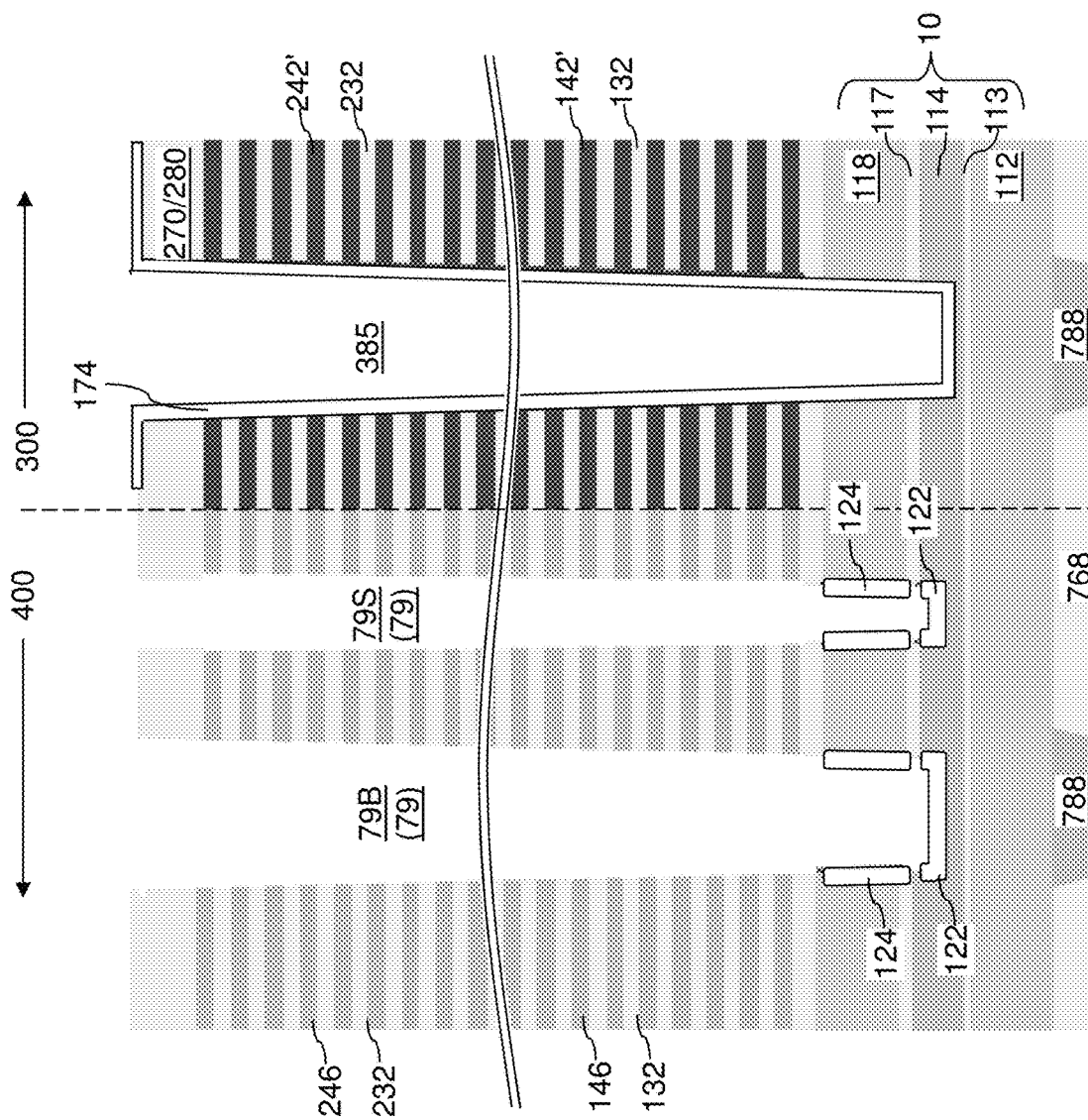
FIG. 18 is a vertical cross-sectional view of the exemplary structure after formation of electrically conductive layers according to an embodiment of the present disclosure.

Referring to FIG. 18, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a periodic width variation along the first horizontal direction hd1.

Thus, portions of the sacrificial material layers (142, 242) adjacent to the backside trenches 79 may be replaced with electrically conductive layers (146, 246) without altering portions of the sacrificial material layers (142, 242) that are proximal to the dielectric liner 174. Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 19:
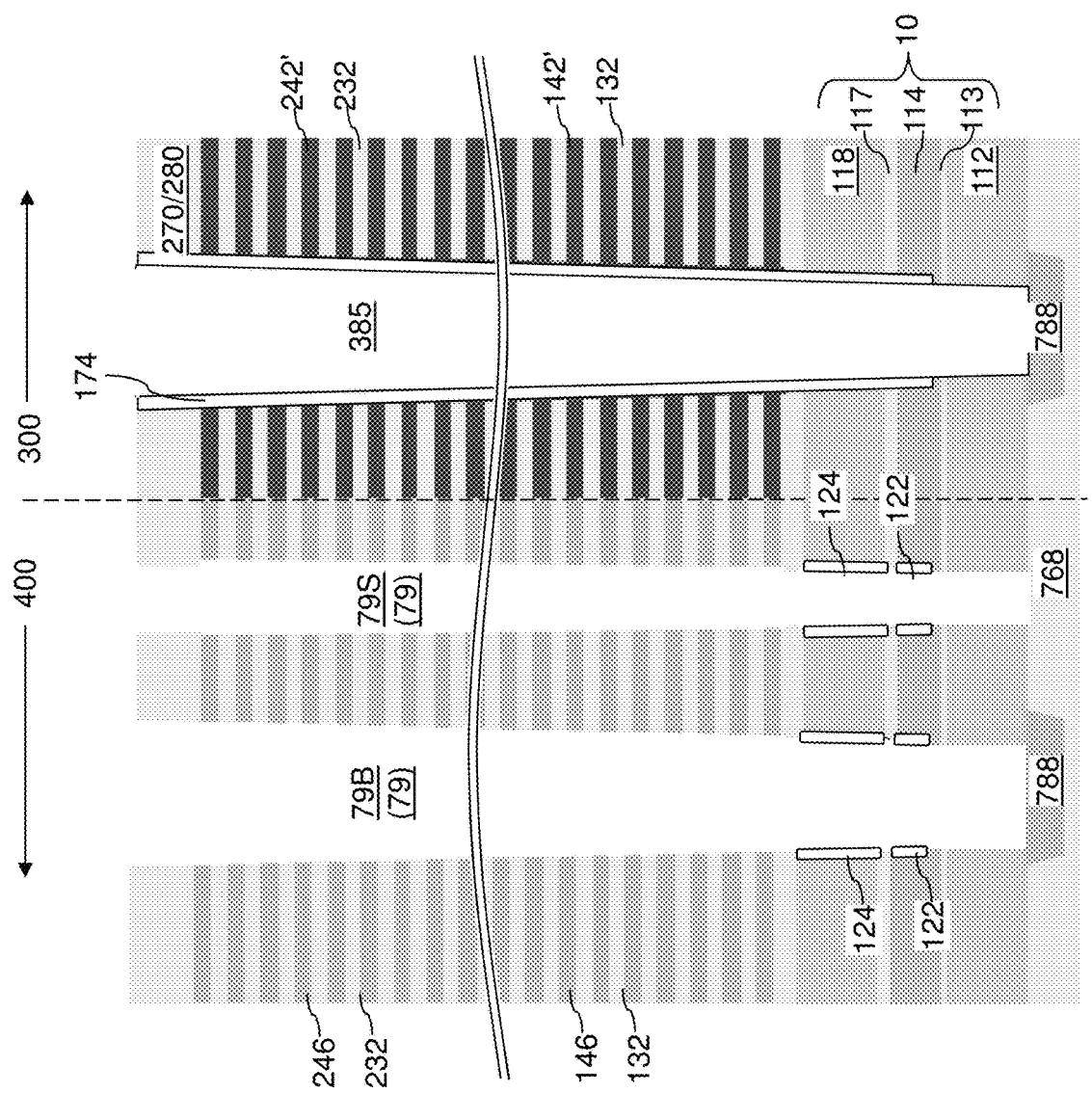
FIG. 19 is a vertical cross-sectional view of the exemplary structure after vertical extension of laterally-undulating backside trenches and the discrete via cavities by an anisotropic etch process according to an embodiment of the present disclosure.

Referring to FIG. 19, the backside trenches 79 and the discrete via cavities 385 may be vertically extended by performing an anisotropic etch process. The chemistry of the anisotropic etch process may be selected to etch through the horizontal portions of the dielectric liner 174 and the semiconductor oxide portions 122, and to subsequently etch through the materials of the source semiconductor layer 114, the lower source-level insulating liner 113, and the lower source-level semiconductor layer 112. In one embodiment, the lower source-level semiconductor layer 112 may include a doped semiconductor material, and the chemistry of the steps of the anisotropic etch process for etching source semiconductor layer 114 and the lower source-level semiconductor layer 112 may be selective to the material of the first contact level dielectric layer 280 to minimize collateral etching of the first contact level dielectric layer 280. The bulging trench segments 79B of the backside trenches 79 and the discrete via cavities 385 may vertically extend to a top surface of a respective underlying landing-pad-level metal line structure 788.

Figure 20A:
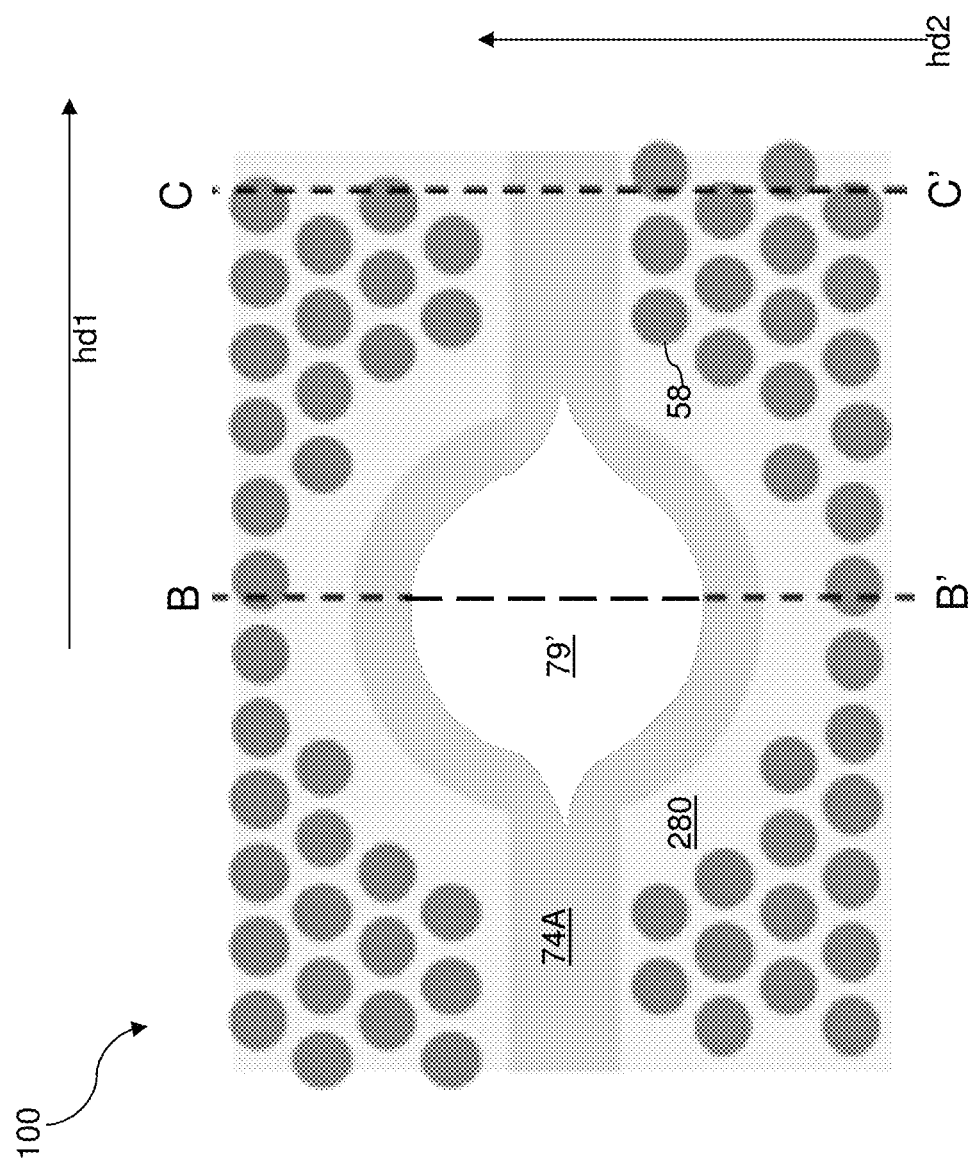
FIG. 20A is a horizontal cross-sectional view of an area of the exemplary structure after conformal deposition a first dielectric spacer component layer in peripheral volumes of the cavities laterally surrounded by the cavity-containing dielectric fill structures and the tubular dielectric spacers according to an embodiment of the present disclosure.
Figure 21A:
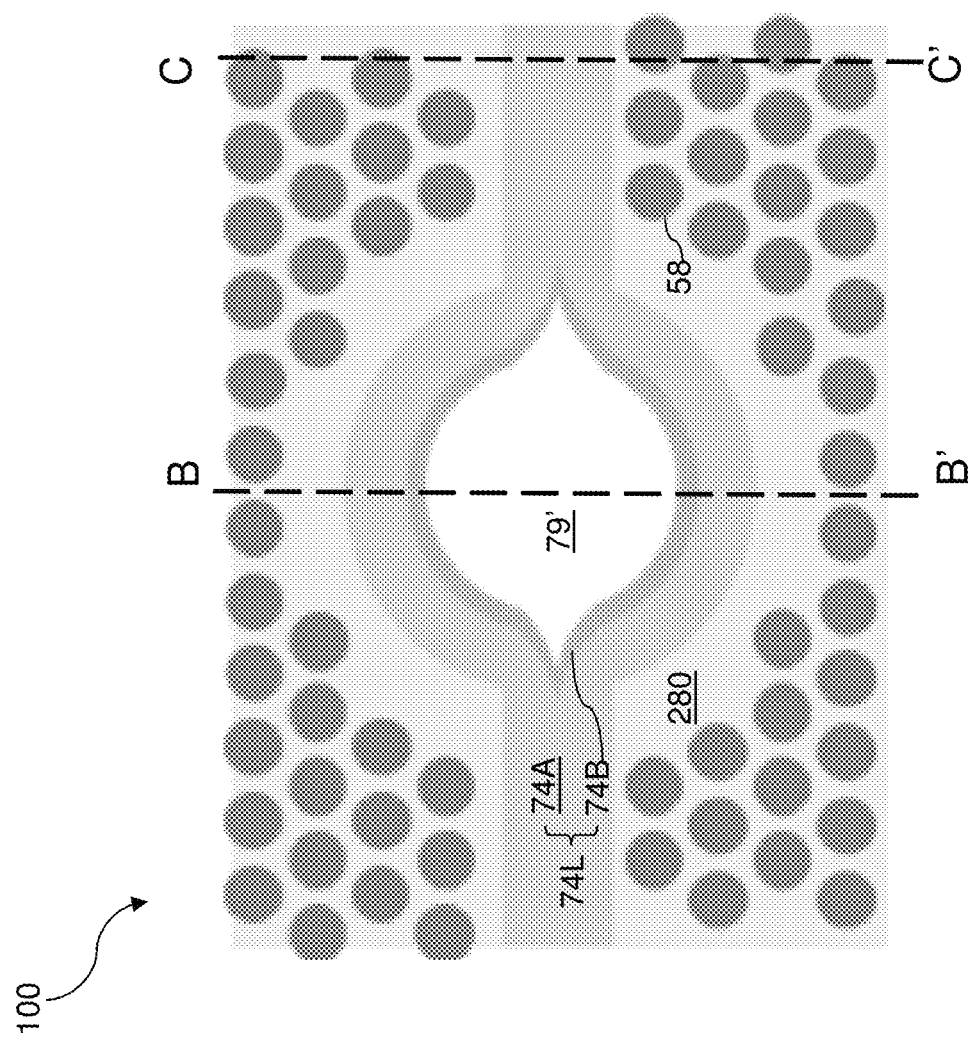
FIG. 21A is a horizontal cross-sectional view of an area of the exemplary structure after conformal deposition a second dielectric spacer component layer according to an embodiment of the present disclosure.
Figure 21D:
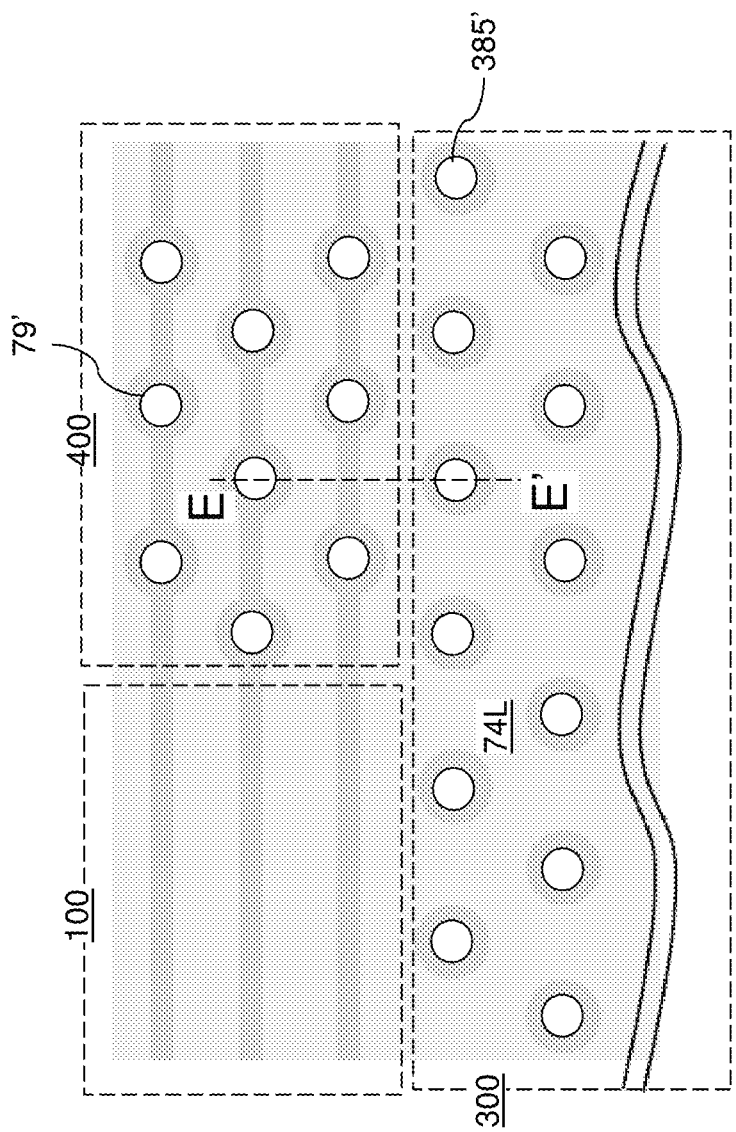
FIG. 21D is a top-down view of a region of the exemplary structure at the processing steps of FIGS. 21A-21C.

Referring to FIGS. 20A-20C, a first dielectric spacer component layer 74A may be deposited by a conformal deposition process in the backside trenches 79 and the in the discrete via cavities 385. The first dielectric spacer component layer 74A is a component layer of a dielectric spacer layer to be subsequently formed. The first dielectric spacer component layer 74A includes a dielectric material such as silicon oxide. The conformal deposition process used to deposit the first dielectric spacer component layer 74A may include low pressure chemical vapor deposition (LPCVD) process. The first dielectric spacer component layer 74A may be deposited directly on the sidewalls of the insulating layers (132, 232) and the electrically conductive layers (146, 246), the dielectric semiconductor oxide spacers (122, 124), and the lower source-level semiconductor layer 112 in the backside trenches 79, and directly on the sidewalls of the dielectric liners 174 and the lower source-level semiconductor layer 112 in the discrete via cavities 385. The deposition process for forming the first dielectric spacer component layer 74A may continue until vertical portions of the first dielectric spacer component layer 74A merges in the straight trench segment 79S of the laterally-undulating backside trenches 79U.

Referring to FIGS. 21A-21E, an additional dielectric material may be deposited to form a second dielectric spacer component layer 74B. In one embodiment, the second dielectric spacer component layer 74B may include the same material as the first dielectric spacer component layer 74A, and the second dielectric spacer component layer 74B may be formed by continuing a deposition process for depositing the first dielectric spacer component layer 74A. Alternatively, the first dielectric spacer component layer 74A include a reflowable dielectric material such as borosilicate glass or borophosphosilicate glass, and a reflow process may be performed before depositing the second dielectric spacer component layer 74B. In another embodiment, the second dielectric spacer component layer 74B may include a dielectric material that is different from the dielectric material of the first dielectric spacer component layer 74A. For example, the first dielectric spacer component layer 74A and the second dielectric spacer component layer 74B may include silicate glass material having different dopant types or different dopant concentrations. The first dielectric spacer component layer 74A and the second dielectric spacer component layer 74B collectively constitutes a dielectric spacer layer 74L.

The lateral dimensions of the bulging trench segments 79B, the straight trench segments 79S, and the discrete via cavities 385 and the total thickness of the dielectric spacer layer 74L may be selected such that the dielectric spacer layer 74L fills the straight trench segments 79S and does not fill a center region of each of the bulging trench segments 79B, and the discrete via cavities 385. A fill gap cavity 79' may be present within each of the bulging trench segments 79B, and a discrete void 385' may be present within each of the discrete via cavities 385. Each fill gap cavity 79' is a cavity that is formed by an unfilled gap in the bulging trench segments 79B of the laterally-undulating backside trenches 79U after deposition of the dielectric spacer layer 74L. Neighboring pairs of fill gap cavities 79' within a laterally-undulating backside trench 79U are laterally spaced apart from one another by portions of the dielectric spacer layer 74L that fill the straight trench segments 79S within the same laterally-undulating backside trench 79U.

Figure 22A:
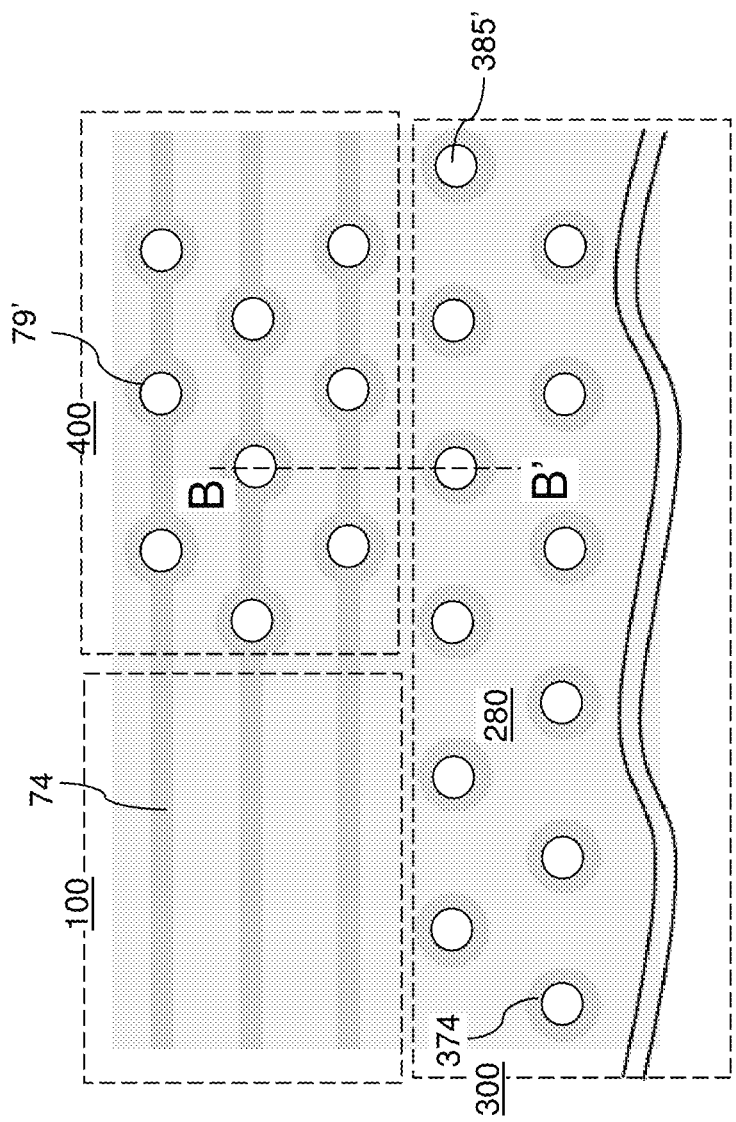
FIG. 22A is a top-down view of an area of the exemplary structure after formation of cavity-containing dielectric fill structures and the tubular dielectric spacers according to an embodiment of the present disclosure.
Figure 22B:
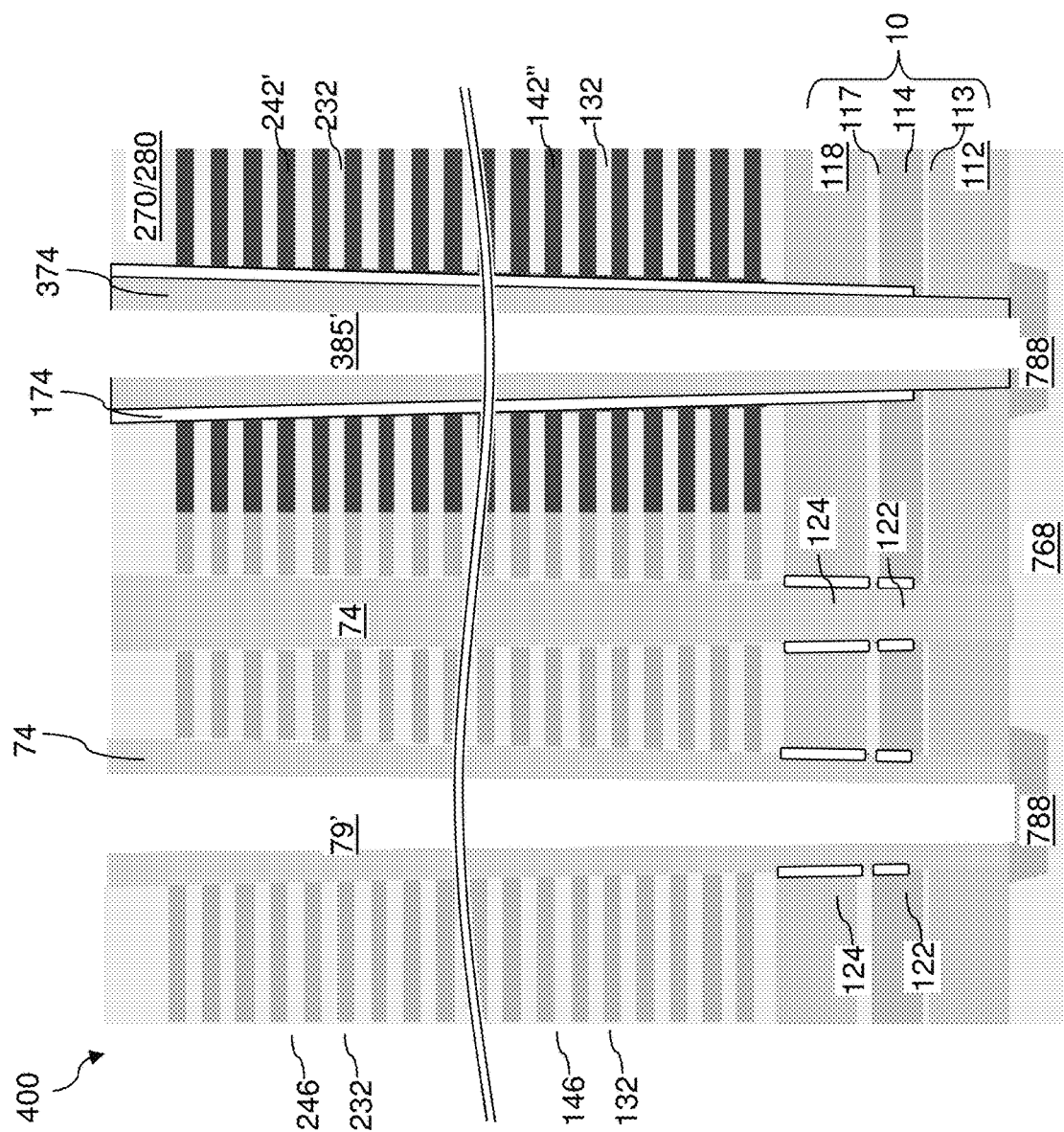
FIG. 22B is a vertical cross-sectional view of the exemplary structure along the vertical plane B-B' of FIG. 22A.
Figure 22C:
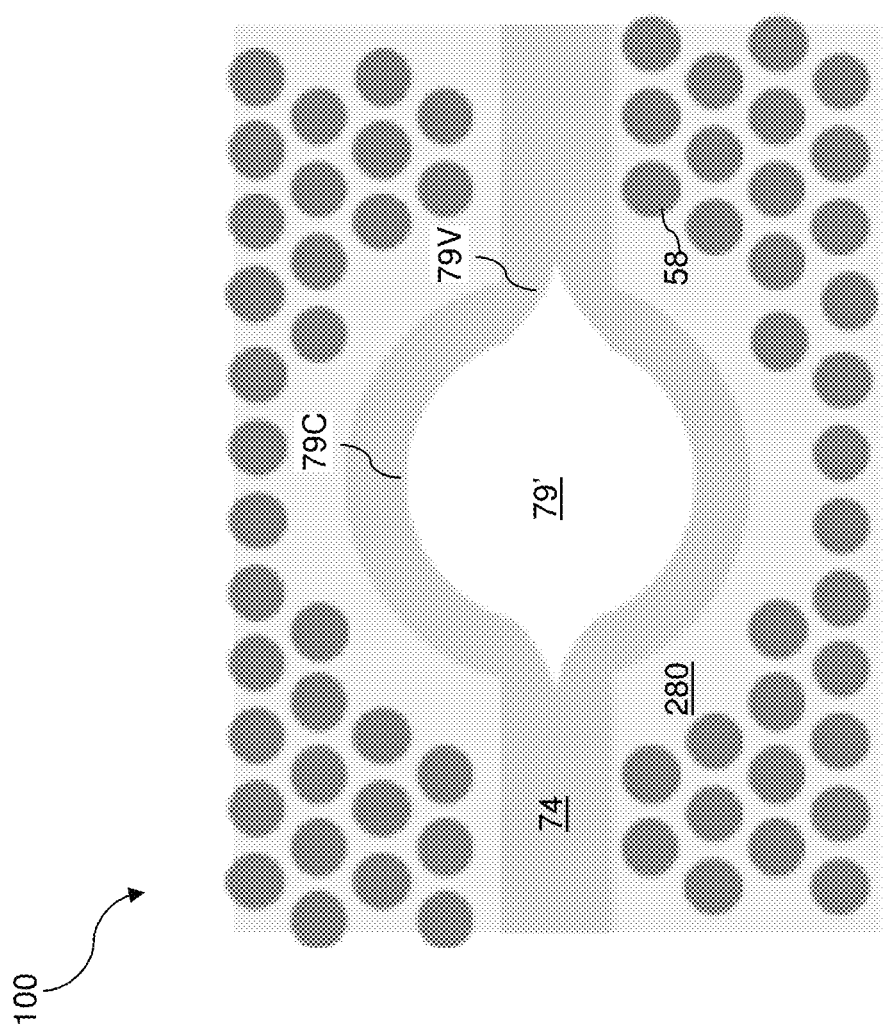
FIG. 22C is a top-down view of a region of the exemplary structure of FIGS. 22A and 22B around a vertically-extending cavity.

Referring to FIGS. 22A-22C, an anisotropic etch process may be performed to etch horizontal portions of the dielectric spacer layer 74L from above the top surface of the first contact level dielectric layer 280 and at the bottom of each of the fill gap cavities 79' and the discrete voids 385'. Each remaining portion of the dielectric spacer layer 74L in a laterally-undulating backside trench 79U constitutes a cavity-containing dielectric fill structure 74. Each portion of the dielectric spacer layer 74L that remains in a discrete via cavity 385 after the anisotropic etch process constitutes a tubular dielectric spacer 374. Horizontal portions of the dielectric spacer layer 74L that underlie the unfilled volumes in the bulging trench segments 79B and the discrete via cavities 385 may be removed during the anisotropic etch process to physically expose top surfaces of the landing-pad-level metal line structures 788.

Generally, the cavity-containing dielectric fill structures 74 may be formed in the laterally-undulating backside trenches 79U by conformally depositing a dielectric spacer layer 74L within the laterally-undulating backside trenches 79U. The dielectric spacer layer 74L completely fill at least an upper portion of each of the straight trench segments 79S and covers sidewalls of each of the bulging trench segments 79B, while not filling a center portion of each of the bulging trench segments 79B to provide unfilled volumes, which are the fill gap cavities 79'. Each of the cavity-containing dielectric fill structures 74 comprises fill gap cavities 79' (which are vertically-extending cavities) within each region of bulging trench segments 79B within the respective one of the laterally-undulating backside trenches 79U.

Each fill gap cavity 79' is a vertically-extending cavity that extends from a top surface of a landing-pad-level metal line structure 788 to a top surface of the first contact level dielectric layer 280. Each of the fill gap cavities 79' is laterally spaced from a sidewall of a respective bulging trench segment 79B by a vertically-extending portion of the cavity-containing dielectric fill structures 74. In one embodiment, a fill gap cavity 79' may be laterally bounded by a pair of concave semi-cylindrical sidewalls 79C and by a pair of beak-shaped laterally-protruding portions having a respective pair of convex sidewalls 79V.

Referring to FIG. 23A-FIG. 23I, at least one conductive material may be deposited by a conformal deposition method in the fill gap cavities 79' and in the discrete voids 385' directly on the physically exposed top surface of the landing-pad-level metal line structures 788. The at least one conductive material may include a metallic nitride liner material such as TiN, TaN, and/or WN and a metallic fill material and/or a doped semiconductor fill material such as tungsten, molybdenum, copper, doped polysilicon, and/or a combination thereof. Excess portions of the at least one conductive material may be removed from above the horizontal plane including the top surface of the first contact level dielectric layer 280 by a planarization process such as a recess etch or a chemical mechanical planarization (CMP) process.

First contact via structures 76 and second contact via structures 386 may be formed within unfilled volumes of the laterally-undulating backside trenches 79U and unfilled volumes of the discrete via cavities 385, respectively. Each remaining portion of the at least one conductive material that fills a fill gap cavity 79' (i.e., a vertically-extending cavity) constitutes a first contact via structure 76. Each remaining portion of the at least one conductive material that fills a discrete void 385' constitutes a second contact via structure 386. The first contact via structures 76 are formed within the vertically-extending cavities (i.e., the fill gap cavities 79') of the cavity-containing dielectric fill structures 74, and extends through a semiconductor material layer within the source-level material layers 10 (such as the source semiconductor layer 114). At least one, and/or all, of the first contact via structures 76 may comprise a pair of convex semi-cylindrical sidewalls 76V adjoined by a pair of beak-shaped laterally-protruding portions having a respective pair of concave sidewalls 76C. In one embodiment, the first contact via structures 76 may be eye-shaped (e.g., have a horizontal cross sectional shape similar to a eye). The second contact via structures 386 may include a respective cylindrical sidewall having a straight vertical profile that extends from a lower-level metal interconnect structure 780 to a top surface of the first contact level dielectric layer 280. The first and second contact via structures (76, 386) may be formed on a top surface of a respective one of the lower-level metal interconnect structures 780.

A subset of the first contact via structures 76 may be formed within the memory array region 100 between a first alternating stack of first insulating layers (132, 232) and first electrically conductive layers (146, 246) and a second alternating stack of second insulating layers (132, 232) and second electrically conductive layers (146, 246). The first insulating layers (132, 232) and the second insulating layers (132, 232) may be subsets of the insulating layers (132, 232). The first electrically conductive layers (146, 246) and the second electrically conductive layers (146, 246) may be subsets of the electrically conductive layers (146, 246). Subsets of the memory stack structures 55 vertically extend through the first alternating stack and the second alternating stack.

Figure 23A:
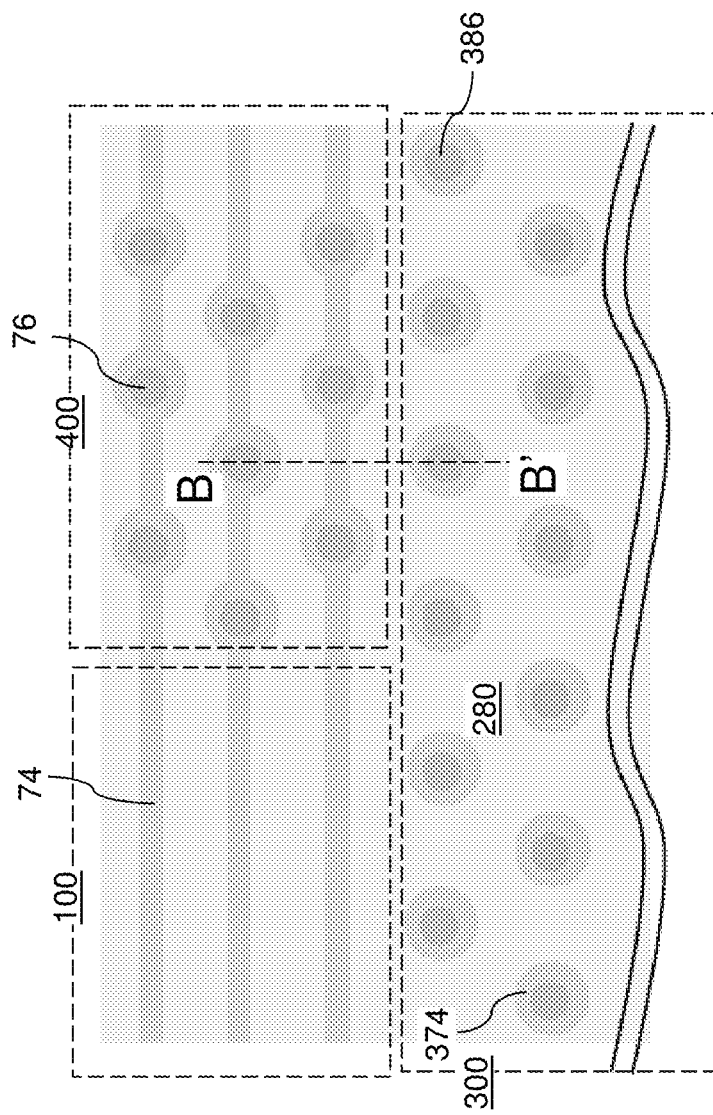
FIG. 23A is a top-down view of a first area of the exemplary structure after formation of first contact via structures and second contact via structures according to an embodiment of the present disclosure.
Figure 23B:
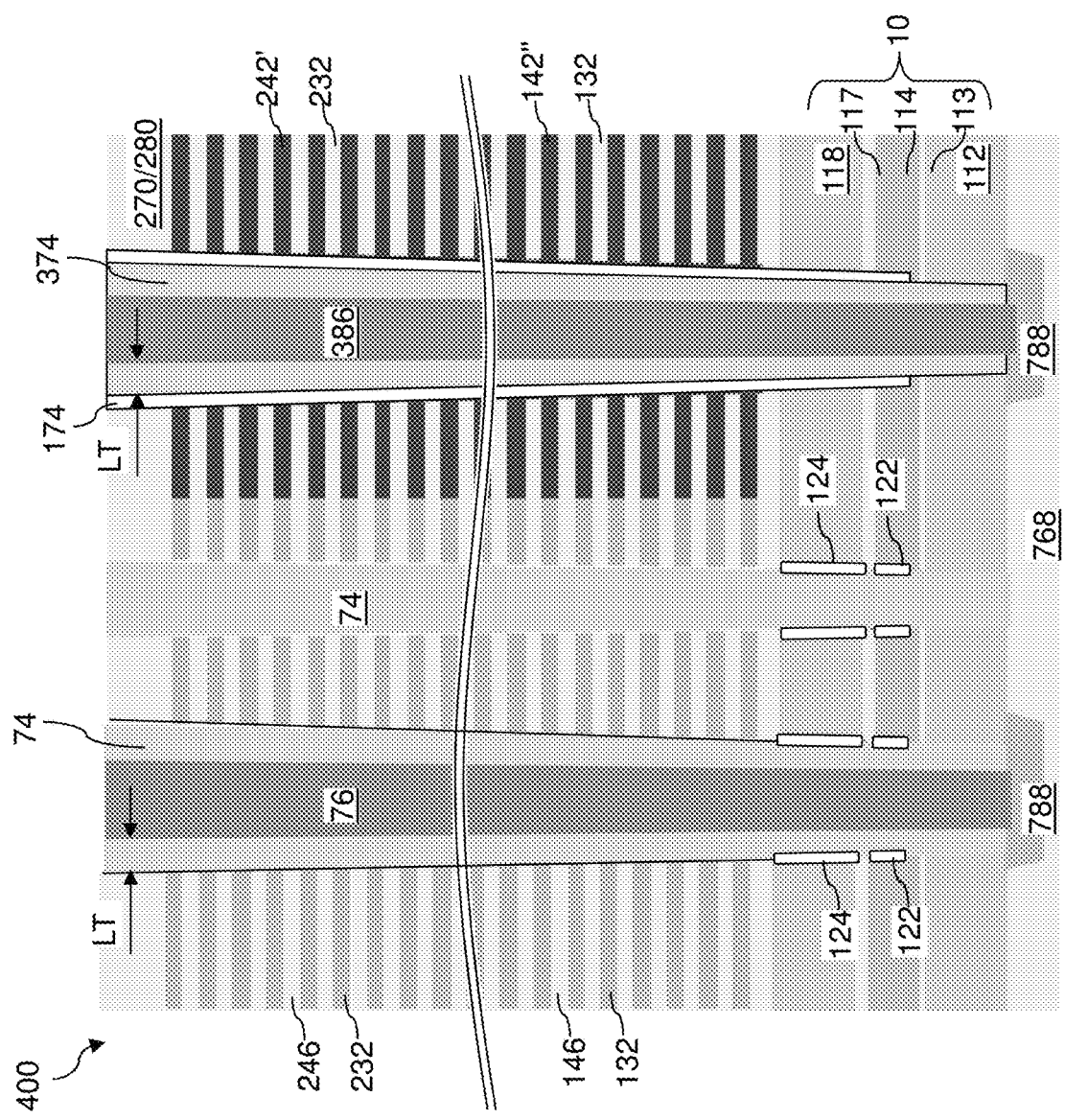
FIG. 23B is a vertical cross-sectional view of the exemplary structure along the vertical plane B-B' of FIG. 22A.
Figure 23C:
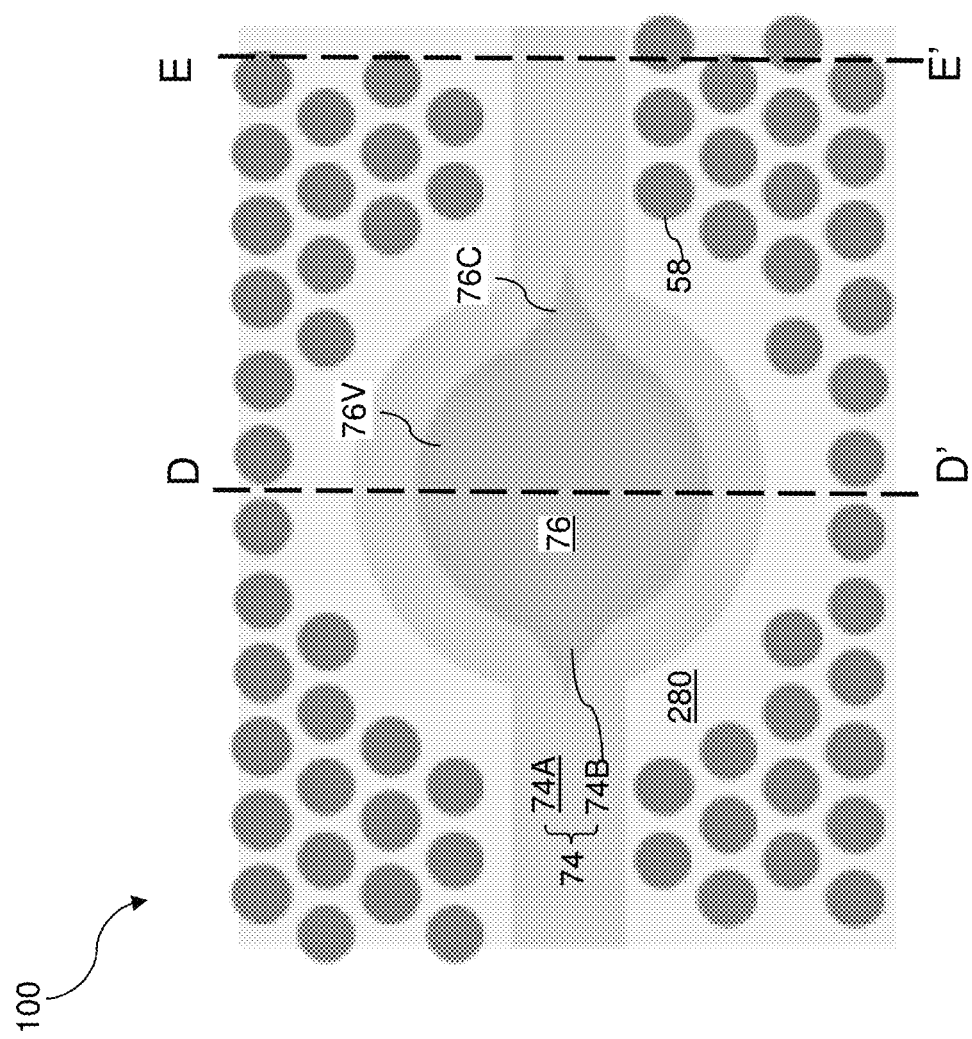
FIG. 23C is a see-through top-down view of a region of the exemplary structure of FIGS. 23A and 23B around a vertically-extending cavity.
Figure 23F:
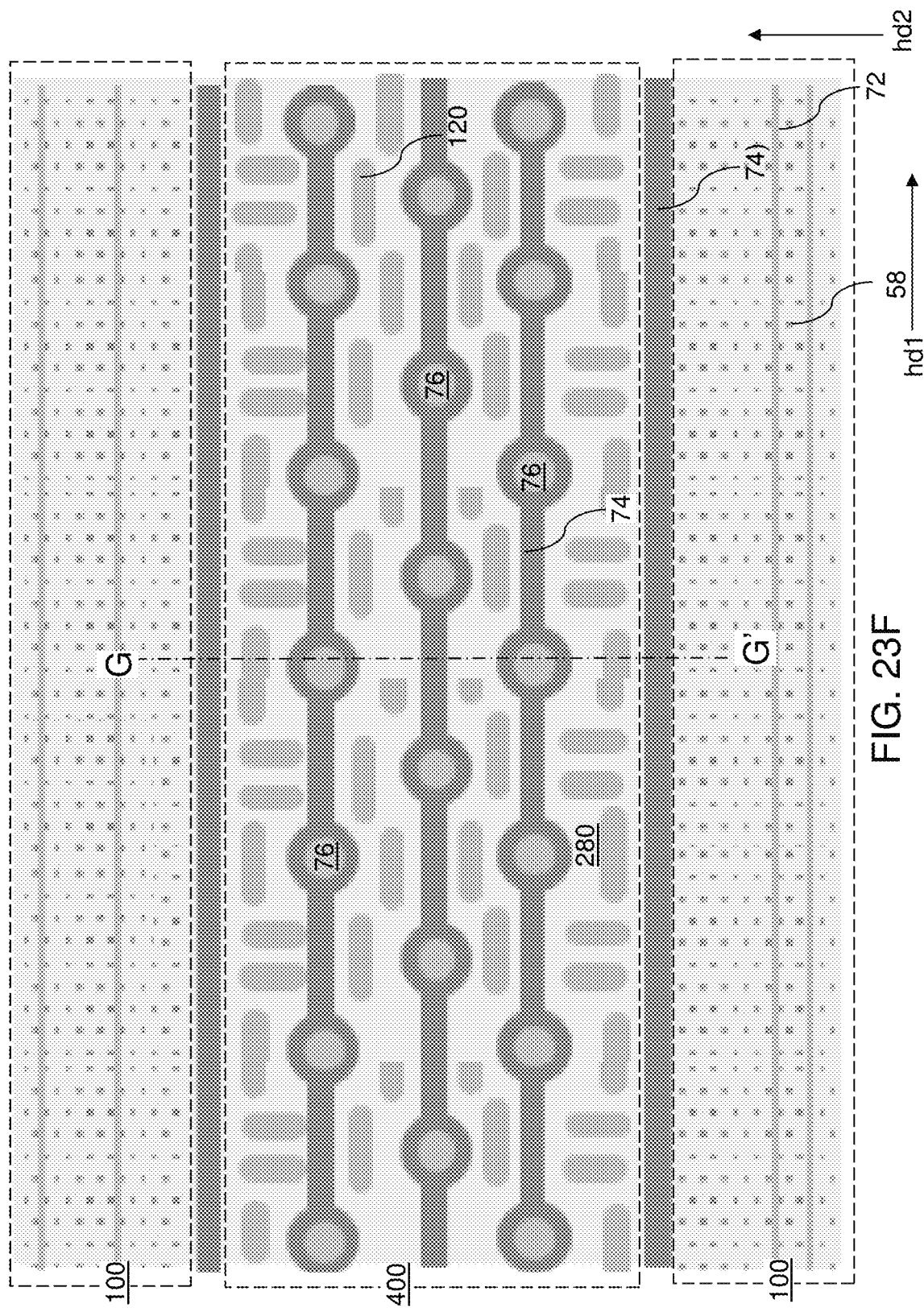
FIG. 23F is a see-through top-down view of the exemplary structure within a second area that corresponds to the area of FIG. 11D at the processing steps of FIGS. 23A-23E.
Figure 23G:
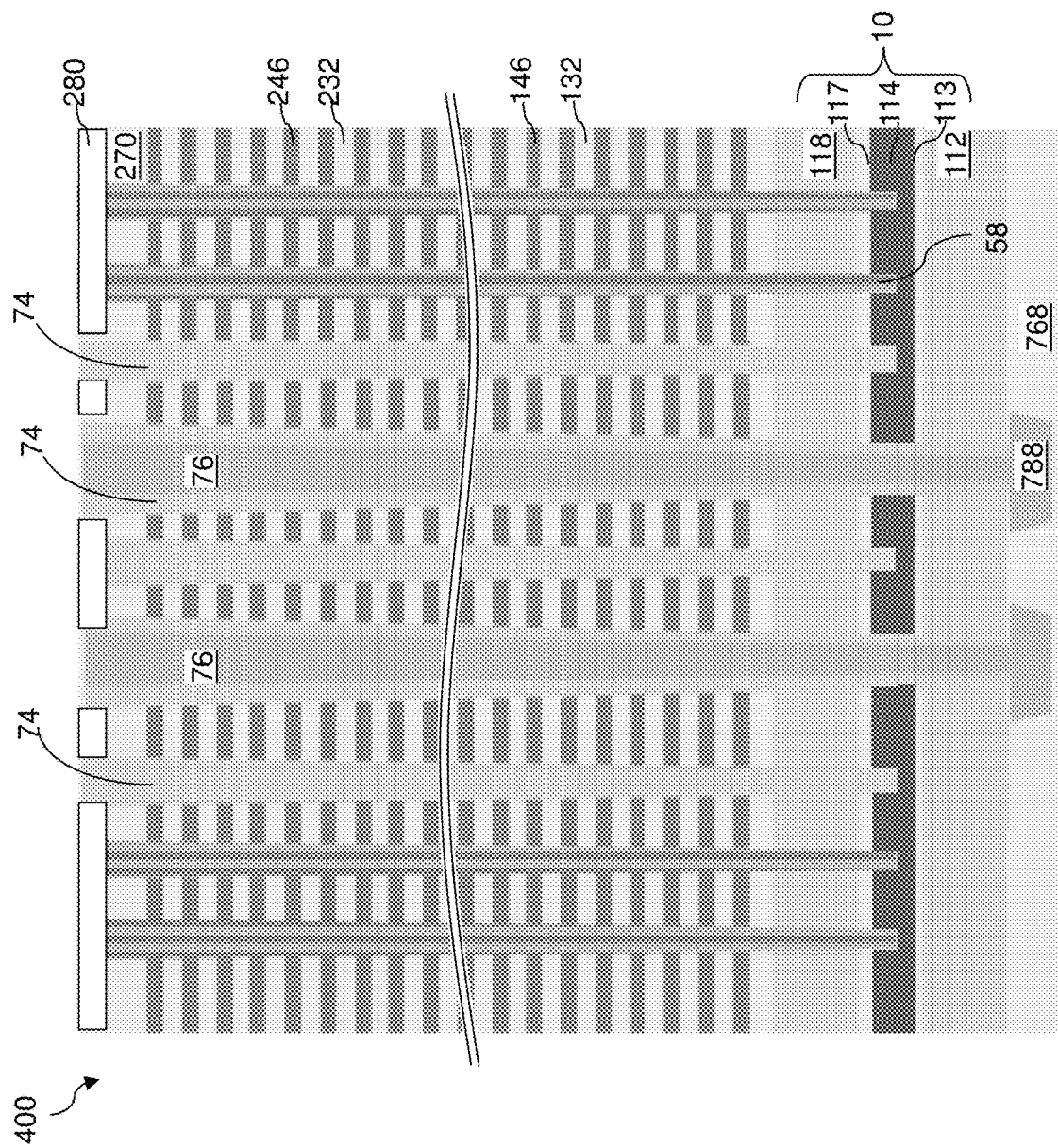
FIG. 23G is a vertical cross-sectional view of the exemplary structure along the vertical plane G-G' of FIG. 23F.
Figure 23H:
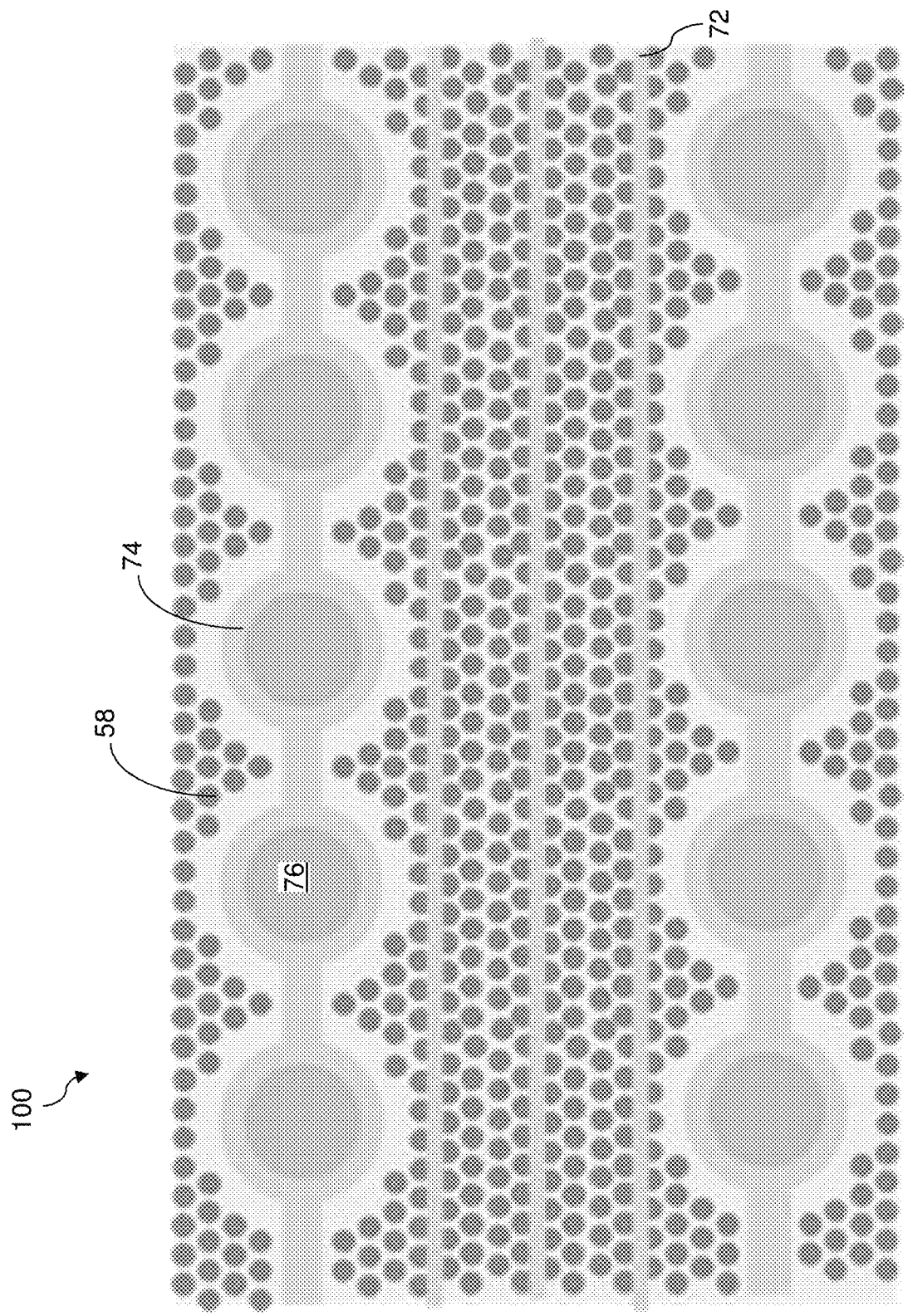
FIG. 23H is a see-through top-down view of an alternative configuration of the exemplary structure of FIGS. 23A-23G according to an embodiment of the present disclosure.
Figure 23I:
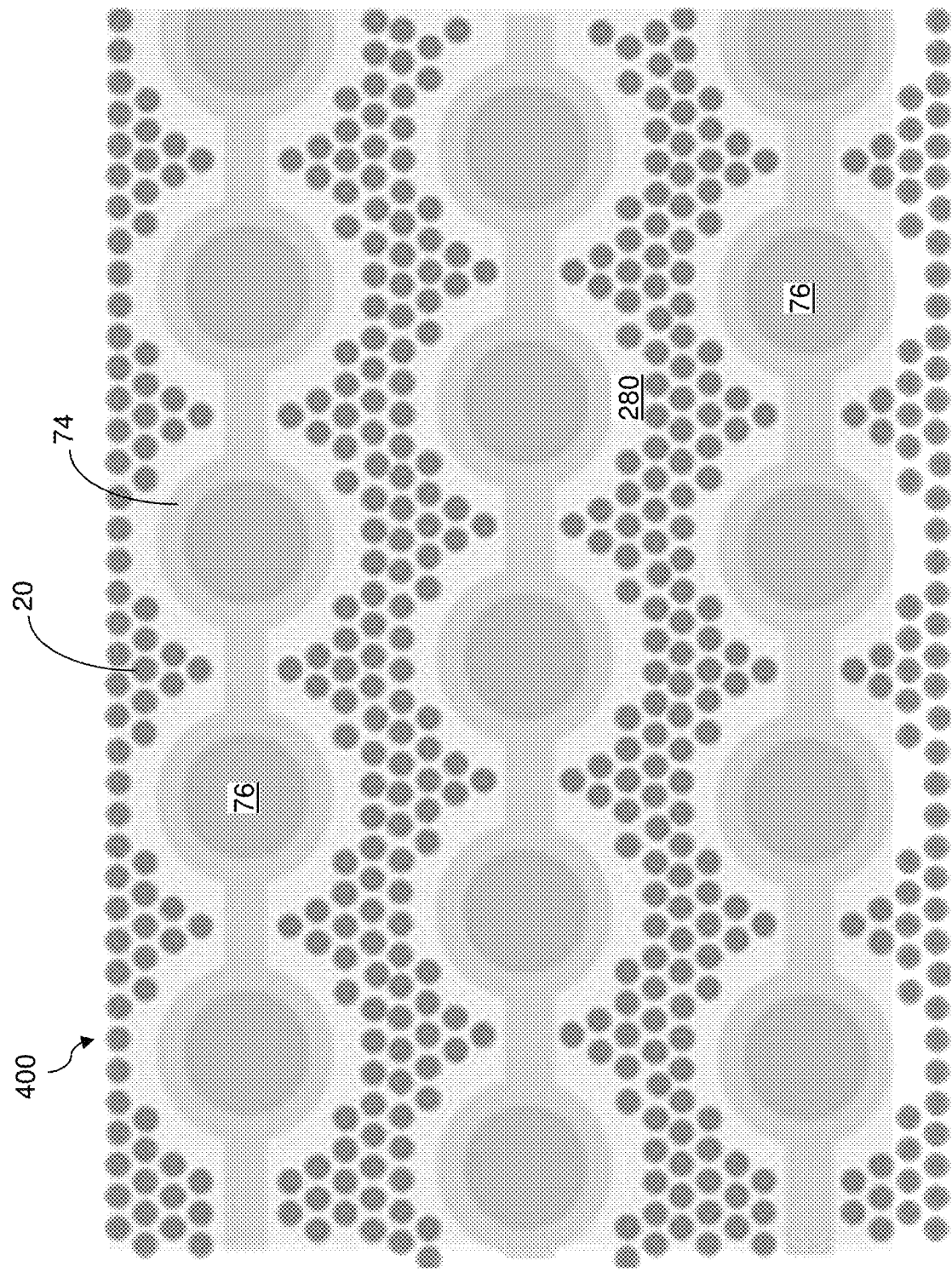
FIG. 23I is a see-through top-down view of another alternative configuration of the exemplary structure of FIGS. 23A-23G according to an embodiment of the present disclosure.

In one embodiment, a subset of the first contact via structures 76 may be formed within a contact tab region 400 including at least two alternating stacks {(132, 232), (146, 246)} of respective insulating layers (132, 232) and respective electrically conductive layers (146, 246). Support pillar structures (20, 120) vertically extend through each of the alternating stacks {(132, 232), (146, 246)}. In one embodiment, the contact tab region 400 does not include any of the memory stack structures 55 therein, and may be surrounded by the memory array region 100. In one embodiment, each of the support pillar structures (20, 120) may consists of at least one dielectric material or may be electrically inactive. In one embodiment, the contact tab region 400 may be laterally spaced from the memory array region 100, in which the memory stack structures 55 extend through an additional one of the alternating stacks {(132, 232), (146, 246)} by a straight trench 79T that extends along the first horizontal direction hd1 with a uniform width throughout as illustrated in FIG. 23F.

In one embodiment, a portion of a cavity-containing dielectric fill structures 74 laterally contacting a first contact via structure 76 may have the same lateral thickness LT as a tubular dielectric spacer 374 that laterally surrounds a second contact via structure 386.

Figure 24:
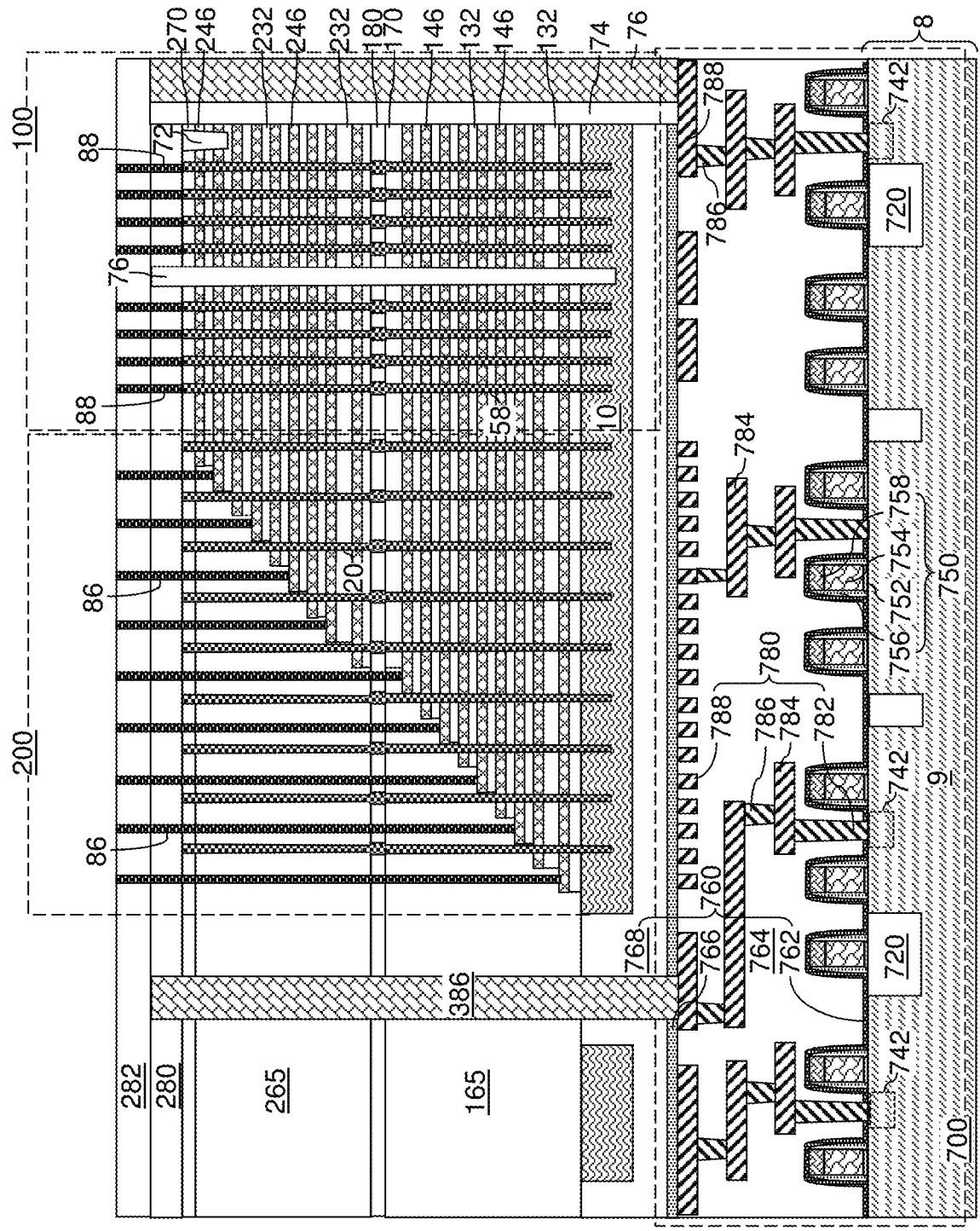
FIG. 24 is a vertical cross-sectional view of the exemplary structure after formation of additional contact via structures according to an embodiment of the present disclosure.

Referring to FIG. 24, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55. Additional metal contact structures such as bit lines (not shown) and word-line-connection structures may be formed as needed.

Referring to all drawings an according to various embodiments of the present disclosure, a three-dimensional memory device is provided, which comprises: alternating stacks of insulating layers (132, 232) and electrically conductive layers (146, 246) located over a semiconductor material layer (such as a source semiconductor layer 114); a group of memory stack structures 55 extending through a first alternating stack selected from the alternating stacks {(132, 232), (146, 246)} that is located within a memory array region 100; laterally-undulating backside trenches 79U located between neighboring pairs of the alternating stacks {(132, 232), (146, 246)} and laterally extending along a first horizontal direction hd1, wherein each of the laterally-undulating backside trenches 79U comprises a laterally alternating sequence of straight trench segments 79S having a uniform trench width and bulging trench segments 79B having a variable trench width that is greater than the uniform trench width; cavity-containing dielectric fill structures 74 located within a respective one of the laterally-undulating backside trenches 79U, wherein each of the cavity-containing dielectric fill structures 74 comprises vertically-extending cavities 79' within each region of bulging trench segments 79B within the respective one of the laterally-undulating backside trenches 79U, and each of the vertically-extending cavities 79' is laterally spaced from a sidewall of a respective bulging trench segment 79B by a uniform lateral width; and contact via structures 76 located within the vertically-extending cavities 79' of the cavity-containing dielectric fill structures 74 and extending through the semiconductor material layer.

In one embodiment, one of the contact via structures 76 comprises a pair of convex semi-cylindrical sidewalls 76V adjoined by a pair of beak-shaped laterally-protruding portions having a respective pair of concave sidewalls 76C. In one embodiment, the pair of convex semi-cylindrical sidewalls 76V is laterally spaced from most proximal sidewalls of the laterally-undulating backside trenches 79U by a uniform lateral offset distance, which is the lateral thickness of a portion of a cavity-containing dielectric fill structures 74 that contacts the contact via structure 76. In one embodiment, each of the straight trench segments 79S has a uniform width that is not greater than twice the uniform lateral offset distance; portions of the cavity-containing dielectric fill structures 74 located within the straight trench segments 74S include vertical seams; and the contact via structures 76 embeds cavities that are free of any solid phase material therein (as illustrated in FIG. 23D, for example, due to bowing of sidewalls of the backside trenches 79).

In one embodiment, the three-dimensional memory device comprises: field effect transistors located on a substrate 8 that underlies the semiconductor material layer (such as a source semiconductor layer 114); and lower-level metal interconnect structures 780 formed in lower-level dielectric material layers 760 that overlie the field effect transistors and electrically connected to nodes of the field effect transistors, wherein the contact via structures 76 contact a top surface of a respective one of the lower-level metal interconnect structures 780.

In one embodiment, the semiconductor material layer comprises a source semiconductor layer 114 including a doped semiconductor material and laterally spaced from the contact via structures 76 by the cavity-containing dielectric fill structures 74; a lower portion of the source semiconductor layer 114 contacts outer sidewalls of the cavity-containing dielectric fill structures 74; and an upper portion of the source semiconductor layer is laterally spaced from the outer sidewalls of the cavity-containing dielectric fill structures by semiconductor oxide portions 122.

In one embodiment, each of the memory stack structures 55 comprises a respective vertical semiconductor channel 60 and a respective memory film 50; and the semiconductor material layer comprises a source semiconductor layer 114 including a doped semiconductor material and electrically connected to bottom ends of the vertical semiconductor channels 60.

In one embodiment, a subset of the contact via structures 76 is located within the memory array region 100 between the first alternating stack {(132, 232), (146, 246)} and an additional alternating stack {(132, 232), (146, 246)} of a subset of the insulating layers (132, 232) and additional electrically conductive layers (146, 246) that is laterally spaced from the first alternating stack {(132, 232), (146, 246)}.

In one embodiment, the three-dimensional memory device comprises drain-select-level isolation structures 72 located between a pair of laterally-undulating backside trenches 79 located adjacent to the first alternating stack {(132, 232), (146, 246)}, laterally extending along the first horizontal direction hd1, vertically extending through at least one electrically conductive layer 246, but not through all electrically conductive layers (146, 246), within the first alternating stack {(132, 232), (146, 246)}, wherein the group of memory stack structures 55 is divided into multiple subgroups that are laterally spaced apart by the drain-select-level isolation structures 72.

In one embodiment, a subset of the contact via structures 76 is located within a contact tab region 400 including second alternating stacks selected from the alternating stacks {(132, 232), (146, 246)}; and support pillar structures (20, 120) vertically extend through each of the second alternating stacks {(132, 232), (146, 246)}.

In one embodiment, each of the second alternating stacks {(132, 232), (146, 246)} does not embed any of the memory stack structures 55; and each of the support pillar structures (20, 120) consists of at least one dielectric material or is electrically inactive.

In one embodiment, the contact tab region 400 is laterally spaced from a memory array region 100 in which the groups of memory stack structures 55 are present by a straight trench 79T that extends along the first horizontal direction hd1 with a uniform width throughout.

In one embodiment, each lengthwise sidewall of the laterally-undulating backside trenches 79U that laterally extend along the first horizontal direction hd1 comprises a respective laterally alternating sequences of straight trench segments 79S that are parallel to the first horizontal direction hd1 and concave semi-cylindrical sidewall segments 79C that laterally extend outward into a respective one of the alternating stacks {(132, 232), (146, 246)}.

The various embodiments of the present disclosure provide a three-dimensional memory device, which comprises: alternating stacks of insulating layers (132, 232) and electrically conductive layers (146, 246) located over a semiconductor material layer (such as a source semiconductor layer 114); memory stack structures 55 extending through a first alternating stack selected from the alternating stacks {(132, 232), (142, 242)}; laterally-undulating backside trenches 79U located between neighboring pairs of the alternating stacks {(132, 232), (146, 246)} and laterally extending along a first horizontal direction hd1; cavity-containing dielectric fill structures 74 located within a respective one of the laterally-undulating backside trenches 79U; first contact via structures 76 located within the vertically-extending cavities 79' of the cavity-containing dielectric fill structures 74 and contacting the semiconductor material layer; a dielectric alternating stack of a subset of the insulating layers 132, 232 and dielectric spacer layers (142', 242') (that are remaining portions of the sacrificial material layers (142, 242)) laterally adjoining one of the alternating stacks {(132, 232), (146, 246)}; and laterally-insulated contact via structures (386, 374) extending through the dielectric alternating stack {(132, 232), (142', 242')}, wherein each of the laterally-insulated contact via structures (386, 374) comprises a respective tubular dielectric spacer 374 and a respective second contact via structure 386 surrounded by the respective tubular dielectric spacer 374.

In one embodiment, each of the laterally-undulating backside trenches 79U comprises a laterally alternating sequence of straight trench segments 79S having a uniform trench width and bulging trench segments 79B having a variable trench width that is greater than the uniform trench width.

In one embodiment, a topmost portion of each of the cavity-containing dielectric fill structures 74 that contact the first contact via structures 76 has a same lateral thickness LT as a topmost portion of each of the tubular dielectric spacers 374. In one embodiment, each of the tubular dielectric spacers 374 is laterally spaced from the dielectric alternating stack {(132, 232), (142', 242')} by a dielectric liner 174 having a different material composition than the dielectric spacer layers (142', 242'). In one embodiment, the dielectric liners 174 comprise a semiconductor oxide material and contacts a respective upper portion of the semiconductor material layer (such as the source semiconductor layer 114); and the tubular dielectric spacers 174 contact a respective lower portion of the semiconductor material layer.

In one embodiment, each of the electrically conductive layers (146, 246) is located between a respective first horizontal plane including a top surface of a respective one of the dielectric spacer layers (142', 242') and a respective second horizontal plane including a bottom surface of the respective one of the dielectric spacer layers (142', 242'). In one embodiment, the insulating layers (132, 232) comprise doped silicate glass, undoped silicate glass, or organosilicate glass; the dielectric spacer layers (142', 242') comprise silicon nitride; and the second contact via structures 386 comprise at least one metallic material.

In one embodiment, the three-dimensional memory device comprises: field effect transistors located on a substrate 8 that underlies the semiconductor material layer; and lower-level metal interconnect structures 780 formed in lower-level dielectric material layers 760 that overlie the field effect transistors and electrically connected to nodes of the field effect transistors, wherein the first contact via structures 76 and the second contact via structures 386 contact a top surface of a respective one of the lower-level metal interconnect structures 780.

In one embodiment, the semiconductor material layer comprises a source semiconductor layer 114 including a doped semiconductor material and laterally spaced from the first contact via structures 76 by the cavity-containing dielectric fill structures 74; a lower portion of the source semiconductor layer contacts outer sidewalls of the cavity-containing dielectric fill structures 74; and an upper portion of the source semiconductor layer is laterally spaced from the outer sidewalls of the cavity-containing dielectric fill structures 74 by a semiconductor oxide portion 122.

In one embodiment, each of the memory stack structures 55 comprises a respective vertical semiconductor channel 60 and a respective memory film 50; and the semiconductor material layer comprises a source semiconductor layer 114 including a doped semiconductor material and electrically connected to bottom ends of the vertical semiconductor channels 60.

In one embodiment, the cavity-containing dielectric fill structures 74 and the tubular dielectric spacers 374 comprise a same dielectric material; and the first contact via structures 76 and the second contact via structures 386 comprise a same set of at least one metallic material.

In one embodiment, a subset of the first contact via structures 76 is located within a contact tab region 400 in which second alternating stacks selected from the alternating stacks {(132, 142), (146, 246)} are present, wherein the contact tab region 400 is free of any memory stack structure 55; and support pillar structures (20, 120) vertically extend through each of the second alternating stacks.

In one embodiment, each of the support pillar structures (20, 120) consists of at least one dielectric material or is electrically inactive; and the contact tab region 400 is laterally spaced from a memory array region 100 including the first alternating stack by a straight trench 79T that extends along the first horizontal direction hd1 with a uniform width throughout.

In one embodiment, each lengthwise sidewall of the laterally-undulating backside trenches 79U that laterally extend along the first horizontal direction hd1 comprises a respective laterally alternating sequences of straight trench segments 79S that are parallel to the first horizontal direction hd1 and concave semi-cylindrical sidewall segments 79C that laterally extend outward into a respective one of the alternating stacks.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

The various embodiments of the present disclosure provide contact via structures 76 located within cavity-containing dielectric fill structures 74. Formation of via cavities for forming first contact via structures 76 and formation of backside trenches 79 may be effected by a single anisotropic etch process that etches through each layer of a vertically alternating sequence of insulating layers (132, 232) and sacrificial material layers (142, 242). Further, discrete via cavities 385 may be formed concurrently with formation of the backside trenches 79. Formation of the fill gap cavities 79' uses an easy anisotropic etch process that etches through the thickness of a horizontal portion of a dielectric spacer layer 74L. Thus, patterning of deep cavities and trenches that extend through the vertically alternating sequence of insulating layers (132, 232) and sacrificial material layers (142, 242) are preformed at a same processing step, thereby reducing the total processing cost for the three-dimensional memory device of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   alternating stacks of insulating layers and electrically conductive layers located over a semiconductor material layer;
   memory stack structures extending through a first alternating stack selected from the alternating stacks of insulating layers and electrically conductive layers;
   laterally-undulating backside trenches located between neighboring pairs of the alternating stacks of insulating layers and electrically conductive layers and laterally extending along a first horizontal direction;
   cavity-containing dielectric fill structures located within a respective one of the laterally-undulating backside trenches;
   first contact via structures located within vertically-extending cavities of the cavity-containing dielectric fill structures located within a respective one of the laterally-undulating backside trenches and extending to the semiconductor material layer;
   a dielectric alternating stack of insulating layers and dielectric spacer layers laterally adjoining one of the alternating stacks of insulating layers and electrically conductive layers such that insulating layers of the dielectric alternating stack are continuous with insulating layers of the laterally adjoining one of the alternating stacks of insulating layers and electrically conductive layers; and
   laterally-insulated second contact via structures extending through the dielectric alternating stack, wherein each of the laterally-insulated second contact via structures is surrounded by a respective tubular dielectric spacer.

2. The three-dimensional memory device of claim 1, wherein each of the laterally-undulating backside trenches comprises a laterally alternating sequence of straight trench segments having a uniform trench width and bulging trench segments having a variable trench width that is greater than the uniform trench width.

3. The three-dimensional memory device of claim 1, wherein a topmost portion of each of the cavity-containing dielectric fill structures that contact the first contact via structures has a same lateral thickness as a topmost portion of each of the tubular dielectric spacers.

4. The three-dimensional memory device of claim 3, wherein each of the tubular dielectric spacers is laterally spaced from the dielectric alternating stack by a dielectric liner having a different material composition than the dielectric spacer layers.

5. The three-dimensional memory device of claim 4, wherein:
the dielectric liners comprise a semiconductor oxide material and contacts a respective upper portion of the semiconductor material layer; and
the tubular dielectric spacers contact a respective lower portion of the semiconductor material layer.

6. The three-dimensional memory device of claim 3, wherein each of the electrically conductive layers is located between a respective first horizontal plane including a top surface of a respective one of the dielectric spacer layers and a respective second horizontal plane including a bottom surface of the respective one of the dielectric spacer layers.

7. The three-dimensional memory device of claim 6, wherein:
the insulating layers comprise doped silicate glass, undoped silicate glass, or organosilicate glass;
the dielectric spacer layers comprise silicon nitride; and
the second contact via structures comprise at least one metallic material.

8. The three-dimensional memory device of claim 1, further comprising:
field effect transistors located on a substrate that underlies the semiconductor material layer; and
lower-level metal interconnect structures formed in lower-level dielectric material layers that overlie the field effect transistors and electrically connected to nodes of the field effect transistors, wherein the first contact via structures and the second contact via structures extend through the semiconductor material layer and contact a top surface of a respective one of the lower-level metal interconnect structures.

9. The three-dimensional memory device of claim 1, wherein:
the semiconductor material layer comprises a source semiconductor layer including a doped semiconductor material and is laterally spaced from the first contact via structures by the cavity-containing dielectric fill structures;
a lower portion of the source semiconductor layer contacts outer sidewalls of the cavity-containing dielectric fill structures; and
an upper portion of the source semiconductor layer is laterally spaced from the outer sidewalls of the cavity-containing dielectric fill structures by semiconductor oxide portions.

10. The three-dimensional memory device of claim 1, wherein:
each of the memory stack structures comprises a respective vertical semiconductor channel and a respective memory film; and
the semiconductor material layer comprises a source semiconductor layer including a doped semiconductor material and is electrically connected to bottom ends of the vertical semiconductor channels.

11. The three-dimensional memory device of claim 1, wherein:
the cavity-containing dielectric fill structures and the tubular dielectric spacers comprise a same dielectric material; and
the first contact via structures and the second contact via structures comprise a same set of at least one metallic material.

12. The three-dimensional memory device of claim 1, wherein:
a subset of the first contact via structures is located within a contact tab region in which second alternating stacks selected from the alternating stacks of insulating layers and electrically conductive layers are present, wherein the contact tab region is free of any memory stack structure; and
support pillar structures vertically extend through each of the second alternating stacks.

13. The three-dimensional memory device of claim 12, wherein:
each of the support pillar structures consists of at least one dielectric material or is electrically inactive; and
the contact tab region is laterally spaced from a memory array region including the first alternating stack by a straight trench that extends along the first horizontal direction with a uniform width throughout.

14. The three-dimensional memory device of claim 1, wherein each lengthwise sidewall of the laterally-undulating backside trenches that laterally extend along the first horizontal direction comprises a respective laterally alternating sequences of bulging trench segments that are parallel to the first horizontal direction and concave semi-cylindrical sidewall segments that laterally protrude into a respective one of the alternating stacks of insulating layers and electrically conductive layers.

* * * * *